US010374112B2

United States Patent
Cornfeld et al.

(10) Patent No.: US 10,374,112 B2
(45) Date of Patent: *Aug. 6, 2019

(54) INVERTED METAMORPHIC MULTIJUNCTION SOLAR CELL INCLUDING A METAMORPHIC LAYER

(71) Applicant: SolAero Technologies Corp., Albuquerque, NM (US)

(72) Inventors: Arthur Cornfeld, Sandy Springs, GA (US); Pravin Patel, Albuquerque, NM (US); Mark A. Stan, Albuquerque, NM (US); Benjamin Cho, Albuquerque, NM (US); Paul R. Sharps, Albuquerque, NM (US); Daniel J. Aiken, Cedar Crest, NM (US); John Spann, Albuquerque, NM (US)

(73) Assignee: SolAero Technologies Corp., Albuquerque, NM (US)

(*) Notice: Subject to any disclaimer, the term of this patent is extended or adjusted under 35 U.S.C. 154(b) by 0 days.

This patent is subject to a terminal disclaimer.

(21) Appl. No.: 15/045,641

(22) Filed: Feb. 17, 2016

(65) Prior Publication Data

US 2016/0190378 A1 Jun. 30, 2016

Related U.S. Application Data

(63) Continuation of application No. 14/813,745, filed on Jul. 30, 2015, now Pat. No. 9,356,176, which is a (Continued)

(30) Foreign Application Priority Data

Dec. 27, 2011 (EP) .................................. 110102241

(51) Int. Cl.
  H01L 31/0687 (2012.01)
  H01L 31/18 (2006.01)
  H01L 31/078 (2012.01)

(52) U.S. Cl.
  CPC ...... *H01L 31/06875* (2013.01); *H01L 31/078* (2013.01); *H01L 31/1844* (2013.01);
  (Continued)

(58) Field of Classification Search
  CPC ........... H01L 31/06875; H01L 31/0728; H01L 31/1844; H01L 31/1892; H01L 31/03046;
  (Continued)

(56) References Cited

U.S. PATENT DOCUMENTS 4,001,864 A 1/1977 Gibbons
4,255,211 A 3/1981 Fraas
(Continued)

FOREIGN PATENT DOCUMENTS

FR 2878076 A1 5/2006
WO WO2005/015638 A1 2/2005

OTHER PUBLICATIONS

Jae-Hyung Jang, Student Member, Gabriel Cueva, William E. Hoke, P. J. Lemonias, Patrick Fay, and Ilesanmi Adesida, "Metamorphic Graded Bandgap InGaAs—InGaAlAs—InAlAs Double Heterojunction P-i-I-n. Photodiodes", Journal of Lightwave Technology, vol. 20, No. 3, Mar. 2002 507.*

(Continued)

Primary Examiner — Mayla Gonzalez Ramos

(57) ABSTRACT

A multijunction solar cell includes an upper first solar subcell, a second solar subcell adjacent to the first solar subcell, a third solar subcell adjacent to the second solar subcell, and a graded interlayer adjacent to the third solar subcell. The graded interlayer has a band gap that is greater than the band gap of the third solar subcell and is composed (Continued)

of a compositionally step-graded series of $(In_xGa_{1-x})_yAl_{1-y}As$ layers with monotonically changing lattice constant, with x and y having respective values such that the band gap of the graded interlayer remains constant throughout its thickness, and wherein $0<x<1$ and $0<y<1$. A fourth solar subcell is adjacent to the graded interlayer and is lattice mismatched with respect to the third solar subcell. The graded interlayer provides a transition in lattice constant from the third solar subcell to the fourth solar subcell. A lower fifth solar subcell is adjacent to the fourth solar subcell.

20 Claims, 36 Drawing Sheets

Related U.S. Application Data continuation of application No. 13/401,181, filed on Feb. 21, 2012, now Pat. No. 9,117,966, which is a continuation-in-part of application No. 12/271,192, filed on Nov. 14, 2008, now abandoned, and a continuation-in-part of application No. 12/023,772, filed on Jan. 31, 2008, now abandoned, which is a continuation-in-part of application No. 11/860,142, filed on Sep. 24, 2007, now abandoned, and a continuation-in-part of application No. 11/860,183, filed on Sep. 24, 2007.

(52) U.S. Cl.
CPC ........ H01L 31/1892 (2013.01); *Y02E 10/544* (2013.01); *Y02P 70/521* (2015.11)

(58) Field of Classification Search
CPC ............. H01L 31/0687; H01L 31/0693; H01L 31/0725; H01L 31/0735; H01L 31/076; H01L 31/078; H01L 31/18; H01L 31/184; Y02E 10/50; Y02E 10/544; Y02P 70/521
See application file for complete search history.

(56) References Cited

U.S. PATENT DOCUMENTS

| | | | |
|---|---|---|---|
| 4,338,480 A | 7/1982 | Antypas et al. | |
| 4,612,408 A | 9/1986 | Moddel et al. | |
| 5,019,177 A | 5/1991 | Wanlass | |
| 5,053,083 A | 10/1991 | Sinton | |
| 5,217,539 A | 6/1993 | Fraas et al. | |
| 5,322,572 A | 6/1994 | Wanlass | |
| 5,342,451 A | 8/1994 | Virshup | |
| 5,342,453 A | 8/1994 | Olson | |
| 5,376,185 A | 12/1994 | Wanlass | |
| 5,479,032 A | 12/1995 | Forrest et al. | |
| 5,944,913 A | 8/1999 | Hou et al. | |
| 6,180,432 B1 | 1/2001 | Freeouf | |
| 6,194,245 B1 | 2/2001 | Tayanaka | |
| 6,239,354 B1 | 5/2001 | Wanlass | |
| 6,252,287 B1 | 6/2001 | Kurtz et al. | |
| 6,281,426 B1 | 8/2001 | Olson et al. | |
| 6,300,557 B1 | 10/2001 | Wanlass | |
| 6,300,558 B1 | 10/2001 | Takamoto et al. | |
| 6,340,788 B1 * | 1/2002 | King .................. | H01J 37/3023 136/255 |
| 6,482,672 B1 | 11/2002 | Hoffman et al. | |
| 6,660,928 B1 | 12/2003 | Patton et al. | |
| 6,951,819 B2 | 10/2005 | Iles et al. | |
| 7,071,407 B2 | 7/2006 | Fatemi et al. | |
| 7,727,795 B2 | 6/2010 | Stan et al. | |
| 7,741,146 B2 | 6/2010 | Cornfeld et al. | |
| 7,785,989 B2 | 8/2010 | Sharps et al. | |
| 7,863,516 B2 | 1/2011 | Fafard | |
| 7,939,428 B2 * | 5/2011 | Boussagol ............. | C30B 25/18 257/E21.567 |
| 7,960,201 B2 | 6/2011 | Cornfeld et al. | |
| 8,039,291 B2 | 10/2011 | Cornfeld et al. | |
| 8,187,907 B1 | 5/2012 | Newman | |
| 8,236,600 B2 | 8/2012 | Cornfeld | |
| 8,507,787 B2 | 8/2013 | Suh | |
| 2002/0117675 A1 | 8/2002 | Mascarenhas | |
| 2004/0065363 A1 * | 4/2004 | Fetzer ............... | H01L 21/02381 136/262 |
| 2004/0166681 A1 | 8/2004 | Iles et al. | |
| 2004/0200523 A1 | 10/2004 | King et al. | |
| 2004/0261837 A1 | 12/2004 | Friedman et al. | |
| 2005/0274411 A1 | 12/2005 | King et al. | |
| 2006/0017063 A1 * | 1/2006 | Lester ............... | H01L 21/02381 257/190 |
| 2006/0021565 A1 | 2/2006 | Zahler | |
| 2006/0144435 A1 * | 7/2006 | Wanlass ............ | H01L 31/06875 136/249 |
| 2006/0162768 A1 | 7/2006 | Wanlass | |
| 2007/0218649 A1 | 9/2007 | Hernandez | |
| 2007/0277873 A1 * | 12/2007 | Cornfeld ........... | H01L 31/03046 136/255 |
| 2008/0029151 A1 | 2/2008 | McGlynn | |
| 2008/0149173 A1 | 6/2008 | Sharps | |
| 2008/0185038 A1 | 8/2008 | Sharps | |
| 2008/0245409 A1 | 10/2008 | Varghese | |
| 2009/0038679 A1 | 2/2009 | Varghese | |
| 2009/0078308 A1 | 3/2009 | Varghese | |
| 2009/0078309 A1 | 3/2009 | Cornfeld | |
| 2009/0078310 A1 | 3/2009 | Stan | |
| 2009/0078311 A1 | 3/2009 | Stan | |
| 2009/0155952 A1 | 6/2009 | Stan | |
| 2009/0188546 A1 | 7/2009 | McGlynn | |
| 2009/0229658 A1 | 9/2009 | Stan | |
| 2009/0229662 A1 * | 9/2009 | Stan ................. | H01L 31/06875 136/261 |
| 2009/0272430 A1 | 11/2009 | Cornfeld | |
| 2009/0272438 A1 | 11/2009 | Cornfeld | |
| 2009/0288703 A1 | 11/2009 | Stan | |
| 2009/0314348 A1 | 12/2009 | McGlynn | |
| 2010/0012174 A1 | 1/2010 | Varghese | |
| 2010/0012175 A1 | 1/2010 | Varghese | |
| 2010/0031994 A1 | 2/2010 | Varghese | |
| 2010/0047959 A1 | 2/2010 | Cornfeld | |
| 2010/0093127 A1 | 4/2010 | Sharps | |
| 2010/0101632 A1 | 4/2010 | Kats | |
| 2010/0122724 A1 | 5/2010 | Cornfeld | |
| 2010/0122764 A1 | 5/2010 | Newman | |
| 2010/0147366 A1 | 6/2010 | Stan | |
| 2010/0186804 A1 | 7/2010 | Cornfeld | |
| 2010/0203730 A1 | 8/2010 | Cornfeld | |
| 2010/0206365 A1 | 8/2010 | Chumney | |
| 2010/0229913 A1 | 9/2010 | Cornfeld | |
| 2010/0229926 A1 | 9/2010 | Newman | |
| 2010/0229932 A1 | 9/2010 | Cornfeld | |
| 2010/0229933 A1 | 9/2010 | Cornfeld | |
| 2010/0233838 A1 | 9/2010 | Varghese | |
| 2010/0282305 A1 | 11/2010 | Sharps | |
| 2011/0030774 A1 | 2/2011 | Cornfeld | |
| 2011/0041898 A1 | 2/2011 | Cornfeld | |
| 2011/0287578 A1 * | 11/2011 | Wojtczuk ........... | H01L 31/0684 438/94 |
| 2011/0318866 A1 | 12/2011 | Pan | |
| 2012/0103403 A1 | 5/2012 | Misra et al. | |
| 2012/0132250 A1 | 5/2012 | Cornfeld | |
| 2012/0142139 A1 | 6/2012 | Varghese | |
| 2012/0186641 A1 | 7/2012 | Sharps | |
| 2012/0211047 A1 | 8/2012 | Cornfeld | |
| 2012/0211068 A1 | 8/2012 | Cornfeld | |
| 2012/0211071 A1 | 8/2012 | Newman | |
| 2012/0227797 A1 | 9/2012 | Stan | |
| 2012/0247535 A1 | 10/2012 | McGlynn | |
| 2012/0276676 A1 | 11/2012 | Cornfeld et al. | |
| 2012/0285519 A1 | 11/2012 | Hoffman et al. | |
| 2013/0014803 A1 | 1/2013 | Varghese et al. | |
| 2013/0327378 A1 | 12/2013 | Patel et al. | |

(56) References Cited

U.S. PATENT DOCUMENTS

2014/0000672 A1    1/2014    Tourino et al.
2014/0041469 A1    2/2014    Villegas et al.

OTHER PUBLICATIONS

U.S. Appl. No. 12/708,361, filed Feb. 18, 2010, Cornfeld.
U.S. Appl. No. 12/716,814, filed Mar. 3, 2010, Cornfeld.
U.S. Appl. No. 12/730,018, filed Mar. 23, 2010, Cornfeld.
U.S. Appl. No. 12/756,926, filed Apr. 8, 2010, Cornfeld.
U.S. Appl. No. 12/813,408, filed Jun. 10, 2010, Patel.
U.S. Appl. No. 12/844,673, filed Jul. 27, 2010, Stan.
Aiken et al., "Consideration of High Bandgap Subcells for Advanced Multijunction Solar Cells," Conference Record of the 2006 IEEE 4th World Conference on Photovoltaic Energy Conversion, 2006:838-841.
Cornfeld et al., "Development of a Large Area Inverted Metamorphic Multi-Junction (IMM) Highly Efficient AM0 Solar Cell," 33rd IEEE Photovoltaic Specialists Conference, May 11-16, 2008, San Diego, CA, USA.
Cornfeld et al., "Development of a Large Area Inverted Metamorphic Multi-Junction Highly Efficient AM0 Solar Cell," Conference paper presented at the 33rd IEEE Photovoltaic Specialists Conference (May 11-16, 2008) on May 12, 2008. San Diego, CA, USA.
Cornfeld et al., "Advances in the Performance of Inverted Metamorphic Multijunction Solar Cells," 23rd European Photovoltaic Energy Conference, Aug. 29, 2008, Valencia, Spain.
U.S. Appl. No. 13/547,334, filed Jul. 12, 2012, Cornfeld.
U.S. Appl. No. 13/554,527, filed Jul. 20, 2012, Tourino.
U.S. Appl. No. 13/569,794, filed Aug. 8, 2012, Stan.
Dimroth et al., "Thin 5-Junction Solar Cells with Improved Radiation Hardness," Conference Record of the 2006 IEEE 4th World Conference on Photovoltaic Energy Conversion, May 2006; pp. 1777-1780.
Extended European Search Report for European Application No. 11010224.1-1528 dated May 15, 2012; 2 pgs.
Friedman et al., "0.7-eV GaInAs Junction for a GaInP/GaAs/GaInAs(leV)/GaInAs(0.7eV) Four-Junction Solar Cell," 2006 IEEE $4^{th}$ World Conference on Photovoltaic Energy Conversion, May 7-12, 2006, Waikoloa, Hawaii, USA; 598-602.
Geisz et al., "High efficiency GaInP/GaAs/InGaAs triple-junction solar cells grown inverted with a metamorphic bottom junction," Applied Physics Letters, 2007; 91:023502-1-023502-3. Published online Jul. 10, 2007.
Geisz et al., "Inverted GaInP / (In)GaAs Triple-Junction Solar Cells with Low-Stress Metamorphic Bottom Junctions," 33rd IEEE Photovoltaic Specialists Conference, May 11-16, 2008, San Diego, CA, USA.
Hamaker, H.C., "Computer modeling study of the effects of inhomogeneous doping and/or composition in GaAs solar-cell devices," J Appl. Phys., Sep. 15, 1985; 58(6):2344-2351.
King et al., "Next-Generation, High Efficiency III-V Multijunction Solar Cells," $28^{th}$ IEEE Photovoltaic Specialists Conference, Sep. 15-22, 2000, Anchorage, AK, USA; pp. 998-1001.
King et al., "High-Efficiency Space and Terrestrial Multijunction Solar Cells Through Bandgap Control in Cell Structures," 2002 Photovoltaic Specialists Conference, Conference Record of the 29th IEEE, May 19-24, 2002, New Orleans, LA, USA; pp. 776-781.
King et al., "Solar Cell Generations Over 40% Efficiency," 26th European Photovoltaic Solar Energy Conference and Exhibition, Sep. 5, 2011, Hamburg, Germany; 15 pgs.
Koh et al., "Fabrication of Superconducting Delay Line with GaAs Schottky Diode," IEEE Transactions on Applied Superconductivity, 1999; 9(2):3224-3227.
Lewis et al., "The Crystallographic Connection of MOCVD-Grown Monolithic Cascade Subcells Via Transparent Graded Layers," Journal of Crystal Growth, 1984; 69:515-526.
Lewis et al., "Recent Developments in Multijunction Solar Cell Research," Solar Cells, 1988; 24:171-183.
Li et al., "Unintentional doping and compensation effects of carbon in metal-organic chemical vapor deposition fabricated ZnO thin films", 2006, pp. 1213-1217.
Patel et al., "Experimental Results From Performance Improvement and Radiation Hardening of inverted Metamorphic Multi-Junction Solar Cells," Proceedings of the 37th IEEE PVSC, Seattle, WA, 2011 (Presented at PVSC Jun. 22, 2001).
Patel et al., "Initial Results of the Monolithically Grown Six-Junction Inverted Metamorphic Multi-junction Solar Cell," Proceedings of the 38th IEEE PVSC, Austin, TX, 2012 (Presented at PVSC Jun. 7, 2012).
Schultz et al., "High Efficiency 1.0-eV GaInAs Bottom Solar Cell for 3-Junction Monolithic Stack," IEEE, 1990:148-152.
Sexl et al., "MBE Growth of Metamorphic In(Ga)AlAs Buffers," 1997 IEEE International Symposium on Compound Semiconductors, Sep. 8-11, 1997; pp. 49-52.
Sharps et al., "Inverting the triple junction improves efficiency and flexibility," Compound Semiconductor, Oct. 2007; pp. 25-28.
Sinharoy et al., "Progress in the Development of Metamorphic Multi-junction III-V Space Solar Cells," Progress in Photovoltaics: Research and Applications, Feb. 2002; 10:427-432.
Soukup et al., "Limitations of Built-in Electric Field Enhancement of Minority Carrier Current Collection in GaAs Backwall Schottky Barrier Solar Cells," Solar Cells, 1986; 18:139-151.
Stan et al., "Recent Advances in the Performance of Multi-Junction Space Solar Cells," 22nd European Photovoltaic Solar Energy Conference, Sep. 3-7, 2007, Milan, Italy; pp. 101-105.
Stan et al., "Very High Efficiency Triple Junction Solar Cells by MOVPE," $14^{th}$ International Conference of Metalorganic Vapor Phase Epitaxy, Jun. 5, 2008, Metz, France.
Stan et al., "High efficiency quadruple junction solar cells using MOVPE with inverted metamorphic device structures," Journal of Crystal Growth, 2010; 312:1370-1374.
Takamoto et al., "Future Development of InGaP/(In)GaAs Based Multijunction Solar Cells,"Proceedings of the 31st IEEE PVSC, Jan. 3-7, 2005, Lake Buena Vista, FL; pp. 519-524.
Takamoto et al., "InGaP/GaAs-based Multijunction Solar Cells," Progress in Photovoltaics: Research and Applications, 2005; 13:495-511.
Venkatasubramanian et al., "An Inverted-Growth Approach to Development of an IR-Transparent High-Efficiency AlGaAs/GaAs Cascade Solar Cell," 22nd IEEE Photovoltaic Specialists Conference, Oct. 7-11, 1991, Las Vegas, NV, USA; pp. 93-98.
Venkatasubramanian et al., "High-quality eutectic-metal-bonded AlGaAs—GaAs thin films on Si substrates,"Appl. Phys. Lett., Feb. 1992; 60(7):886-888.
Voncken et al., "Strain-accelerated HF etching of AlAs for epitaxial lift-off," J. Phys.: Condens. Matter, 2004; 16:3585-3596.
Walters et al., "Space Radiation Effects in Advanced Solar Cell Materials and Devices," Mat. Res. Soc. Symp. Proc., 2002; 692:569-580.
Wanlass et al., "Lattice-Mismatched Approaches for High-Performance, III-V Photovoltaic Energy Converters," Conference Proceedings of the 31st IEEE Photovoltaic Specialists Conference and Exhibition, Lake Buena Vista, FL, USA; Jan. 3-7, 2005;530-535.
Wanlass et al., "Monolithic, Ultra-Thin GaInP/GaAs/GaInAs Tandem Solar Cells," 2006 IEEE 4th World Conference on Photovoltaic Energy Conversion, May 7-12, 2006, Waikoloa, Hawaii, USA; 729-732.
Wurfel, "Basic Structure of Solar Cells," Physics of Solar Cells: From Basic Principles to Advanced Concepts, Second, Updated and Expanded Edition, 2009; Sections 6.4, 6.5 and 6.8.
Yablonovitch et al., "Extreme selectivity in the lift-off of epitaxial GaAs films," Appl. Phys. Lett., 1987; 51(28):2222-2224.
Yamaguchi, "Physics and Technologies of Superhigh-Efficiency Tandem Solar Cells," Semiconductors, Sep. 1999; 33(9):961-964.
Yoon et al., "Progress of Inverted Metamorphic III-V Solar Cell Development at Spectrolab," 33rd IEEE Specialists Conference, May 11-16, 2008, San Diego, CA, USA.

* cited by examiner

| | | |
|---|---|---|
| | p++ InGaAlAs | p contact layer | — 129 |
| | p+ InGaAlAs | BSF | — 128 |
| cell D | p InGaAs | p base | — 127 |
| | n+ InGaAs | n+ emitter | — 126 |
| | n+ InGaAlAs | window | — 125 |
| | n InGaAlAs | metamorphic buffer layer | — 124 |
| | n GaInP | barrier layer | — 123 |
| | n++ InGaP | n+ tunnel diode | — 122b |
| | p++ InGaAlAs | p+ tunnel diode | — 122a |
| | p+ InGaAlAs | BSF | — 121 |
| cell C | p InGaAs | p base | — 120 |
| | n+ InGaAs | n+ emitter | — 119 |
| | n+ GaInP | window | — 118 |
| | n+ GaInP | barrier layer | — 117 |
| | n InGaAlAs | metamorphic buffer layer | — 116 |
| | n GaInP | barrier layer | — 115 |
| | n++ GaAs | n++ tunnel diode | — 114b |
| | p++ AlGaAs | p++ tunnel diode | — 114a |
| | p+ AlGaAs | BSF | — 113 |
| cell B | p GaAs | p base | — 112 |
| | n+ GaInP | n+ emitter | — 111 |
| | n+ GaInP | window | — 110 |
| | n++ InGaP | n++ tunnel diode | — 109b |
| | p++ AlGaAs | p++ tunnel diode | — 109a |
| | p+ InGaAlP | BSF | — 108 |
| cell A | p InGaAlP | p base | — 107 |
| | n+ GaInP | n+ emitter | — 106 |
| | n+ AlInP | window | — 105 |
| | n++ GaAs | contact layer | — 104 |
| | GaInP | etch stop layer | — 103 |
| | GaAs | buffer layer | — 102 |
| | GaAs | Substrate | — 101 |

FIG. 2D

| | | |
|---|---|---|
| | p++ AlGaInAs | p contact layer | 235 |
| | p+ AlGaInAs | BSF | 234 |
| cell E | p GaInAs | p base | 233 |
| | n+ GaInAs | n+ emitter | 232 |
| | n+ GaInP | window | 231 |
| | n+ GaInP | barrier layer | 230 |
| | n AlGaInAs | metamorphic buffer layer | 229 |
| | n+ GaInP | barrier layer | 228 |
| | n++ GaInP | n+ tunnel diode | 227b |
| | p++ AlGaInAs | p+ tunnel diode | 227a |
| | p+ AlGaInAs | BSF | 226 |
| cell D | p GaInAs | p base | 225 |
| | n+ GaInAs | n+ emitter | 224 |
| | n+ GaInP | window | 223 |
| | n+ GaInP | barrier layer | 222 |
| | n AlGaInAs | metamorphic buffer layer | 221 |
| | n GaInP | barrier layer | 220 |
| | n++ GaInP | n+ tunnel diode | 219b |
| | p++ AlGaAs | p+ tunnel diode | 219a |
| | p+ AlGaAs | BSF | 218 |
| cell C | p GaAs | p base | 217 |
| | n+ GaInP | n+ emitter | 216 |
| | n+ GaInP | window | 215 |
| | n++ GaInP | n++ tunnel diode | 214b |
| | p++ AlGaAs | p++ tunnel diode | 214a |
| | p+ AlGaAs | BSF | 213 |
| cell B | p AlGaAs | p base | 212 |
| | n+ AlGaAs | n+ emitter | 211 |
| | n+ AlInP | window | 210 |
| | n++ GaInP | n++ tunnel diode | 209b |
| | p++ AlGaAs | p++ tunnel diode | 209a |
| | p+ AlInP | BSF | 208 |
| cell A | p AlGaInP | base | 207 |
| | AlGaInP | spacer | 206c |
| | n AlGaInP | emitter | 206b |
| | n+ AlGaInP | n+ emitter | 206a |
| | n+ AlInP | window | 205 |
| | n++ GaAs | contact layer | 204 |
| | GaInP | etch stop layer | 203 |
| | GaAs | buffer layer | 202 |
| | GaAs | Substrate | 201 |

FIG. 3B

| | | |
|---|---|---|
| | p++ AlGaInAs | p contact layer | 273
| | p+ AlGaInAs | BSF | 272
| cell E | p GaInAs | p base | 271
| | n+ GaInAs | n+ emitter | 270
| | n+ GaInP | window | 269
| | n+ AlGaInAs | barrier layer | 268
| | n AlGaInAs | metamorphic buffer layer | 267
| | n+ GaInP | barrier layer | 266
| | n++ AlGaInAs | n++ tunnel diode | 265b
| | p++ AlGaInAs | p++ tunnel diode | 265a
| | p+ AlGaInAs | BSF | 264
| cell D | p GaInAs | p base | 263
| | n+ GaInAs | n+ emitter | 262
| | n+ GaInP | window | 261
| | n+ GaInP | barrier layer | 260
| | n AlGaInAs | metamorphic buffer layer | 259
| | n+ GaInP | barrier layer | 258
| | n++ AlGaInAs | n++ tunnel diode | 257b
| | p++ AlGaInAs | p++ tunnel diode | 257a
| | p+ AlGaInAs | BSF | 256
| cell C | p GaInAs | p base | 255
| | n+ GaInAs | n+ emitter | 254
| | n+ GaInP | window | 253
| | n+ GaInP | barrier layer | 252
| | n AlGaInAs | metamorphic buffer layer | 251
| | n GaInP | barrier layer | 250
| | n++ GaInP | n++ tunnel diode | 214b
| | p++ AlGaAs | p++ tunnel diode | 214a
| | p+ AlGaAs | BSF | 213
| cell B | p AlGaAs | p base | 212
| | n+ AlGaAs | n+ emitter | 211
| | n+ AlInP | window | 210
| | n++ GaInP | n++ tunnel diode | 209b
| | p++ AlGaAs | p++ tunnel diode | 209a
| | p+ AlInP | BSF | 208
| | p AlGaInP | base | 207
| | AlGaInP | spacer | 206c
| cell A | n AlGaInP | emitter | 206b
| | n+ AlGaInP | n+ emitter | 206a
| | n+ AlInP | window | 205
| | n++ GaAs | contact layer | 204
| | GaInP | etch stop layer | 203
| | GaAs | buffer layer | 202
| | GaAs | Substrate | 201

FIG. 3C

| | | |
|---|---|---|
| | p++ AlGaInAs | p contact layer | 342 |
| | p+ AlGaInAs | BSF | 341 |
| cell F | p GaInAs | p base | 340 |
| | n+ GaInAs | n+ emitter | 339 |
| | n+ AlGaInAs | window | 338 |
| | n AlGaInAs | metamorphic buffer layer | 337 |
| | n GaInP | barrier layer | 336 |
| | n++ GaInP | n+ tunnel diode | 335b |
| | p++ AlGaInAs | p+ tunnel diode | 335a |
| | p+ AlGaInAs | BSF | 334 |
| cell E | p GaInAs | p base | 333 |
| | n+ GaInAs | n+ emitter | 332 |
| | n+ GaInP | window | 331 |
| | n+ GaInP | barrier layer | 330 |
| | n AlGaInAs | metamorphic buffer layer | 329 |
| | n GaInP | barrier layer | 328 |
| | n++ GaInP | n+ tunnel diode | 327b |
| | p++ AlGaInAs | p+ tunnel diode | 327a |
| | p+ AlGaInAs | BSF | 326 |
| cell D | p GaInAs | p base | 325 |
| | n+ GaInAs | n+ emitter | 324 |
| | n+ GaInP | window | 323 |
| | n+ GaInP | barrier layer | 322 |
| | n AlGaInAs | metamorphic buffer layer | 321 |
| | n GaInP | barrier layer | 320 |
| | n++ GaAs | n++ tunnel diode | 319b |
| | p++ AlGaAs | p++ tunnel diode | 319a |
| | p+ AlGaAs | BSF | 318 |
| cell C | p GaAs | p base | 317 |
| | n+ GaInP | n+ emitter | 316 |
| | n+ GaInP | window | 315 |
| | n++ GaInP | n++ tunnel diode | 314b |
| | p++ AlGaAs | p++ tunnel diode | 314a |
| | p+ AlGaAs | BSF | 313 |
| cell B | p AlGaAs | p base | 312 |
| | n+ AlGaAs | n+ emitter | 311 |
| | n+ AlInP | window | 310 |
| | n++ GaInP | n++ tunnel diode | 309b |
| | p++ AlGaAs | p++ tunnel diode | 309a |
| | p+ AlInP | BSF | 308 |
| cell A | p AlGaInP | base | 307 |
| | AlGaInP | spacer | 306c |
| | n AlGaInP | emitter | 306b |
| | AlGaInP | n+ emitter | 306a |
| | AlInP | window | 306 |
| | n++ GaAs | contact layer | 304 |
| | GaInP | etch stop layer | 303 |
| | GaAs | buffer layer | 302 |
| | GaAs | Substrate | 301 |

FIG. 4

| | | |
|---|---|---|
| | p++ AlGaInAs | p contact layer | 539
| | p+ AlGaInAs | BSF | 538
| cell F | p GaInAs | p base | 537
| | n+ GaInAs | n+ emitter | 536
| | n+ AlGaInAs | window | 535
| | n AlGaInAs | metamorphic buffer layer | 534
| | n GaInP | barrier layer | 533
| | n++ AlGaInAs | n+ tunnel diode | 532b
| | p++ AlGaInAs | p+ tunnel diode | 532a
| | p+ AlGaInAs | BSF | 531
| cell E | p GaInAs | p base | 530
| | n+ GaInP or GaInAs | n+ emitter | 529
| | n+ GaInP | window | 528
| | n++ AlGaInAs | n+ tunnel diode | 527b
| | p++ AlGaInAs | p+ tunnel diode | 527a
| | p+ AlGaInAs | BSF | 526
| cell D | p- AlGaInAs | p base | 525
| | n+ AlGaInAs | n+ emitter | 524
| | n+ GaInP | window | 523
| | n+ GaInP | barrier layer | 522
| | n AlGaInAs | metamorphic buffer layer | 521
| | n GaInP | barrier layer | 520
| | n++ GaInP | n++ tunnel diode | 519b
| | p++ AlGaAs | p++ tunnel diode | 519a
| | p+ AlGaAs | BSF | 518
| cell C | p GaAs | p base | 517
| | n+ GaInP | n+ emitter | 516
| | n+ GaInP | window | 515
| | n++ GaInP | n++ tunnel diode | 514b
| | p++ AlGaAs | p++ tunnel diode | 514a
| | p+ AlGaAs | BSF | 513
| cell B | p AlGaAs | p base | 512
| | n+ AlGaAs | n+ emitter | 511
| | n+ AlInP | window | 510
| | n++ GaInP | n++ tunnel diode | 509b
| | p++ AlGaAs | p++ tunnel diode | 509a
| | p+ AlInP | BSF | 508
| | p AlGaInP | base | 507
| cell A | AlGaInP | spacer | 506c
| | n AlGaInP | emitter | 506b
| | n+ AlGaInP | n+ emitter | 506a
| | n+ AlInP | window | 505
| | n++ GaAs | contact layer | 504
| | GaInP | etch stop layer | 503
| | GaAs | buffer layer | 502
| | GaAs | Substrate | 501

FIG. 6

INVERTED METAMORPHIC MULTIJUNCTION SOLAR CELL INCLUDING A METAMORPHIC LAYER

REFERENCE TO RELATED APPLICATIONS

This application is a continuation-in-part of co-pending U.S. patent application Ser. No. 12/271,192 filed Nov. 14, 2008, and of co-pending U.S. patent application Ser. No. 12/023,772, filed Jan. 31, 2008, which is in turn a continuation-in-part of co-pending U.S. patent application Ser. No. 11/860,142 filed Sep. 24, 2007, and of co-pending U.S. patent application Ser. No. 11/860,183, filed Sep. 24, 2007.

GOVERNMENT RIGHTS STATEMENT

This invention was made with government support under Contracts No. FA 9453-06-C-0345, FA9453-09-C-0371 and FA 9453-04-2-0041 awarded by the U.S. Air Force. The Government has certain rights in the invention.

This application is related to co-pending U.S. patent application Ser. No. 12/844,673 filed Jul. 27, 2010.

This application is related to co-pending U.S. patent application Ser. No. 12/813,408 filed Jun. 10, 2010.

This application is related to co-pending U.S. patent application Ser. No. 12/775,946 filed May 7, 2010.

This application is related to co-pending U.S. patent application Ser. No. 12/756,926, filed Apr. 8, 2010.

This application is related to co-pending U.S. patent application Ser. No. 12/730,018, filed Mar. 23, 2010.

This application is related to co-pending U.S. patent application Ser. No. 12/716,814, filed Mar. 3, 2010.

This application is related to co-pending U.S. patent application Ser. No. 12/708,361, filed Feb. 18, 2010.

This application is related to co-pending U.S. patent application Ser. No. 12/637,241, filed Dec. 14, 2009.

This application is related to co-pending U.S. patent application Ser. No. 12/623,134, filed Nov. 20, 2009.

This application is related to co-pending U.S. patent application Ser. No. 12/544,001, filed Aug. 19, 2009.

This application is related to co-pending U.S. patent application Ser. Nos. 12/401,137, 12/401,157, and 0.12/401,189, filed Mar. 10, 2009.

This application is related to co-pending U.S. patent application Ser. No. 12/389,053, filed Feb. 19, 2009.

This application is related to co-pending U.S. patent application Ser. No. 12/367,991, filed Feb. 9, 2009.

This application is related to co-pending U.S. patent application Ser. No. 12/362,201, now U.S. Pat. No. 7,960,201; Ser. No. 12/362,213; and Ser. No. 12/362,225, filed Jan. 29, 2009.

This application is related to co-pending U.S. patent application Ser. No. 12/337,014 filed Dec. 17, 2008, now U.S. Pat. No. 7,785,989, and Ser. No. 12/337,043 filed Dec. 17, 2008.

This application is related to co-pending U.S. patent application Ser. No. 12/271,127 and Ser. No. 12/271,192 filed Nov. 14, 2008.

This application is related to co-pending U.S. patent application Ser. No. 12/267,812 filed Nov. 10, 2008.

This application is related to co-pending U.S. patent application Ser. No. 12/258,190 filed Oct. 24, 2008.

This application is related to co-pending U.S. patent application Ser. No. 12/253,051 filed Oct. 16, 2008.

This application is related to co-pending U.S. patent application Ser. No. 12/190,449, filed Aug. 12, 2008, now U.S. Pat. No. 7,741,146, and its divisional patent application Ser. No. 12/816,205, filed Jun. 15, 2010, now U.S. Pat. No. 8,039,291.

This application is related to co-pending U.S. patent application Ser. No. 12/187,477, filed Aug. 7, 2008.

This application is related to co-pending U.S. patent application Ser. No. 12/218,558 and U.S. patent application Ser. No. 12/218,582 filed Jul. 16, 2008.

This application is related to co-pending U.S. patent application Ser. No. 12/123,864 filed May 20, 2008.

This application is related to co-pending U.S. patent application Ser. No. 12/102,550 filed Apr. 14, 2008.

This application is related to co-pending U.S. Ser. No. 12/047,944, filed Mar. 13, 2008.

This application is related to co-pending U.S. patent application Ser. No. 12/023,772, filed Jan. 31, 2008.

This application is related to U.S. patent application Ser. No. 11/956,069, filed Dec. 13, 2007, and its divisional application Ser. No. 12/187,454 filed Aug. 7, 2008, now U.S. Pat. No. 7,727,795;

This application is also related to co-pending U.S. patent application Ser. Nos. 11/860,142 and 11/860,183 filed Sep. 24, 2007.

This application is also related to co-pending U.S. patent application Ser. No. 11/445,793 filed Jun. 2, 2006.

This application is also related to co-pending U.S. patent application Ser. No. 11/500,053 filed Aug. 7, 2006, and its divisional application Ser. No. 12/417,367 filed Apr. 2, 2009, and Ser. No. 12/549,340 filed Aug. 27, 2009.

BACKGROUND OF THE INVENTION

1. Field of the Invention

The present invention relates to the field of multijunction solar cells based on III-V semiconductor compounds, and to fabrication processes and devices for five and six junction solar cell structures including a metamorphic layer. Some embodiments of such devices are also known as inverted metamorphic multijunction solar cells.

2. Description of the Related Art

Solar power from photovoltaic cells, also called solar cells, has been predominantly provided by silicon semiconductor technology. In the past several years, however, high-volume manufacturing of MN compound semiconductor multijunction solar cells for space applications has accelerated the development of such technology not only for use in space but also for terrestrial solar power applications. Compared to silicon, compound semiconductor multijunction devices have greater energy conversion efficiencies and generally more radiation resistance, although they tend to be more complex to manufacture. Typical commercial compound semiconductor multijunction solar cells have energy efficiencies that exceed 27% under one sun, air mass 0 (AM0), illumination, whereas even the most efficient silicon technologies generally reach only about 18% efficiency under comparable conditions. Under high solar concentration (e.g., 500×), commercially available III-V compound semiconductor multijunction solar cells in terrestrial applications (at AM1.5D) have energy efficiencies that exceed 37%. The higher conversion efficiency of compound semiconductor solar cells compared to silicon solar cells is in part based on the ability to achieve spectral splitting of the incident radiation through the use of a plurality of photovoltaic regions with different band gap energies, and accumulating the current from each of the regions.

Typical III-V compound semiconductor solar cells are fabricated on a semiconductor wafer in vertical, multijunction structures. The individual solar cells or wafers are then disposed in horizontal arrays, with the individual solar cells connected together in an electrical series circuit. The shape and structure of an array, as well as the number of cells it contains, are determined in part by the desired output voltage and current.

Inverted metamorphic solar cell structures based on compound semiconductor layers, such as described in M. W. Wanlass et al., Lattice Mismatched Approaches for High. Performance, Photovoltaic Energy Converters (Conference Proceedings of the 31 IEEE Photovoltaic Specialists Conference, Jan. 3-7, 2005, IEEE Press, 2005), present an important conceptual starting point for the development of future commercial high efficiency solar cells. However, the materials and structures for a number of different layers of the cell proposed and described in such reference present a number of practical difficulties relating to the appropriate choice of materials and fabrication steps.

Prior to the disclosures described in various ones or combinations of this and the related applications noted above, the materials and fabrication steps disclosed in the prior art have various drawbacks and disadvantages in producing a commercially viable inverted metamorphic multijunction solar cell using commercially established fabrication processes.

SUMMARY OF THE INVENTION

Briefly, and in general terms, the present disclosure provides a five junction solar cell utilizing two metamorphic layers. More particularly the present disclosure provides a multijunction solar cell including an upper first solar subcell having a first band gap, and the base-emitter junction of the upper first solar subcell being a homojunction; a second solar subcell adjacent to said first solar subcell and having a second band gap smaller than said first hand gap; and a third solar subcell adjacent to said second solar subcell and having a third band gap smaller than said second band gap. A first graded interlayer is provided adjacent to said third solar subcell; said first graded interlayer having a fourth band gap greater than said third band gap. A fourth solar subcell is provided adjacent to said first graded interlayer, said fourth subcell having a fifth band gap smaller than said third band gap such that said fourth subcell is lattice mismatched with respect to said third subcell. A second graded interlayer is provided adjacent to said fourth solar subcell; said second graded interlayer having a sixth band gap greater than said fifth band gap; and a lower fifth solar subcell is provided adjacent to said second graded interlayer, said lower fifth subcell having a seventh band gap smaller than said fifth band gap such that said fifth subcell is lattice mismatched with respect to said fourth subcell.

In another aspect, the present disclosure provides a five junction solar cell utilizing three metamorphic layers. More particularly the present disclosure provides a multijunction solar cell including an upper first solar subcell having a first band gap, and the base-emitter junction of the upper first solar subcell being a homojunction; a second solar subcell adjacent to said first solar subcell and having a second band gap smaller than said first band gap. A first graded interlayer is provided adjacent to said second solar subcell; said first graded interlayer having a third band gap greater than said second band gap. A third solar subcell is provided adjacent to said first graded interlayer and having a fourth band gap smaller than said second band gap such that said third subcell is lattice mismatched with respect to said second subcell. A second graded interlayer is provided adjacent to said third solar subcell; said second graded interlayer having a fifth band gap greater than said fourth band gap. A fourth solar subcell is provided adjacent to said second graded interlayer, said fourth subcell having a sixth band gap smaller than said fourth band gap such that said fourth subcell is lattice mismatched with respect to said third subcell. A third graded interlayer is provided adjacent to said fourth solar subcell; said third graded interlayer having a seventh band gap greater than said sixth band gap. A lower fifth solar subcell is provided adjacent to said third graded interlayer, said lower fifth subcell having a eighth band gap smaller than said seventh band gap such that said fifth subcell is lattice mismatched with respect to said fourth subcell.

In another aspect the present disclosure provides a six junction solar cell utilizing three metamorphic layers. More particularly the present disclosure provides a multijunction solar cell including an upper first solar subcell having a first band gap, and the base-emitter junction of the upper first solar subcell being a homojunction; a second solar subcell adjacent to said first solar subcell and having a second band gap smaller than said first band gap; a third solar subcell adjacent to said second solar subcell and having a third band gap smaller than said second band gap; a first graded interlayer adjacent to said third solar silken; said first graded interlayer having a fourth band gap greater than said third band gap; and a fourth solar subcell adjacent to said first graded interlayer, said fourth subcell having a fifth band gap smaller than said third band gap such that said fourth subcell is lattice mismatched with respect to said third subcell; a second graded interlayer adjacent to said fourth solar subcell; said second graded interlayer having a sixth band gap greater than said fifth band gap; a fifth solar subcell adjacent to said second graded interlayer, said fifth subcell having a seventh band gap smaller than said fifth band gap such that said fifth subcell is lattice mismatched with respect to said fourth subcell; a third graded interlayer adjacent to said fifth solar subcell; said third graded interlayer having a eighth band gap greater than said seventh band gap; and a lower sixth solar subcell adjacent to said third graded interlayer, said lower sixth subcell having a ninth band gap smaller than said eighth band gap such that said sixth subcell is lattice mismatched with respect to said fifth subcell.

In another aspect the present disclosure provides a five junction solar cell utilizing one metamorphic layer. More particularly the present disclosure provides a multijunction solar cell including an upper first solar subcell having a first band gap, and the base-emitter junction of the upper first solar subcell being a homojunction; a second solar subcell adjacent to said first solar subcell and having a second band gap smaller than said first band gap; and a third solar subcell adjacent to said second solar subcell and having a third band gap smaller than said second band gap. A graded interlayer is provided adjacent to said third solar subcell; said graded interlayer having a fourth band gap greater than said third band gap. A fourth solar subcell is provided adjacent to said first graded interlayer, said fourth subcell having a fifth band gap smaller than said third band gap such that said fourth subcell is lattice mismatched with respect to said third subcell. A lower fifth solar subcell is provided adjacent to said fourth subcell, said lower fifth subcell having a sixth band gap smaller than said fifth band gap such that said fourth subcell is lattice matched with respect to said fourth subcell.

In another aspect the present disclosure provides a six junction solar cell utilizing two metamorphic layers. More particularly the present disclosure provides a multi junction solar cell including an upper first solar subcell having a first band gap, and the base-emitter junction of the upper first solar subcell being a homojunction; a second solar subcell adjacent to said first solar subcell and having a second band gap smaller than said first band gap; and a third solar subcell adjacent to said second solar subcell and having a third band gap smaller than said second band gap. A first graded interlayer is provided adjacent to said third solar subcell; said first graded interlayer having a fourth band gap greater than said third band gap. A fourth solar subcell is provided adjacent said first graded interlayer, said fourth subcell having a fifth band gap smaller than said third band gap such that said fourth subcell is lattice mismatched with respect to said third subcell. A fifth solar subcell is provided adjacent to said fourth subcell, said fifth subcell having a sixth band gap smaller than said fifth band gap such that said fifth subcell is lattice matched with respect to said fourth subcell. A second graded interlayer is provided adjacent to said fifth solar subcell; said second graded interlayer having a seventh band gap greater than said sixth band gap. A lower sixth solar subcell is provided adjacent to said second graded interlayer, said lower sixth subcell having a eighth band gap smaller than said sixth band gap such that said sixth subcell is lattice mismatched with respect to said fifth subcell.

In another aspect the present disclosure provides a method of forming a five junction solar cell utilizing two metamorphic layers. More particularly the present disclosure provides a method of manufacturing a solar cell including providing a first substrate; forming an upper first solar subcell having a first band gap on the first substrate, the base-emitter junction of the upper first solar subcell being a homojunction; forming a second solar subcell adjacent to said first solar subcell and having a second band gap smaller than said first band gap; and forming a third solar subcell adjacent to said second solar subcell and having a third band gap smaller than said second band gap. A first graded interlayer is formed adjacent to said third solar subcell; said first graded interlayer having a fourth band gap greater than said third band gap. A fourth solar subcell is formed adjacent to said first graded interlayer, said fourth subcell having a fifth band gap smaller than said third band gap such that said fourth subcell is lattice mismatched with respect to said third subcell. A second graded interlayer is formed adjacent to said fourth solar subcell; said second graded interlayer having a sixth band gap greater than said fifth band gap; and a lower fifth solar subcell is formed adjacent to said second graded interlayer, said lower fifth subcell having a seventh band gap smaller than said fifth band gap such that said fifth subcell is lattice mismatched with respect to said fourth subcell. A surrogate substrate is mounted on top of lower fifth solar subcell; and the first substrate is removed.

In another aspect, the present disclosure provides a method of forming a five junction solar cell utilizing three metamorphic layers. More particularly the present disclosure provides a method of manufacturing a multijunction solar cell including providing a first substrate; forming an upper first solar subcell having a first band gap, the base-emitter junction of the upper first solar subcell being a homojunction; forming a second solar subcell adjacent to said first solar subcell and having a second band gap smaller than said first band gap. A first graded interlayer is formed adjacent to said second solar subcell; said first graded interlayer having a third band gap greater than said second band gap. A third solar subcell is formed adjacent to said first graded interlayer having a fourth band gap smaller than said second band gap such that said third subcell is lattice mismatched with respect to said second subcell. A second graded interlayer is formed adjacent to said third solar subcell; said second graded interlayer having a fifth band gap greater than said fourth band gap. A fourth solar subcell is formed adjacent to said second graded interlayer, said fourth subcell having a sixth band gap smaller than said fourth band gap such that said fourth subcell is lattice mismatched with respect to said third subcell. A third graded interlayer is formed adjacent to said fourth solar subcell; said third graded interlayer having a seventh band gap greater than said sixth band gap. A lower fifth subcell is formed adjacent to said third graded interlayer, said lower fifth subcell having a eighth band gap smaller than said seventh band gap such that said fifth subcell is lattice mismatched with respect to said fourth subcell.

In another aspect the present disclosure provides a method of forming a six junction solar cell, utilizing three metamorphic layers. More particularly the present disclosure provides a method of manufacturing a multi junction solar cell including providing a first substrate; forming an upper first solar subcell having a first band gap on the first substrate, the base-emitter junction of the upper first solar subcell being a homojunction; forming a second solar subcell adjacent to said first solar subcell and having a second band gap smaller than said first band gap; forming a third solar subcell adjacent to said second solar subcell and having a third band gap smaller than said second band gap; forming a first graded interlayer adjacent to said third solar subcell; said first graded interlayer having a fourth band gap greater than said third band gap; forming a fourth solar subcell adjacent to said first graded interlayer, said fourth subcell having a fifth band gap smaller than said third band gap such that said fourth subcell is lattice mismatched with respect to said third subcell; forming a second graded interlayer adjacent to said fourth solar subcell; said second graded interlayer having a sixth band gap greater than said fifth band gap; foil Ling a fifth solar subcell adjacent to said second graded interlayer; said fifth subcell having a seventh band gap smaller than said fifth band gap such that said fifth subcell is lattice mismatched with respect to said fourth subcell; forming a third graded interlayer adjacent to said fifth solar subcell; said third graded interlayer having a eighth band gap greater than said seventh band gap; and forming a lower sixth solar subcell adjacent to said third graded interlayer, said lower sixth subcell having a ninth band gap smaller than said eighth band gap such that said sixth subcell is lattice mismatched with respect to said fifth subcell. A surrogate substrate is mounted on top of lower sixth solar subcell; and the first substrate is removed.

In another aspect the present disclosure provides a method of forming a five junction solar cell utilizing one metamorphic layer. More particularly the present disclosure provides a method of manufacturing a multijunction solar cell including providing a first substrate; forming an upper first solar subcell having a first band gap, and the base-emitter junction of the upper first solar subcell being a homojunction; forming a second solar subcell adjacent to said first solar subcell and having a second band gap smaller than said first band gap; and forming a third solar subcell adjacent to said second solar subcell and having a third band gap smaller than said second band gap. A graded interlayer is formed adjacent to said third solar subcell; said graded interlayer having a fourth band gap greater than said third band gap. A fourth solar subcell is formed adjacent to said first graded interlayer, said fourth subcell having a fifth band gap smaller than said third band gap such that said fourth subcell is lattice mismatched with respect to said third subcell. A lower fifth solar subcell is formed adjacent to said fourth subcell, said lower fifth subcell having a sixth band gap smaller than said fifth band gap such that said fourth subcell is lattice matched with respect to said fourth subcell.

In another aspect the present disclosure provides a method of forming a six junction solar cell utilizing two metamorphic layers. More particularly the present disclosure provides a method of manufacturing a multijunction solar cell including providing a first substrate; forming an upper first solar subcell being a homojunction; forming a second solar subcell adjacent to said first solar subcell and having a second band gap smaller than said first band gap; and forming a third solar subcell adjacent to said second solar subcell and having a third band gap smaller than said second band gap. A first graded interlayer is formed adjacent to said third solar subcell; said first graded interlayer having a fourth band gap greater than said third band gap. A fourth solar subcell is formed adjacent to said first graded interlayer, said fourth subcell having a fifth band gap smaller than said third band gap such that said fourth subcell is lattice mismatched with respect to said third subcell. A fifth solar subcell is formed adjacent to said fourth subcell, said fifth subcell having a sixth band gap smaller than said fifth band gap such that said fifth subcell is lattice matched with respect to said fourth subcell. A second graded interlayer is formed adjacent to said fifth solar subcell; said second graded interlayer having a seventh band gap greater than said sixth band gap. A lower sixth solar subcell is formed adjacent to said second graded interlayer, said lower sixth subcell having a eighth band gap smaller than said sixth band gap such that said sixth subcell is lattice mismatched with respect to said fifth subcell.

In some embodiments, the base and emitter of the upper first solar subcell is composed of AlGaInP.

In some embodiments, the band gap of the base of the upper first solar subcell is equal to or greater than 2.05 eV.

In some embodiments, the emitter of the upper first solar subcell is composed of a first region in which the doping is graded from $3 \times 10^{18}$ to $1 \times 10^{18}$ free carriers per cubic centimeter, and a second region directly disposed over the first region in which the doping is constant at $1 \times 10^{17}$ free carriers per cubic centimeter.

In some embodiments, the first region of the emitter of the upper first solar subcell is directly adjacent to a window layer.

In some embodiments, the emitter of the upper first solar subcell has a thickness of 80 nm.

In some embodiments, there is a spacer layer between the emitter and the base of the upper first solar subcell. In some embodiments, the spacer layer between the emitter and the base of the upper first solar subcell is composed of unintentionally doped AlGaInP.

In some embodiments, the base of the upper first solar subcell has a thickness of less than 400 nm.

In some embodiments, the base of the upper first solar subcell has a thickness of 260 nm.

In some embodiments, the emitter section of the upper first solar subcell has a free carrier density of $3 \times 10^{18}$ to $9 \times 10^{18}$ per cubic centimeter.

In some embodiments, in particular in connection with a five junction solar cell utilizing two metamorphic layers, the band gap of the first graded interlayer remains constant at 1.5 eV throughout the thickness of the first graded interlayer, and the band gap of the second graded interlayer remains constant at 1.5 eV throughout the thickness of the second graded interlayer. More specifically, in some embodiments, the present disclosure provides, a method of manufacturing a solar cell using an MOCVD process, wherein the first and second graded interlayers are composed of $(In_xGa_{1-x})_y Al_{1-y}As$, and are formed in the MOCVD reactor so that they are compositionally graded to lattice match the third subcell on one side and the fourth subcell on the other side, and the fourth subcell on one side and the bottom fifth subcell on the other side, respectively, with the values for x and y computed and the composition of the first and second graded interlayers determined so that as the layers are grown in the MOCVD reactor, the band gap of the first graded interlayer remains constant at 1.5 eV throughout the thickness of the first graded interlayer, and the band gap of the second graded interlayer remains constant at 1.5 eV throughout the thickness of the second graded interlayer.

In some embodiments, in particular in connection with a five junction solar cell utilizing two metamorphic layers, the upper subcell is composed of an AlGaInP emitter layer and an AlGaInP base layer, the second subcell is composed of AlGaAs emitter layer and a AlGaAs base layer, the third subcell is composed of a GaInP emitter layer and a GaAs base layer, the fourth subcell is composed of a GaInAs emitter layer and a GaInAs base layer, and the bottom fifth subcell is composed of a GaInAs emitter layer and a GaInAs base layer.

In some embodiments, in particular in connection with a five junction solar cell utilizing two metamorphic layers, the lower fifth subcell has a band gap in the range of approximately 0.85 to 0.95 eV, the fourth subcell has a band gap in the range of approximately 1.0 to 1.2 eV; the third subcell has a band gap in the range of approximately 1.3 to 1.5 eV, the second subcell has a band gap in the range of approximately 1.65 to 1.80 eV and the upper subcell has a band gap in the range of 1.9 to 2.2 eV.

In some embodiments, in particular in connection with a six junction solar cell utilizing three metamorphic layers, the band gap of the first graded interlayer remains constant at 1.5 eV throughout the thickness of the first graded interlayer, the band gap of the second graded interlayer remains constant at 1.5 eV throughout the thickness of the second graded interlayer, and the band gap of the third graded interlayer remains constant at 1.1 eV throughout the thickness of the third graded interlayer.

In some embodiments, in particular in connection with a six junction solar cell utilizing three metamorphic layers, the upper subcell is composed of an AlGaInP emitter layer and an AlGaInP base layer, the second subcell is composed of AlGaAs emitter layer and a AlGaAs base layer, the third subcell is composed of a GaInP emitter layer and a GaAs base layer, the fourth subcell is composed of a GaInAs emitter layer and a GaInAs base layer, the fifth subcell is composed of a GaInAs emitter layer and a GaInAs base layer, and the bottom sixth subcell is composed of a GaInAs emitter layer and a GaInAs base layer.

In some embodiments, in particular in connection with a six junction solar cell utilizing three metamorphic layers, the lower sixth subcell has a band gap in the range of approximately 0.60 to 0.70 eV, the fifth subcell has a band gap in the range of approximately 0.85 to 0.95 eV the fourth subcell has a band gap in the range of approximately 1.0 to 1.2 eV; the third subcell has a band gap in the range of approximately 1.3 to 1.5 eV, the second subcell has a band gap in the range of approximately 1.65 to 1.80 eV and the upper subcell has a band gap in the range of 1.9 to 2.2 eV.

Some implementations of the present disclosure may incorporate or implement fewer of the aspects and features noted in the foregoing summaries.

Additional aspects, advantages, and novel features of the present disclosure will become apparent to those skilled in the art from this disclosure, including the following detailed description as well as by practice of the disclosure. While the disclosure is described below with reference to preferred embodiments, it should be understood that the disclosure is not limited thereto. Those of ordinary skill in the art having access to the teachings herein will recognize additional applications, modifications and embodiments in other fields, which are within the scope of the disclosure as disclosed and claimed herein and with respect to which the disclosure could be of utility.

BRIEF DESCRIPTION OF THE DRAWINGS

The invention will be better and more fully appreciated by reference to the following detailed description when considered in conjunction with the accompanying drawings, wherein:

FIG. 2D is a cross-sectional view of the solar cell of Ha 2C after the next sequence of process steps;

FIG. 3B is a cross-sectional view of the solar cell of FIG. 3A after the next sequence of process steps in which the lower two subcells are grown;

FIG. 3C is a cross-sectional view of the a solar cell of an embodiment of the present disclosure representing a five junction solar cell utilizing three metamorphic layers after an initial stage of fabrication including the deposition of certain semiconductor layers on the growth substrate;

FIG. 4 is a cross-sectional view of a solar cell of an embodiment of the present disclosure representing a six junction solar cell utilizing three metamorphic layers after an initial stage of fabrication including the deposition of certain semiconductor layers on the growth substrate;

FIG. 6 is a cross-sectional view of a solar cell of another embodiment of the present disclosure representing a six junction solar cell utilizing two metamorphic layers after an initial stage of fabrication including the deposition of certain semiconductor layers on the growth substrate;

Figure 1:
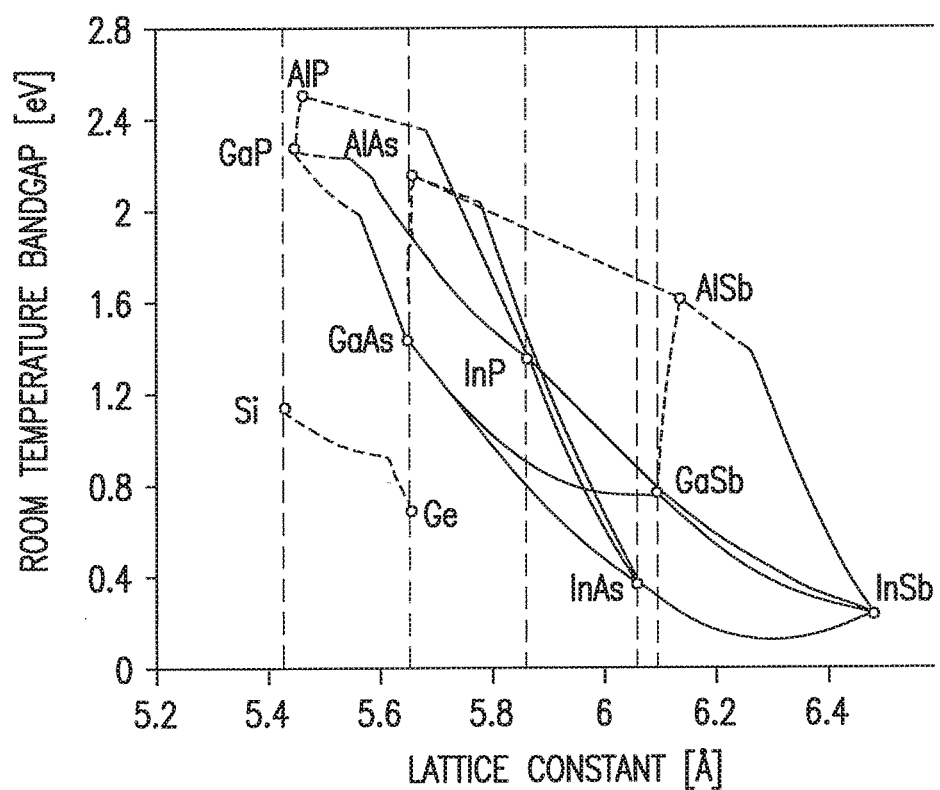
FIG. 1 is a graph representing the band gap of certain binary materials and their lattice constants.

20A according to the present disclosure, compared with that of a solar cell with a normally doped emitter structure.

DESCRIPTION OF THE PREFERRED EMBODIMENT

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

The basic concept of fabricating an inverted metamorphic multijunction (IMM) solar cell is to grow the subcells of the solar cell on a substrate in a "reverse" sequence. That is, the high band gap subcells (i.e. subcells with band gaps in the range of 1.8 to 2.2 eV), which would normally be the "top" subcells facing the solar radiation, are grown epitaxially on a semiconductor growth substrate, such as for example GaAs or Ge, and such subcells are therefore lattice matched to such substrate. One or more lower band gap middle subcells (i.e. with band gaps in the range of 1.2 to 1.8 eV) can then be grown on the high band gap subcells.

At least one lower subcell is formed over the middle subcell such that the at least one lower subcell is substantially lattice mismatched with respect to the growth substrate and such that the at least one lower subcell has a third lower band gap (i.e. a band gap in the range of 0.7 to 1.2 eV). A surrogate substrate or support structure is then attached or provided over the "bottom" or substantially lattice mismatched lower subcell, and the growth semiconductor substrate is subsequently removed. (The growth substrate may then subsequently be re-used for the growth of a second and subsequent solar cells).

A variety of different features of inverted metamorphic multijunction solar cells are disclosed in the related applications noted above. Some, many or all of such features may be included in the structures and processes associated with the solar cells of the present disclosure. However, more particularly, the present disclosure is directed to the fabrication of a five or six junction inverted metamorphic solar cell using either one, two or three different metamorphic layers, all grown on a single growth substrate. In the present disclosure, the resulting construction may include four, five, or six subcells, with band gaps in the range of 1.8 to 2.2 eV (or higher) for the top subcell, and 1.3 to 1.8 eV, 0.9 to 1.2 eV for the middle subcells, and 0.6 to 0.8 eV, for the bottom subcell, respectively.

It should be apparent to one skilled in the art that in addition to the one or two different metamorphic layers discussed in the present disclosure, additional types of semiconductor layers within the cell are also within the scope of the present invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

FIG. 1 is a graph representing the band gap of certain binary materials and their lattice constants. The band gap and lattice constants of ternary materials are located on the lines drawn between typical associated binary materials (such as the ternary material AlGaAs being located between the GaAs and AlAs points on the graph, with the band gap of the ternary material lying between 1.42 eV for GaAs and 2.16 eV for AlAs depending upon the relative amount of the individual constituents). Thus, depending upon the desired band gap, the material constituents of ternary materials can be appropriately selected for growth.

The lattice constants and electrical properties of the layers in the semiconductor structure are preferably controlled by specification of appropriate reactor growth temperatures and times, and by use of appropriate chemical composition and dopants. The use of a vapor deposition method, such as Organo Metallic Vapor Phase Epitaxy (OMVPE), Metal Organic Chemical Vapor Deposition (MOCVD), Molecular Beam Epitaxy (MBE), or other vapor deposition methods for the reverse growth may enable the layers in the monolithic semiconductor structure forming the cell to be grown with the required thickness, elemental composition, dopant concentration and grading and conductivity type.

The present disclosure is directed to a growth process using a metal organic chemical vapor deposition (MOCVD) process in a standard, commercially available reactor suitable for high volume production. More particularly, the present disclosure is directed to the materials and fabrication steps that are particularly suitable for producing commercially viable inverted metamorphic multijunction solar cells using commercially available equipment and established high-volume fabrication processes, as contrasted with merely academic expositions of laboratory or experimental results.

In order to provide appropriate background FIG. 2A through 2H depicts the sequence of steps in forming a four junction solar cell solar cell generally as set forth in parent U.S. patent application Ser. No. 12/271,192 filed Nov. 14, 2008, herein incorporated by reference.

Figure 2A:
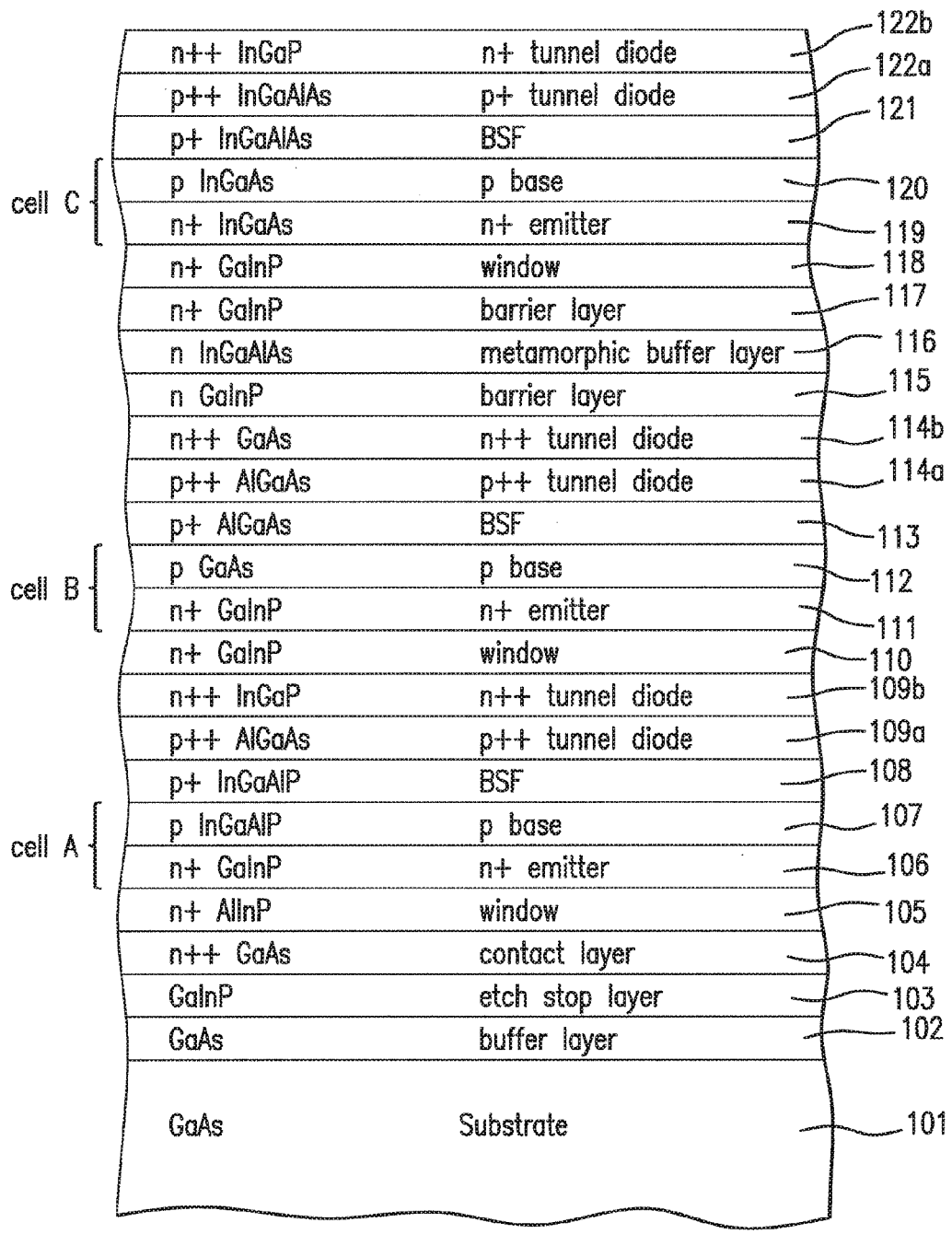
FIG. 2A is a cross-sectional view of the solar cell of one embodiment of a multijunction solar cell after an initial stage of fabrication including the deposition of certain semiconductor layers on the growth substrate.

FIG. 2A depicts the sequential formation of the three subcells A, B and C on a GaAs growth substrate. More particularly, there is shown a substrate 101, which is preferably gallium arsenide (GaAs), but may also be germanium (Ge) or other suitable material. For GaAs, the substrate is preferably a 15° off-cut substrate, that is to say, its surface is orientated 15° off the (100) plane towards the (111) A plane, as more fully described in U.S. patent application Ser. No. 12/047,944, filed Mar. 13, 2008.

In the case of a Ge substrate, a nucleation layer (not shown) is deposited directly on the substrate 101. On the substrate, or over the nucleation layer (in the case of a Ge substrate), a buffer layer 102 and an etch stop layer 103 are further deposited. In the case of GaAs substrate, the buffer layer 102 is preferably GaAs. In the case of Ge substrate, the buffer layer 102 is preferably GaInAs. A contact layer 104 of GaAs is then deposited on layer 103, and a window layer 105 of AlInP is deposited on the contact layer. The subcell A, consisting of an n+ emitter layer 106 and a p-type base layer 107, is then epitaxially deposited on the window layer 105. The subcell A is generally lattice matched to the growth substrate 101.

It should be noted that the multijunction solar cell structure could be formed by any suitable combination of group III to V elements listed in the periodic table subject to lattice constant and band gap requirements, wherein the group III includes boron (B), aluminum (Al), gallium (Ga), indium (In), and thallium (T). The group IV includes carbon (C), silicon (Si), germanium (Ge), and tin (Sn). The group V includes nitrogen (N), phosphorus (P), arsenic (As), antimony (Sb), and bismuth (Bi).

In one embodiment, the emitter layer 106 is composed of GaInP and the base layer 107 is composed of AlGaInP. In some embodiments, more generally, the base-emitter junction may be a heterojunction. In other embodiments, the base layer may be composed of (Al)GaInP, where the aluminum or Al term in parenthesis in the preceding formula means that Al is an optional constituent, and in this instance may be used in an amount ranging from 0% to 30%. The doping profile of the emitter and base layers 106 and 107 according to the present invention will be discussed in conjunction with FIG. 20.

In some embodiments, the band gap of the base layer 107 is 1.91 eV or greater.

Subcell A will ultimately become the "top" subcell of the inverted metamorphic structure after completion of the process steps according to the present invention to be described hereinafter.

On top of the base layer 107 a back surface field ("BSF") layer 108 preferably p+ AlGaInP is deposited and used to reduce recombination loss.

The BSF layer 108 drives minority carriers from the region near the base/BSF interface surface to minimize the effect of recombination loss. In other words, the BSF layer 18 reduces recombination loss at the backside of the solar subcell A and thereby reduces the recombination in the base.

On top of the BSF layer 108 a sequence of heavily doped p-type and n-type layers 109a and 109b is deposited that forms a tunnel diode, i.e. an ohmic circuit element that forms an electrical connection between subcell A to subcell B. Layer 109a is preferably composed of p++ AlGaAs, and layer 109b is preferably composed of n++ GaInP.

On top of the tunnel diode layers 109 a window layer 110 is deposited, preferably n+ GaInP. The advantage of utilizing GaInP as the material constituent of the window layer 110 is that it has an index of refraction that closely matches the adjacent emitter layer 111, as more fully described in U.S. patent application Ser. No. 12/258,190, filed Oct. 24, 2008. The window layer 110 used in the subcell B also operates to reduce the interface recombination loss. It should be apparent to one skilled in the art, that additional layer(s) may be added or deleted in the cell structure without departing from the scope of the present disclosure.

On top of the window layer 110 the layers of subcell B are deposited: the n-type emitter layer 111 and the p-type base layer 112. These layers are preferably composed of GaInP and GaIn$_{0.015}$As respectively (for a Ge substrate or growth template), or GaInP and GaAs respectively (for a GaAs substrate), although any other suitable materials consistent with lattice constant and band gap requirements may be used as well. Thus, subcell B may be composed of a GaAs, GaInP, GaInAs, GaAsSb, or GaInAsN emitter region and a GaAs, GaInAs, GaAsSb, or GaInAsN base region. The doping profile of layers 111 and 112 according to the present disclosure will be discussed in conjunction with FIG. 20B.

In some previously disclosed implementations of an inverted metamorphic solar cell, the middle cell was a homostructure. In some embodiments of the present disclosure, similarly to the structure disclosed in U.S. patent application Ser. No. 12/023,772, the middle subcell becomes a heterostructure with an GaInP emitter and its window is converted from AlInP to GaInP. This modification eliminated the refractive index discontinuity at the window/emitter interface of the middle subcell, as more fully described in U.S. patent application Ser. No. 12/258,190, filed Oct. 24, 2008. Moreover, the window layer 110 is preferably doped three times that of the emitter 111 to move the Fermi level up closer to the conduction band and therefore create band bending at the window/emitter interface which results in constraining the minority carriers to the emitter layer.

In one embodiment of the present disclosure, the middle subcell emitter has a band gap equal to the top subcell emitter, and the third subcell emitter has a band gap greater than the band gap of the base of the middle subcell. Therefore, after fabrication of the solar cell, and implementation and operation, neither the emitters of middle subcell B nor the third subcell C will be exposed to absorbable radiation. Substantially all of the photons representing absorbable radiation will be absorbed in the bases of cells B and C, which have narrower band gaps than the emitters. Therefore, the advantages of using heterojunction subcells are: (i) the short wavelength response for both subcells will improve, and (ii) the bulk of the radiation is more effectively absorbed and collected in the narrower band gap base. The effect will be to increase the short circuit current $J_{sc}$.

On top of the cell B is deposited a BSF layer 113 which performs the same function as the BSF layer 109. The p++/n++ tunnel diode layers 114a and 114b respectively are deposited over the BSF layer 113, similar to the layers 109a and 109b, forming an ohmic circuit element to connect subcell B to subcell C. The layer 114a may be composed of p++ AlGaAs, and layer 114b may be composed of n++ GaAs or GaInP.

In some embodiments a barrier layer 115, composed of n-type (Al)GaInP, is deposited over the tunnel diode 114a/114b, to a thickness of about 0.5 micron. Such barrier layer is intended to prevent threading dislocations from propagating, either opposite to the direction of growth into the middle and top subcells B and C, or in the direction of growth into the bottom subcell A, and is more particularly described in copending U.S. patent application Ser. No. 11/860,183, filed Sep. 24, 2007.

A metamorphic layer (or graded interlayer) 116 is deposited over the barrier layer 115. Layer 116 is preferably a compositionally step-graded series of AlGaInAs layers, preferably with monotonically changing lattice constant, so as to achieve a gradual transition in lattice constant in the semiconductor structure from subcell B to subcell C while minimizing threading dislocations from occurring. In some embodiments, the band gap of layer 116 is constant throughout its thickness, preferably approximately equal to 1.5 eV, or otherwise consistent with a value slightly greater than the band gap of the middle subcell B. One embodiment of the graded interlayer may also be expressed as being composed of $(In_xGa_{1-x})_yAl_{1-y}As$, with x and y selected such that the band gap of the interlayer remains constant at approximately 1.50 eV or other appropriate band gap.

In an alternative embodiment where the solar cell has only two subcells, and the "middle" cell B is the uppermost or top subcell in the final solar cell, wherein the "top" subcell B would typically have a band gap of 1.8 to 1.9 eV, then the band gap of the interlayer would remain constant at 1.9 eV.

In the inverted metamorphic structure described in the Wanlass et al. paper cited above, the metamorphic layer consists of nine compositionally graded GaInP steps, with each step layer having a thickness of 0.25 micron. As a result, each layer of Wanlass et al. has a different band gap. In one embodiment of the present invention, the layer 116 is composed of a plurality of layers of AlGaInAs, with monotonically changing lattice constant, each layer having the same band gap, approximately 1.5 eV.

The advantage of utilizing a constant band gap material such as AlGaInAs is that arsenide-based semiconductor material is much easier to process from a manufacturing standpoint in standard commercial MOCVD reactors than materials incorporating phosphorus, while the small amount of aluminum in the band gap material assures radiation transparency of the metamorphic layers.

Although one embodiment of the present disclosure utilizes a plurality of layers of AlGaInAs for the metamorphic layer 116 for reasons of manufacturability and radiation transparency, other embodiments of the present disclosure may utilize different material systems to achieve a change in lattice constant from subcell B to subcell C. Other embodiments of the present disclosure may utilize continuously graded, as opposed to step graded, materials. More generally, the graded interlayer may be composed of any of the As, P, N, Sb based III-V compound semiconductors subject to the constraints of having the in-plane lattice parameter greater or equal to that of the second solar cell and less than or equal to that of the third solar cell, and having a band gap energy greater than that of the second solar cell.

In another embodiment of the present disclosure, an optional second barrier layer 117 may be deposited over the AlGaInAs metamorphic layer 116. The second barrier layer 117 will typically have a different composition than that of barrier layer 115, and performs essentially the same function of preventing threading dislocations from propagating. In one embodiment, barrier layer 117 is n+ type GaInP.

A window layer 118 preferably composed of n+ type GaInP is then deposited over the barrier layer 117 (or directly over layer 116, in the absence of a second barrier layer). This window layer operates to reduce the recombination loss in subcell "C". It should be apparent to one skilled in the art that additional layers may be added or deleted in the cell structure without departing from the scope of the present disclosure.

On top of the window layer 118, the layers of cell C are deposited: the n+ emitter layer 119, and the p-type base layer 120. These layers are preferably composed of n+ type GaInAs and p+ type GaInAs respectively, or n+ type GaInP and p type GaInAs for a heterojunction subcell, although other suitable materials consistent with lattice constant and band gap requirements may be used as well. The doping profile of layers 119 and 120 will be discussed in connection with FIG. 20.

A BSF layer 121, preferably composed of AlGaInAs, is then deposited on top of the cell C, the BSF layer performing the same function as the BSF layers 108 and 113.

The p++/n++ tunnel diode layers 122a and 122b respectively are deposited over the BSF layer 121, similar to the layers 114a and 114b, forming an ohmic circuit element to connect subcell C to subcell D. The layer 122a is composed of p++ AlGaInAs, and layer 122b is composed of n++ GaInP.

Figure 2B:
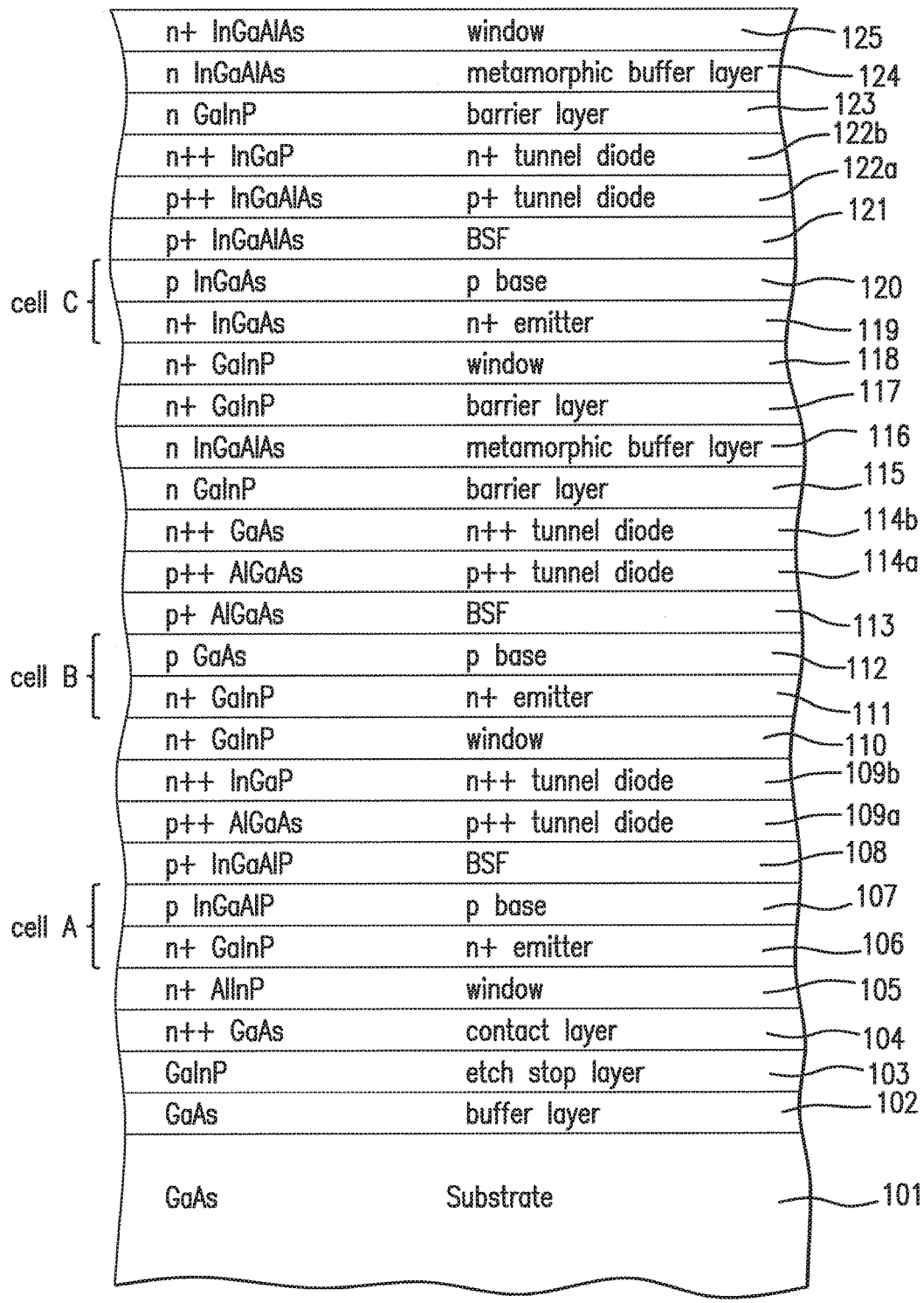
FIG. 2B is a cross-sectional view of the solar cell of FIG. 2A after the next sequence of process steps.

FIG. 2B depicts a cross-sectional view of the solar cell of FIG. 2A after the next sequence of process steps. In some embodiments a barrier layer 123, preferably composed of n-type GaInP, is deposited over the tunnel diode 122a/122b, to a thickness of about 0.5 micron. Such barrier layer is intended to prevent threading dislocations from propagating, either opposite to the direction of growth into the top and middle subcells A, B and C, or in the direction of growth into the subcell D, and is more particularly described in copending U.S. patent application Ser. No. 11/860,183, filed Sep. 24, 2007.

A metamorphic layer (or graded interlayer) 124 is deposited over the barrier layer 123. Layer 124 is preferably a compositionally step-graded series of AlGaInAs layers, preferably with monotonically changing lattice constant, so as to achieve a gradual transition in lattice constant in the semiconductor structure from subcell C to subcell D while minimizing threading dislocations from occurring. In some embodiments the band gap of layer 124 is constant throughout its thickness, preferably approximately equal to 1.1 eV, or otherwise consistent with a value slightly greater than the band gap of the middle subcell C. One embodiment of the graded interlayer may also be expressed as being composed of $(In_xGa_{1-x})_yAl_{1-y}As$, with x and y selected such that the band gap of the interlayer remains constant at approximately 1.1 eV or other appropriate band gap.

A window layer 125 preferably composed of n+ type AlGaInAs is then deposited over layer 124 (or over a second barrier layer, if there is one, disposed over layer 124). This window layer operates to reduce the recombination loss in the fourth subcell "D". It should be apparent to one skilled in the art that additional layers may be added or deleted in the cell structure without departing from the scope of the present invention.

Figure 2C:
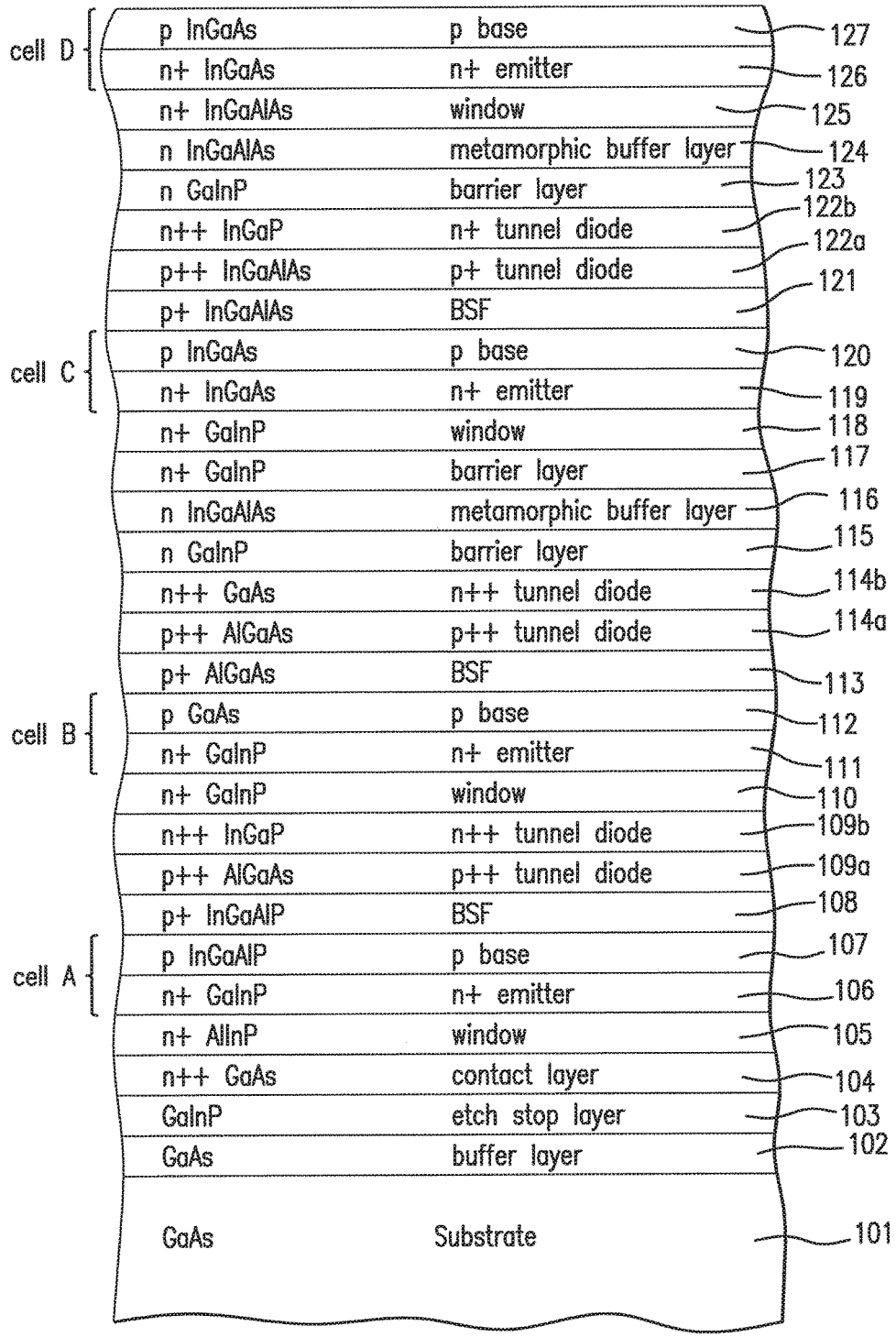
FIG. 2C is a cross-sectional view of the solar cell of FIG. 2B after the next sequence of process steps.

FIG. 2C depicts a cross-sectional view of the solar cell of FIG. 2B after the next sequence of process steps. On top of the window layer 125, the layers of cell D are deposited: the n+ emitter layer 126, and the p-type base layer 127. These layers are preferably composed of n+ type GaInAs and p type GaInAs respectively, although other suitable materials consistent with lattice constant and band gap requirements may be used as well. The doping profile of layers 126 and 127 will be discussed in connection with FIG. 20.

Turning next to FIG. 2D, a BSF layer 128, preferably composed of p+ type AlGaInAs, is then deposited on top of the cell D, the BSF layer performing the same function as the BSF layers 108, 113 and 121.

Finally a high band gap contact layer 129, preferably composed of p++ type AlGaInAs, is deposited on the BSF layer 128.

The composition of this contact layer 129 located at the bottom (non-illuminated) side of the lowest band gap photovoltaic cell (i.e., subcell "D" in the depicted embodiment) in a multijunction photovoltaic cell, can be formulated to reduce absorption of the light that passes through the cell, so that (i) the backside ohmic metal contact layer below it (on the non-illuminated side) will also act as a mirror layer, and (ii) the contact layer doesn't have to be selectively etched off, to prevent absorption.

It should be apparent to one skilled in the art, that additional layer(s) may be added or deleted in the cell structure without departing from the scope of the present invention.

Figure 2E:
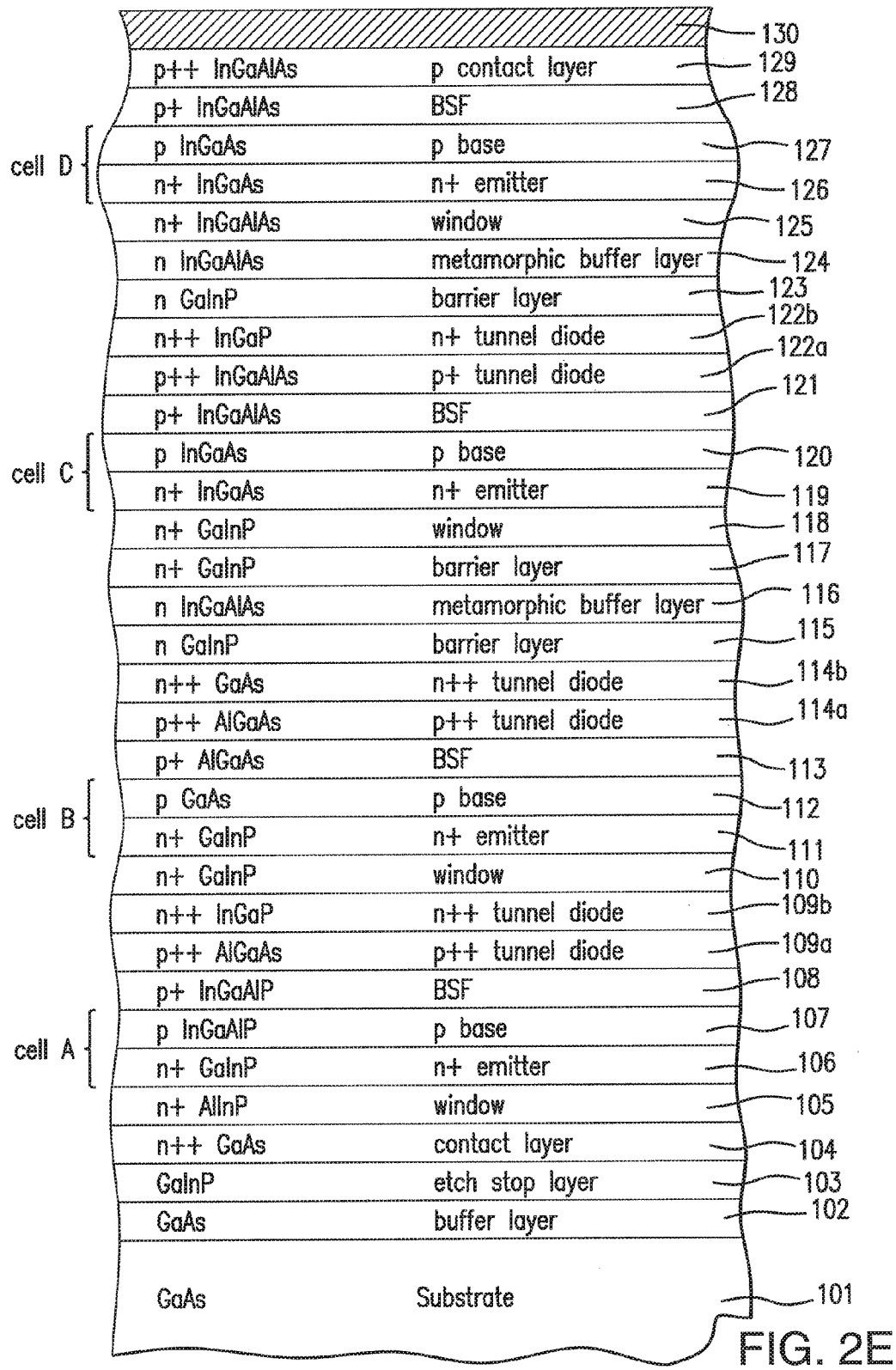
FIG. 2E is a cross-sectional view of the solar cell of FIG. 2D after the next process step.

FIG. 2E is a cross-sectional view of the solar cell of FIG. 2D after the next process step in which a metal contact layer 130 is deposited over the p+ semiconductor contact layer 129. The metal is the sequence of metal layers Ti/Au/Ag/Au.

Also, the metal contact scheme chosen is one that has a planar interface with the semiconductor, after heat treatment to activate the ohmic contact. This is done so that (1) a dielectric layer separating the metal from the semiconductor doesn't have to be deposited and selectively etched in the metal contact areas; and (2) the contact layer is specularly reflective over the wavelength range of interest.

Figure 2F:
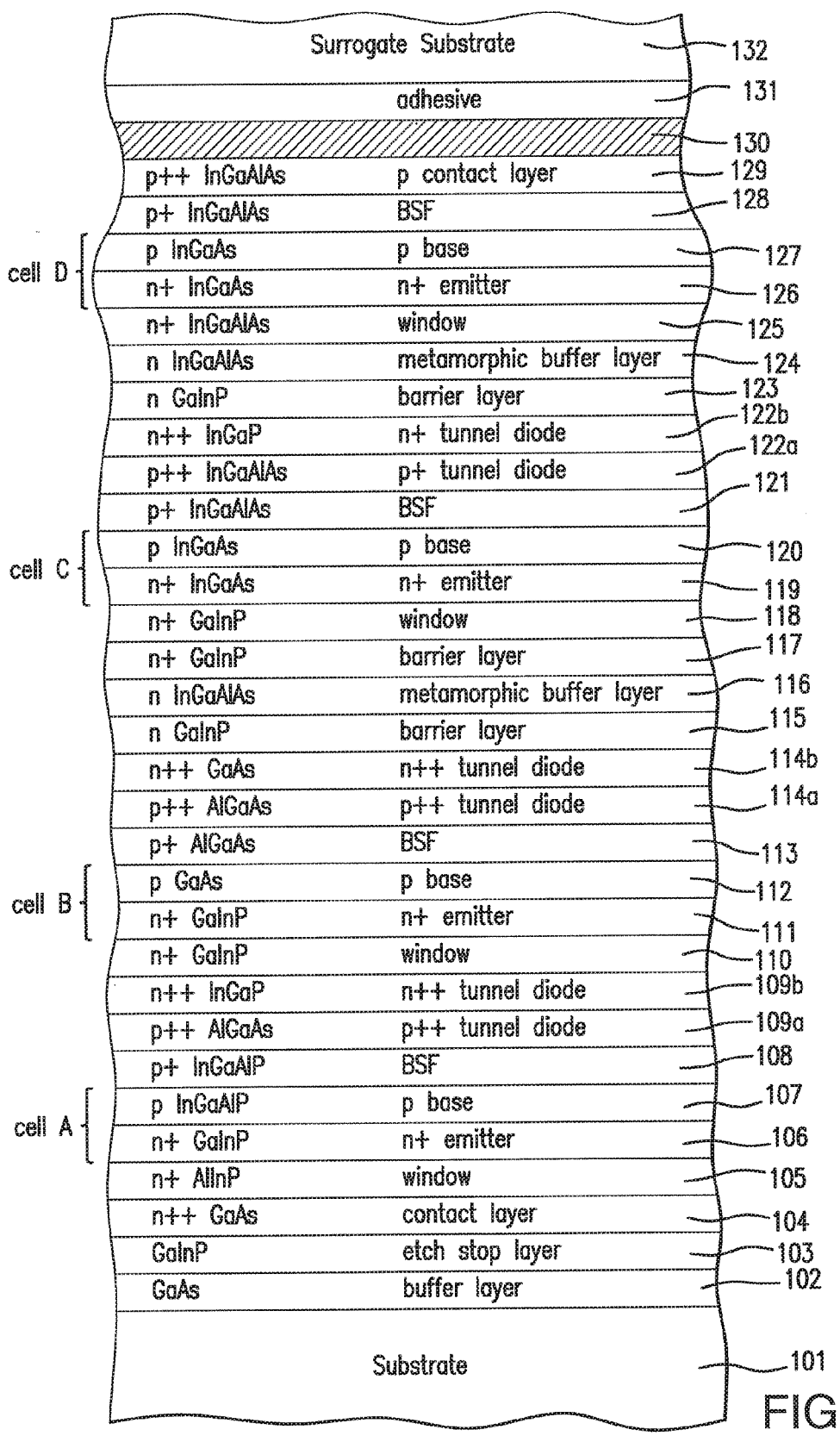
FIG. 2F is a cross-sectional view of the solar cell of FIG. 2E after the next process step in which a surrogate substrate is attached.

FIG. 2F is a cross-sectional view of the solar cell of FIG. 2E after the next process step in which an adhesive layer 131 is deposited over the metal layer 130. The adhesive may be CR 200 (manufactured by Brewer Science, Inc. of Rolla, Mo.).

In the next process step, a surrogate substrate 132, preferably sapphire, is attached. Alternatively, the surrogate substrate may be GaAs, Ge or Si, or other suitable material. The surrogate substrate is about 40 mils in thickness, and is perforated with holes about 1 mm in diameter, spaced 4 mm apart, to aid in subsequent removal of the adhesive and the substrate. Of course, surrogate substrates with other thicknesses and perforation configurations may be used as well. As an alternative to using an adhesive layer 131, a suitable substrate (e.g., GaAs) may be eutectically or permanently bonded to the metal layer 130.

Figure 2G:
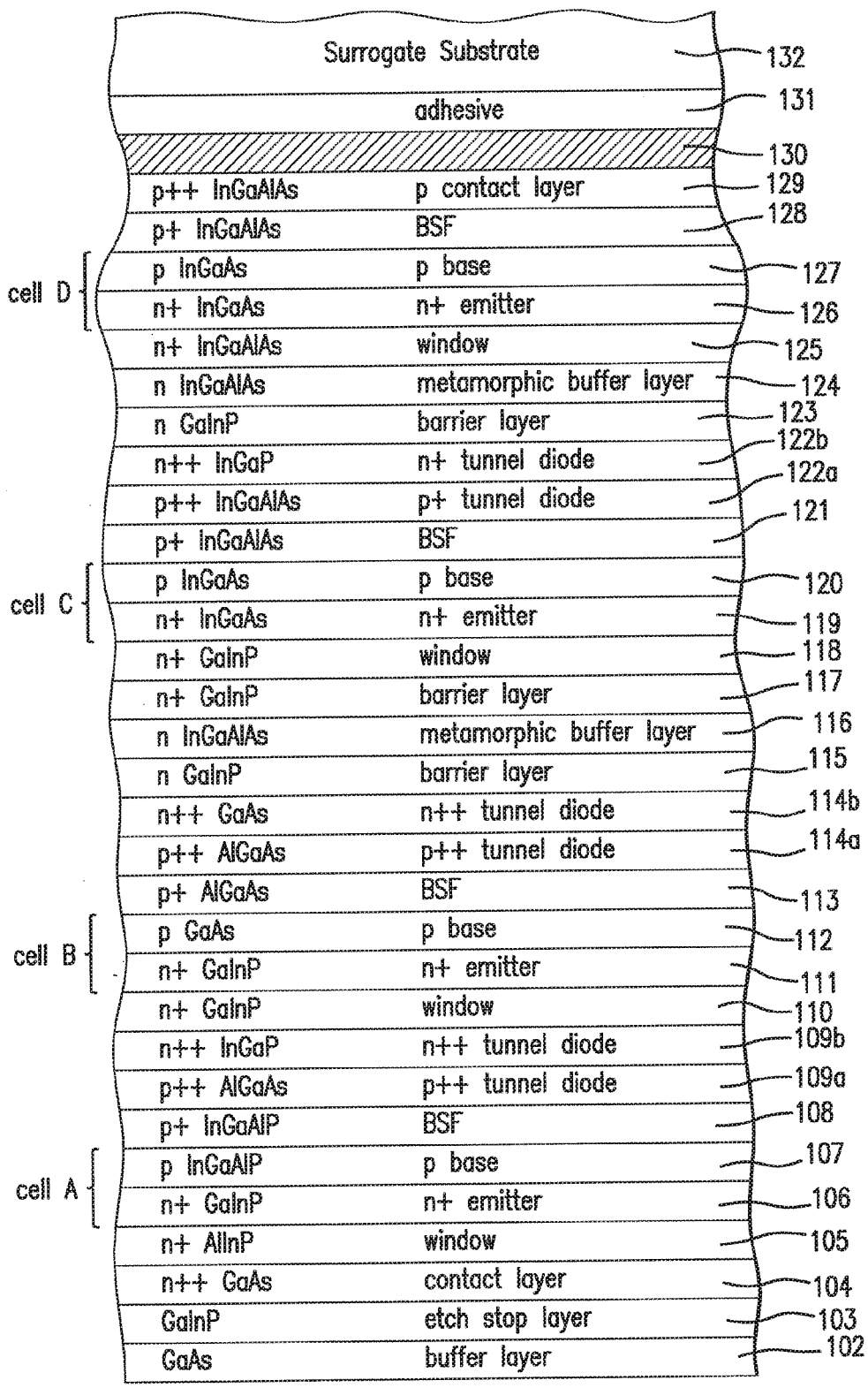
FIG. 2G is a cross-sectional view of the solar cell of FIG. 2F after the next process step in which the original substrate is removed.

FIG. 2G is a cross-sectional view of the solar cell of FIG. 2F after the next process step in which the original substrate is removed, in one embodiment, by a sequence of lapping and/or etching steps in which the substrate 101, and the buffer layer 103 are removed. The choice of a particular etchant is growth substrate dependent.

Figure 2H:
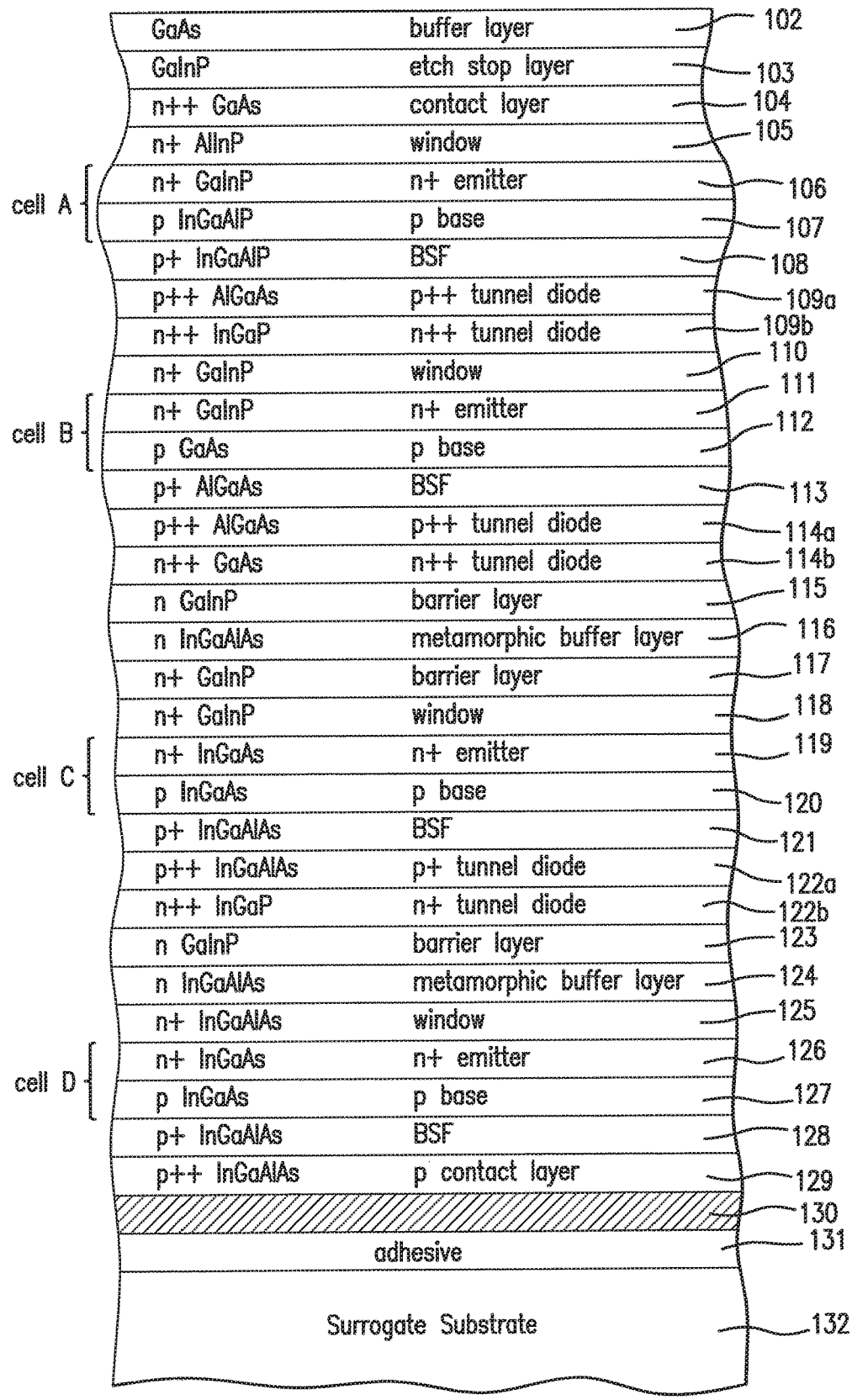
FIG. 2H is another cross-sectional view of the solar cell of FIG. 2G with the surrogate substrate on the bottom of the Figure.

FIG. 2H is a cross-sectional view of the solar cell of FIG. 2G with the orientation with the surrogate substrate 132 being at the bottom of the Figure. Subsequent Figures in this application will assume such orientation.

Five Junction Solar Cell with Two Metamorphic Layers

Figure 3A:
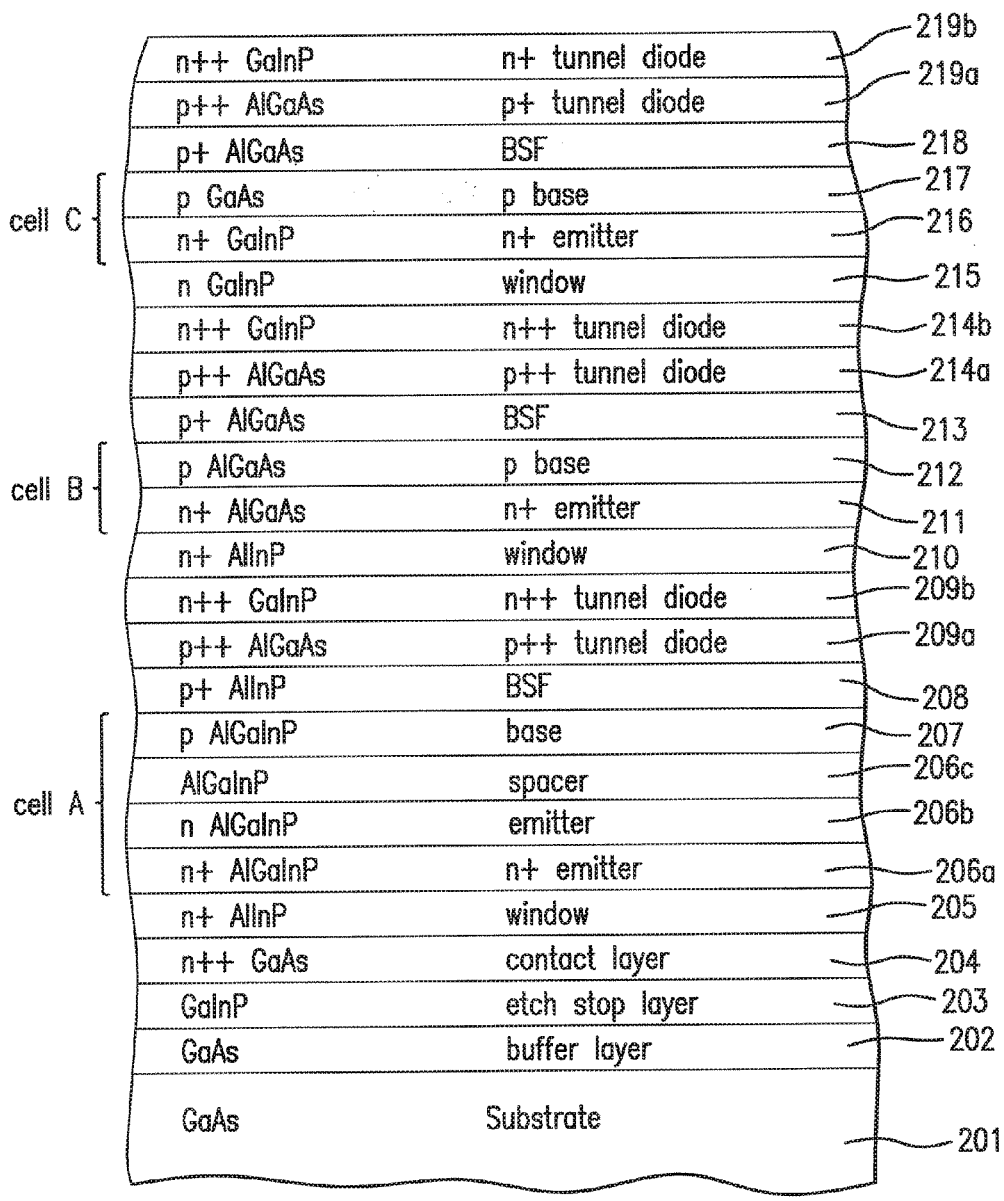
FIG. 3A is a cross-sectional view of the solar cell of an embodiment of the present disclosure representing a five junction solar cell utilizing two metamorphic layers after an initial stage of fabrication including the deposition of certain semiconductor layers on the growth substrate.

FIG. 3A through 3B depicts the sequence of steps in forming a multijunction solar cell in an embodiment according to the present disclosure in which a five junction solar cell with two metamorphic buffer layers is fabricated.

FIG. 3A depicts the initial sequence of steps in forming a multijunction solar cell in an embodiment according to the present disclosure in which the first three cells of one embodiment of a five junction solar cell is fabricated.

FIG. 3B is a cross-sectional view of the solar cell of FIG. 3A in the embodiment after the next sequence of process steps in which the lower two subcells are grown.

FIG. 3C is a cross-sectional view of a solar cell in an embodiment of a five junction solar cell with three metamorphic layers.

Turning first to FIG. 3A, the sequential formation of the three subcells A, B and C on a GaAs growth substrate is depicted. More particularly, there is shown a substrate 201, which is preferably gallium arsenide (GaAs), but may also be germanium (Ge) or other suitable material. For GaAs, the substrate is preferably a 15° off-cut substrate, that is to say, its surface is orientated 15° off the (100) plane towards the (111) A plane, as more fully described in U.S. patent application Ser. No. 12/047,944, filed Mar. 13, 2008.

In the case of a Ge substrate, a nucleation layer (not shown) is deposited directly on the substrate 201. On the substrate, or over the nucleation layer (in the case of a Ge substrate), a buffer layer 202 and an etch stop layer 203 are further deposited. In the case of GaAs substrate, the buffer layer 202 is preferably GaAs. In the case of Ge substrate, the buffer layer 202 is preferably GaInAs. A contact layer 204 of GaAs is then deposited on layer 203, and a window layer 205 of AlInP is deposited on the contact layer. The subcell A, which will be the upper first solar subcell of the structure, consisting of an n+ emitter layer 206 and a p-type base layer 207, is then epitaxially deposited on the window layer 205. The subcell A is generally lattice matched to the growth substrate 201.

It should be noted that the multijunction solar cell structure could be formed by any suitable combination of group III to V elements listed in the periodic table subject to lattice constant and band gap requirements, wherein the group III includes boron (B), aluminum (Al), gallium (Ga), indium (In), and thallium (T). The group IV includes carbon (C), silicon (Si), germanium (Ge), and tin (Sn). The group V includes nitrogen (N), phosphorus (P), arsenic (As), antimony (Sb), and bismuth (Bi).

In one embodiment, the emitter layer is composed of AlGaInP and the base layer 207 is composed of AlGaInP, and thus the p/n junction of this subcell is a homojunction. More particularly, the emitter layer 206 is composed of two regions: an n+ type emitter region 206a directly grown on the window layer 205, and an n type emitter region 206b directly grown on the emitter region 206a. The doping profile of the different emitter regions 206a and 206b, and base layer 207 according to the present disclosure will be discussed in conjunction with FIG. 20A.

In some embodiments, a spacer layer 206c composed of unintentionally doped AlGaInP is then grown directly on top of the n type emitter region 206b.

The base layer 207 is composed of AlGaInP is grown over the spacer layer 206c.

In some embodiments, the band gap of the base layer 207 is 1.92 eV or greater.

In some embodiments, the band gap of the base of the upper first solar subcell is equal to or greater than 2.05 eV.

In some embodiments, the emitter of the upper first solar subcell is composed of a first region in which the doping is graded from $3\times10^{18}$ to $1\times10^{18}$ free carriers per cubic centimeter, and a second region directly disposed over the first region in which the doping is constant at $1\times10^{17}$ free carriers per cubic centimeter.

In some embodiments, the first region of the emitter of the upper first solar subcell is directly adjacent to a window layer.

In some embodiments, the emitter of the upper first solar subcell has a thickness of 80 nm.

In some embodiments, the base of the upper first solar subcell has a thickness of less than 400 nm.

In some embodiments, the base of the upper first solar subcell has a thickness of 260 nm.

In some embodiments, the emitter section of the upper first solar subcell has a first region in which the doping is graded, and a second region directly disposed over the first region in which the doping is constant.

Subcell A will ultimately become the "top" subcell of the inverted metamorphic structure after completion of the process steps according to the present invention to be described hereinafter.

On top of the base layer 207 a back surface field ("BSF") layer 208 preferably p+ AlInP is deposited and used to reduce recombination loss.

The BSF layer 208 drives minority carriers from the region near the base/BSF interface surface to minimize the effect of recombination loss. In other words, the BSF layer 208 reduces recombination loss at the backside of the solar subcell A and thereby reduces the recombination in the base.

On top of the BSF layer 208 a sequence of heavily doped p-type and n-type layers 209a and 209b is deposited that forms a tunnel diode, i.e. an ohmic circuit element that forms an electrical connection between subcell A to subcell B. Layer 209a may be composed of p++ AlGaAs, and layer 209b may be composed of n++ GaInP.

On top of the tunnel diode layers 209 a window layer 210 is deposited, which may be n+ AlInP. The advantage of utilizing AlInP as the material constituent of the window layer 210 is that it has an index of refraction that closely matches the adjacent emitter layer 211, as more fully described in U.S. patent application Ser. No. 12/258,190, filed Oct. 24, 2008. The window layer 210 used in the subcell B also operates to reduce the interface recombination loss. It should be apparent to one skilled in the art, that additional layer(s) may be added or deleted in the cell structure without departing from the scope of the present disclosure.

On top of the window layer 210 the layers of subcell B are deposited: the n+ type emitter layer 211 and the p-type base layer 212. These layers are composed of AlGaAs and AlGaAs respectively (for a GaAs substrate), although any other suitable materials consistent with lattice constant and band gap requirements may be used as well. Thus, subcell B may be composed of a GaAs, GaInP, GaInAs, GaAsSb, or GaInAsN emitter region and a GaAs, GaInAs, GaAsSb, or GaInAsN base region. The doping profile of layers 211 and 212 according to the present disclosure will be discussed in conjunction with FIG. 20B.

In embodiments of the present disclosure, similarly to the structure disclosed in U.S. patent application Ser. No. 12/023,772, the subcell B may be a heterostructure with an GaInP emitter and its window is converted from AlInP to GaInP. This modification eliminated the refractive index discontinuity at the window/emitter interface of the middle subcell, as more fully described in U.S. patent application Ser. No. 12/258,190, filed Oct. 24, 2008. Moreover, the window layer 210 is preferably doped three times that of the emitter 211 to move the Fermi level up closer to the conduction band and therefore create band bending at the window/emitter interface which results in constraining the minority carriers to the emitter layer.

On top of the cell B is deposited a BSF layer 213 which performs the same function as the BSF layer 209. The p++/n++ tunnel diode layers 214a and 214b respectively are deposited over the BSF layer 213, similar to the layers 209a and 209b, forming an ohmic circuit element to connect subcell B to subcell C. The layer 214a may be composed of p++ AlGaAs, and layer 214b may be composed of n++ GaInP.

A window layer 215 composed of n+ type GaInP is then deposited over the tunnel diode layers 214a, 214b. This window layer operates to reduce the recombination loss in subcell "C". It should be apparent to one skilled in the art that additional layers may be added or deleted in the cell structure without departing from the scope of the present disclosure.

On top of the window layer 215, the layers of subcell C are deposited: the n+ emitter layer 216, and the p-type base layer 217. These layers are composed of n+ type GaInP and p+ type GaAs respectively, although other suitable materials consistent with lattice constant and band gap requirements may be used as well. The doping profile of layers 216 and 217 will be discussed in connection with FIG. 27B.

A BSF layer 218, preferably composed of AlGaAs, is then deposited on top of the cell C, the BSF layer performing the same function as the BSF layers 208 and 213.

The p++/n++ tunnel diode layers 219a and 219b respectively are deposited over the BSF layer 218, similar to the layers 214a and 214b, forming an ohmic circuit element to connect subcell C to subcell D. The layer 219a is preferably composed of p++ AlGaAs, and layer 219b is preferably composed of n++ GaInP.

FIG. 3B is a cross-sectional view of the solar cell of FIG. 3A in a first embodiment of a five junction solar cell after the next sequence of process steps in which the lower two subcells D and E are grown on the initial structure of FIG. 3A.

Turning to FIG. 3B, a sequence of layers 220 through 235 are grown on top of the tunnel diode layers 219a and 219b.

In some embodiments a barrier layer 220, composed of n-type (Al)GaInP, is deposited over the tunnel diode 219a/ 219b, to a thickness of about 0.5 micron. Such barrier layer is intended to prevent threading dislocations from propagating, either opposite to the direction of growth into the middle subcells B and C, or in the direction of growth into the lower subcell D and E, and is more particularly described in copending U.S. patent application Ser. No. 11/860,183, filed Sep. 24, 2007.

A first metamorphic layer (or graded interlayer) 221 is deposited over the barrier layer 220. Layer 221 is preferably a compositionally step-graded series of AlGaInAs layers, preferably with monotonically changing lattice constant, so as to achieve a gradual transition in lattice constant in the semiconductor structure from subcell C to subcell D while minimizing threading dislocations from occurring. Stated another way, the layer 221 has a lattice constant on one surface adjacent to subcell C which matches that of subcell C, and a lattice constant on the opposing surface adjacent to subcell D which matches that of subcell D, and a gradation in lattice constant throughout its thickness. In some embodiments, the band gap of layer 221 is constant throughout its thickness, preferably approximately equal to 1.5 eV, or otherwise consistent with a value slightly greater than the band gap of the middle subcell C. One embodiment of the graded interlayer may also be expressed as being composed of $Al_y(Ga_x In_{1-x})_{1-y}As$, or alternatively written as $(In_x Ga_{1-x})_{1-y} Al_y As$, with the positive values for x and y selected such that the band gap of the interlayer remains constant at approximately 1.50 eV or other appropriate band gap.

In the inverted metamorphic structure described in the Wanlass et al. paper cited above, the metamorphic layer consists of nine compositionally graded GaInP steps, with each step layer having a thickness of 0.25 micron. As a result, each layer of Wanlass et al. has a different band gap. In one embodiment of the present disclosure, the layer 221 is composed of a plurality of layers of AlGaInAs, with monotonically changing lattice constant, each layer having the same band gap, approximately 1.5 eV. More particularly, the first graded interlayer 221 is composed of $Al_y(Ga_x In_{1-x})_{1-y}As$ with the values for x and y between 0 and 1 selected such that the band gap of each sublayer in the interlayer remains constant throughout its thickness.

In some embodiments, the band gap of the first graded interlayer remains constant at 1.5 eV throughout the thickness of the first graded interlayer.

Since the present disclosure (and the related applications noted above) are directed to high volume manufacturing processes using metalorganic vapor phase epitaxy (MOVPE) reactors to form the solar cell epitaxial layers, a short discussion of some of the considerations associated with such processes and methods associated with the formation of the graded interlayer(s) are in order here.

First, it should be noted that the advantage of utilizing an interlayer material such as AlGaInAs is that arsenide-based semiconductor material is much easier to process from a manufacturing standpoint using present state-of-the-art high volume manufacturing metalorganic vapor phase epitaxy (MOVPE) reactors than either the AlGaInAsP, or GaInP compounds, or in general any material including phosphorus. Simply stated, the use of a III-V arsenide compound is much more desirable than a I-V phosphide compound from the perspectives of cost, ease of growth, reactor maintenance, waste handling and personal safety.

The cost advantage of the use of the AlGaInAs quaternary grading material relative to a GaInP ternary grading material, as an example, is a consequence of several factors. First, the use of a GaInP grading approach requires indium mole fractions of the order of 60% (i.e., the required material is $Ga_{0.4}In_{0.6}P$) whereas the use of the AlGaInAs quaternary requires only 15% indium (i.e., the required material is $Al_y(Ga_{0.85}In_{0.15})_{1-y}As$). In addition to the difference in the material itself, there is a further difference in the amount of precursor gases (trimethylgallium, trimethylindium, and arsine) that must be input to the reactor in order to achieve the desired composition. In particular, the ratio of the amount of precursor gases into the reactor to provide Group V elements, to the amount of precursor gases to provide Group III elements (such ratio being referred to as the "input V/III ratio") is typically five to ten times greater to produce a phosphide compound compared to producing an arsenide compound. As a illustrative quantification of the cost of producing a phosphide compound in a commercial operational MOPVE reactor process compared to the cost of producing an arsenide compound, Table 1 below presents the typical pro-forma costs of each element of the AlGaInAs and GaInP compounds for producing a graded interlayer of the type described in the present disclosure expressed on a per mole basis. Of course, like many commodities, the price of chemical compounds fluctuate from time to time and vary in different geographic locations and countries and from supplier to supplier. The prices used in Table 1 are representative for purchases in commercial quantities in the United States at the time of the present disclosure. The cost calculations make the assumption (typical for epitaxial processes using current commercial MOVPE reactors) that the input V/III ratios are 20 and 120 for the arsenide and phosphide compounds respectively. Such a choice of value of the ratio is merely illustrative for a typical process, and some processes may use even higher ratios for producing a graded interlayer of the type described in the present disclosure. The practical consequence of the inlet V/I ratio is that one will use 20 moles of As to one (1) mole of AlGaIn in the formation of the Applicant's quaternary material AlGaInAs, or 120 moles of P to 1 mole of Gain in the formation of the interlayer using the ternary material GaInP. These assumptions along with the molar cost of each of the constituent elements indicate that the cost of fabrication of the AlGaInAs based grading interlayer will be approximately 25% of the cost of fabrication of a similar phosphide based grading interlayer. Thus, there is an important economic incentive from a commercial and manufacturing perspective to utilize an arsenide compound as opposed to a phosphide compound for the grading interlayer.

The "ease of growth" of an arsenide compound as opposed to a phosphide compound for the grading interlayer in a high volume manufacturing environment is another important consideration and is closely related to issues of reactor maintenance, waste handling and personal safety. More particularly, in a high volume manufacturing environment the abatement differences between arsenide and phosphide based processes affect both cost and safety. The abatement of phosphorus is more time consuming, and hazardous than that required for arsenic. Each of these compounds builds up over time in the downstream gas flow portions of the MOVPE growth reactor. As such, periodic reactor maintenance for removal of these deposited materials is necessary to prevent adverse affects on the reactor flow dynamics, and thus the repeatability and uniformity of the epitaxial structures grown in the reactor. The difference in handling of these waste materials is significant. Arsenic as a compound is stable in air, non-flammable, and only represents a mild irritant upon skin contact. Phosphorus however, must be handled with considerably more care. Phosphorus is very flammable and produces toxic fumes upon burning and it is only moderately stable in air. Essentially the differences are manifest by the need for special handling and containment materials and procedures when handling phosphorus to prevent either combustion or toxic exposure to this material whereas using common personal protection equipment such as gloves, and a particle respirator easily accommodates the handling of arsenic.

Another consideration related to "ease of growth" that should be noted in connection with the advantages of a AlGaInAs based grading interlayer process compared to a AlGaInAsP compound derives from a frequently encountered issue when using an AlGaInAsP compound: the miscibility gap. A miscibility gap will occur if the enthalpy of mixing exceeds the entropy of mixing of two binary compounds AC and BC, where A, B and C are different elements. It is an established fact that the enthalpies of mixing of all ternary crystalline alloys of the form $A_xB_{1-x}C$, based upon the binary semiconductor forms AC and BC are positive leading to miscibility gaps in these compounds. See, for example, the discussion in reference [1] noted below. In this example, the letters A and B designate group III elements and letter C designates a group V element. As such, mixing of the binary compounds is said to occur on the group III sublattice. However, because OMVPE growth takes place under non-equilibrium conditions, the miscibility gap is not really a practical problem for accessing the entire ternary III-V semiconductor phase space. For the case of quaternary compounds of the form $A_xB_{1-x}C_yD_{1-y}$ where mixing of the

TABLE 1

Cost estimate of one mole of each of the AlGaInAs and GaInP grading layers

| Element | MW (gms) | $/gm | Cost/mole ($) | ME AlGaIn | Cost Molecular Mole of Al.17Ga.68In.15 | MF GaInP | Cost Molecular Mole of Ga.4In.6 |
|---|---|---|---|---|---|---|---|
| Al | 27 | 10.2 | 275.4 | 0.17 | 46.818 | 0 | 0 |
| Ga | 70 | 2.68 | 7.6 | 0.68 | 127.568 | 0.4 | 75.04 |
| In | 115 | 28.05 | 3225.75 | 0.15 | 483.8625 | 0.6 | 1935.45 |
|  |  |  |  | Approx OM Cost/mole= | 658.2485 |  | 2010.49 |

|  | Cost/ mole ($) | V/III ratio |  |  | Cost/mole of Arsenic |  | Cost/mole of phosphorus |
|---|---|---|---|---|---|---|---|
| AsH3 | $7.56 | 20 | $151.20 |  | $151.20 |  |  |
| PH3 | $9.49 | 120 | $1,138.80 |  |  |  | $1,138.54 |
|  |  |  |  | Approx cost/molecular mole= | $809.45 |  | $3,149.03 | binary alloys, AC, AD, BC, and BD occurs on both the group II and group V sublattices, the immiscibility problem is accentuated. Specifically for the GaP, InP, GaAs, InAs system, the region of immiscibility is quite large at growth temperatures appropriate for the OMVPE technique. See, for example, the discussion in reference [2] noted below. The resulting miscibility gap will prevent one from producing the requisite AlGaInAsP compounds needed for optical transparent grading of the IMM solar cell.

REFERENCES

[1] V. A. Elyukhin, E. L. Portnoi, E. A. Avrutin, and J. H. Marsh, J. Crystal Growth 173 (1997) pp 69-72.
[2] G. B. Stringfellow, Organometallic Vapor-Phase Epitaxy (Academic Press, New York 1989).

Figure 21:
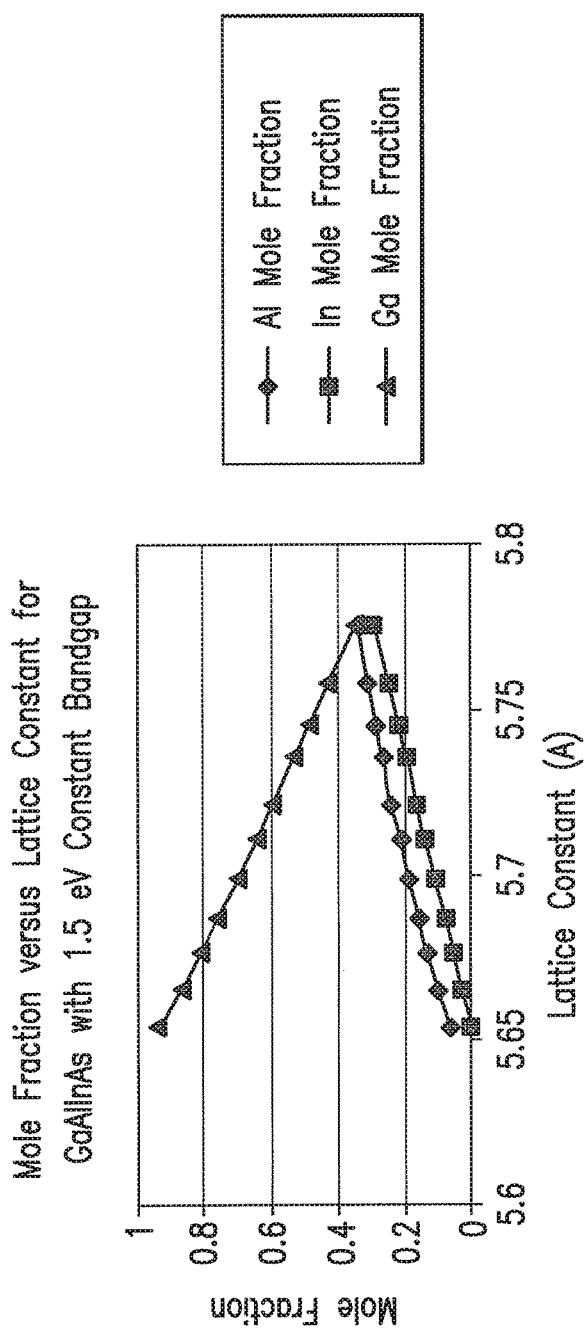
FIG. 21 is a graph representing the Al, Ga and In mole fractions versus the Al to In mole fraction in a AlGaInAs material system that is necessary to achieve a constant 1.5 eV band gap.
Figure 22:
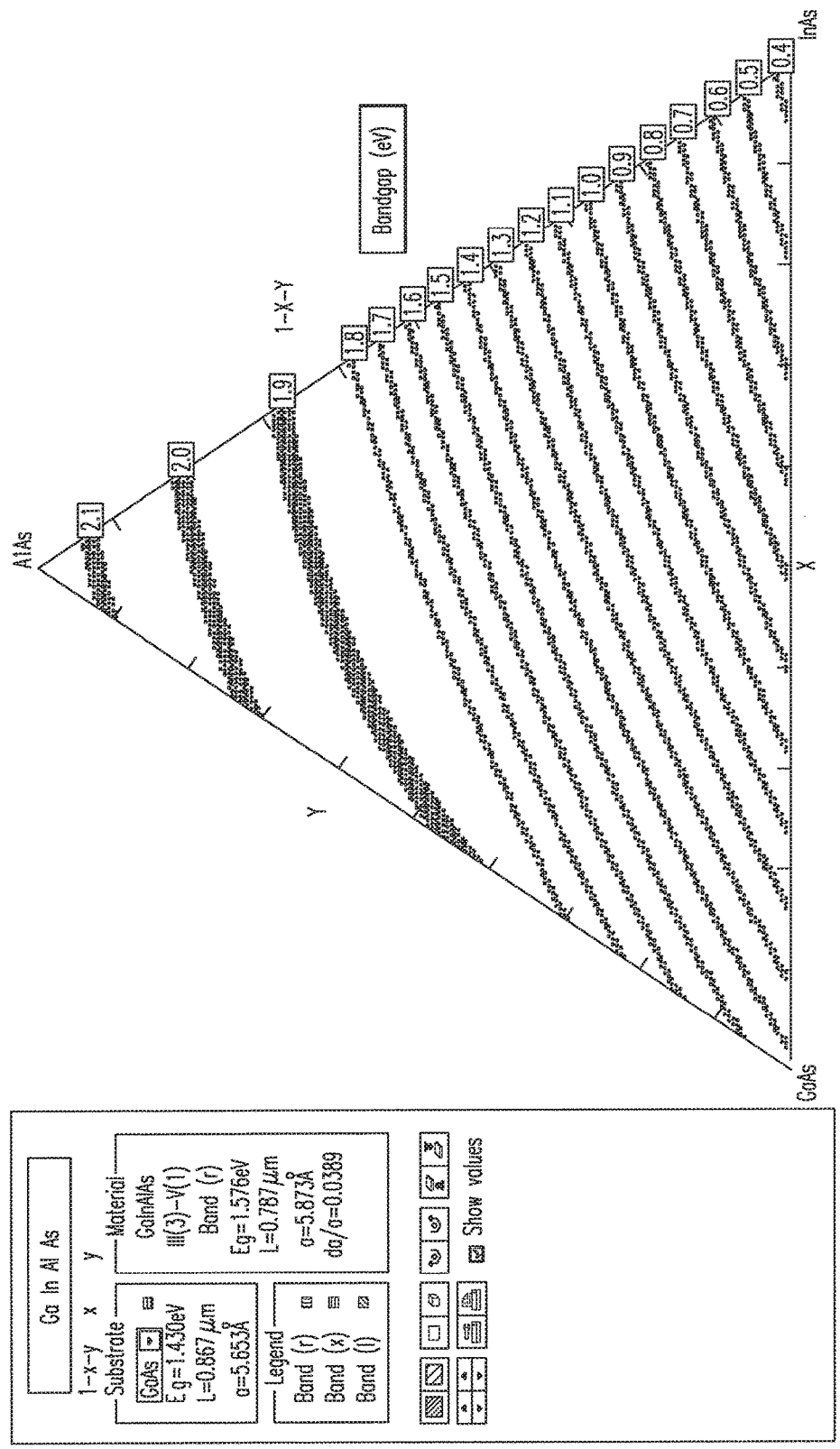
FIG. 22 is a diagram representing the relative concentration of Al, In, and Ga in an AlGaInAs material system needed to have a constant band gap with various designated values (ranging from 0.4 eV to 2.1 eV) as represented by curves on the diagram.

The fabrication of a step graded (or continuous graded) interlayer in an MOCVD process can be more explicitly described in a sequence of conceptual and operational steps which we describe here for pedagogical clarity. First, the appropriate band gap for the interlayer must be selected. In one of the disclosed embodiments, the desired constant band gap is 1.5 eV. Second, the most appropriate material system (i.e., the specific semiconductor elements to form a compound semiconductor alloy) must be identified. In the disclosed embodiment, these elements are Al, Ga, In, and As. Third, a computation must be made, for example using a computer program, to identify the class of compounds of $Al_y(Ga_x In_{1-x})_{1-y}As$ for specific x and y that have a band gap of 1.5 eV. An example of such a computer program output that provides a very rough indication of these compounds is illustrated in FIG. 22. Fourth, based upon the lattice constants of the epitaxial layers adjoining the graded interlayer, a specification of the required lattice constants for the top surface of the interlayer (to match the adjacent semiconductor layer), and the bottom surface of the interlayer (to match the adjacent semiconductor layer) must be made. Fifth, based on the required lattice constants, the compounds of $Al_y(Ga_x In_{1-x})_{1-y}As$ for specific x and y that have a band gap of 1.5 eV may be identified. Again, a computation must be made, and as an example, the data may be displayed in a graph such as FIG. 21 representing the Al, Ga and In mole fractions versus the Al to In mole fraction in a AlGaInAs material system that is necessary to achieve a constant 1.5 eV band gap. Assuming there is a small number (e.g. typically in the range of seven, eight, nine, ten, etc.) of steps or grades between the top surface and the bottom surface, and that the lattice constant difference between each step is made equal, the bold markings in FIG. 21 represent selected lattice constants for each successive sublayer in the interlayer, and the corresponding mole fraction of Al, Ga and In needed to achieve that lattice constant in that respective sublayer may be readily obtained by reference to the axes of the graph. Thus, based on an analysis of the data in FIG. 21, the reactor may be programmed to introduce the appropriate quantities of precursor gases (as determined by flow rates at certain timed intervals) into the reactor so as to achieve a desired specific $Al_y(Ga_x In_{1-x})_{1-y}As$ composition in that sublayer so that each successive sublayer maintains the constant band gap of 1.5 eV and a monotonically increasing lattice constant. The execution of this sequence of steps, with calculated and determinate precursor gas composition, flow rate, temperature, and reactor time to achieve the growth of a $Al_y(Ga_x In_{1-x})_{1-y}As$ composition of the interlayer with the desired properties (lattice constant change over thickness,  constant band gap over the entire thickness), in a repeatable, manufacturable process, is not to be minimized or trivialized.

Although one embodiment of the present disclosure utilizes a plurality of layers of AlGaInAs for the metamorphic layer 221 for reasons of manufacturability and radiation transparency, other embodiments of the present disclosure may utilize different material systems to achieve a change in lattice constant from subcell C to subcell D. Other embodiments of the present disclosure may utilize continuously graded, as opposed to step graded, materials. More generally, the graded interlayer may be composed of any of the As, N, Sb based III-V compound semiconductors subject to the constraints of having the in-plane lattice parameter greater or equal to that of the third solar cell and less than or equal to that of the fourth solar cell, and having a band gap energy greater than that of the third solar cell.

In one embodiment of the present disclosure, an optional second barrier layer 222 may be deposited over the AlGaInAs metamorphic layer 221. The second barrier layer 222 will typically have a different composition than that of barrier layer 220, and performs essentially the same function of preventing threading dislocations from propagating. In one embodiment, barrier layer 222 is n+ type GaInP.

A window layer 223 preferably composed of n+ type GaInP is then deposited over the second barrier layer, if there is one, disposed over layer 221. This window layer operates to reduce the recombination loss in the fourth subcell "D". It should be apparent to one skilled in the art that additional layers may be added or deleted in the cell structure without departing from the scope of the present invention.

On top of the window layer 223, the layers of cell D are deposited: the n+ emitter layer 224, and the p-type base layer 225. These layers are preferably composed of n+ type GaInAs and p type GaInAs respectively, although other suitable materials consistent with lattice constant and band gap requirements may be used as well. The doping profile of layers 224 and 225 will be discussed in connection with FIG. 20B.

A BSF layer 226, preferably composed of p+ type AlGaInAs, is then deposited on top of the cell D, the BSF layer performing the same function as the BSF layers 208, 213 and 218.

The p++/n++ tunnel diode layers 227a and 227b respectively are deposited over the BSF layer 226, similar to the layers 214a/214b and 219a/219b, forming an ohmic circuit element to connect subcell D to subcell E. The layer 227a is preferably composed of p++ AlGaInAs, and layer 227b is preferably composed of n++ GaInP.

In some embodiments a barrier layer 228, preferably composed of n-type GaInP, is deposited over the tunnel diode 227a/227b, to a thickness of about 0.5 micron. Such barrier layer is intended to prevent threading dislocations from propagating, either opposite to the direction of growth into the middle subcells B, C and D, or in the direction of growth into the subcell E, and is more particularly described in copending U.S. patent application Ser. No. 11/860,183, filed Sep. 24, 2007.

A second metamorphic layer (or graded interlayer) 229 is deposited over the barrier layer 228. Layer 229 is preferably a compositionally step-graded series of AlGaInAs layers, preferably with monotonically changing lattice constant, so as to achieve a gradual transition in lattice constant in the semiconductor structure from subcell D to subcell E while minimizing threading dislocations from occurring. In some embodiments the band gap of layer 229 is constant throughout its thickness, preferably approximately equal to 1.1 eV, or otherwise consistent with a value slightly greater than the band gap of the middle subcell D. One embodiment of the graded interlayer may also be expressed as being composed of $(In_xGa_{1-x})_y Al_{1-y}As$, with x and y selected such that the band gap of the interlayer remains constant at approximately 1.1 eV or other appropriate band gap.

In one embodiment of the present disclosure, an optional second barrier layer 230 may be deposited over the AlGaInAs metamorphic layer 229. The second barrier layer 230 performs essentially the same function as the first barrier layer 228 of preventing threading dislocations from propagating. In one embodiment, barrier layer 230 has not the same composition than that of barrier layer 228, i.e. n+ type GaInP.

A window layer 231 preferably composed of n+ type GaInP is then deposited over the barrier layer 230. This window layer operates to reduce the recombination loss in the fifth subcell "E". It should be apparent to one skilled in the art that additional layers may be added or deleted in the cell structure without departing from the scope of the present invention.

On top of the window layer 231, the layers of cell E are deposited: the n+ emitter layer 232, and the p-type base layer 233. These layers are preferably composed of n+ type GaInAs and p type GaInAs respectively, although other suitable materials consistent with lattice constant and band gap requirements may be used as well. The doping profile of layers 232 and 233 will be discussed in connection with FIG. 20B.

A BSF layer 234, preferably composed of p+ type AlGaInAs, is then deposited on top of the cell E, the BSF layer performing the same function as the BSF layers 208, 213, 218, and 226.

Finally a high band gap contact layer 235, preferably composed of p++ type AlGaInAs, is deposited on the BSF layer 234.

The composition of this contact layer 235 located at the bottom (non-illuminated) side of the lowest band gap photovoltaic cell (i.e., subcell "E" in the depicted embodiment) in a multijunction photovoltaic cell, can be formulated to reduce absorption of the light that passes through the cell, so that (i) the backside ohmic metal contact layer below it (on the non-illuminated side) will also act as a mirror layer, and (ii) the contact layer doesn't have to be selectively etched off, to prevent absorption.

It should be apparent to one skilled in the art, that additional layer(s) may be added or deleted in the cell structure without departing from the scope of the present invention.

The subsequent remaining steps in the fabrication of the multijunction solar cell according to the illustrated embodiment, including the deposition of metallization over the contact layer, and the attachment of a surrogate substrate, will be discussed and depicted at a later point in connection with FIG. 7 and subsequent Figures.

Five Junction Solar Cell with Three Metamorphic Layers

FIG. 3C is a cross-sectional view of the solar cell of FIG. 3A in an embodiment of a five junction solar cell with three metamorphic layers. The layers 201 through 214b of this embodiment are substantially identical to those discussed in connection with the embodiment of FIG. 3A, and therefore in the interest of brevity of this disclosure, the description of such layers will not be repeated here.

As depicted in FIG. 3C, the embodiment of a five junction solar cell with three metamorphic layers, a sequence of layers 250 through 273 are grown on top of the tunnel diode layers 214a and 214b of the structure of FIG. 3A.

In some embodiments a barrier layer 250, composed of n-type (Al)GaInP, is deposited over the tunnel diode 214a/214b, to a thickness of about 1.0 micron. Such barrier layer is intended to prevent threading dislocations from propagating, either opposite to the direction of growth into the subcells A and B, or in the direction of growth into the middle subcells C and D, and is more particularly described in copending U.S. patent application Ser. No. 11/860,183, filed Sep. 24, 2007.

A first metamorphic layer (or graded interlayer) 251 is deposited over the barrier layer 250. Layer 251 is preferably a compositionally step-graded series of AlGaInAs layers, preferably with monotonically changing lattice constant, so as to achieve a gradual transition in lattice constant in the semiconductor structure from subcell B to subcell C while minimizing threading dislocations from occurring. Stated another way, the layer 251 has a lattice constant on one surface adjacent to subcell B which matches that of subcell B, and a lattice constant on the opposing surface adjacent to subcell C which matches that of subcell C, and a gradation in lattice constant throughout its thickness. In some embodiments, the band gap of layer 251 is constant throughout its thickness, preferably approximately equal to 1.5 eV, or otherwise consistent with a value slightly greater than the band gap of the middle subcell B. One embodiment of the graded interlayer may also be expressed as being composed of $(In_xGa_{1-x})_y Al_{1-y}As$, with x and y selected such that the band gap of the interlayer remains constant at approximately 1.50 eV or other appropriate band gap.

In the inverted metamorphic structure described in the Wanlass et al. paper cited above, the metamorphic layer consists of nine compositionally graded GaInP steps, with each step layer having a thickness of 0.25 micron. As a result, each layer of Wanlass et al. has a different band gap. In one embodiment of the present disclosure, the layer 251 is composed of a plurality of layers of AlGaInAs, with monotonically changing lattice constant, each layer having the same band gap, approximately 1.5 eV.

The advantage of utilizing a constant band gap material such as AlGaInAs is that arsenide-based semiconductor material is much easier to process from a manufacturing standpoint in standard commercial MOCVD reactors than materials incorporating phosphorus, while the small amount of aluminum in the band gap material assures radiation transparency of the metamorphic layers.

Although one embodiment of the present disclosure utilizes a plurality of layers of AlGaInAs for the metamorphic layer 251 for reasons of manufacturability and radiation transparency, other embodiments of the present disclosure may utilize different material systems to achieve a change in lattice constant from subcell B to subcell C. Other embodiments of the present disclosure may utilize continuously graded, as opposed to step graded, materials. More generally, the graded interlayer may be composed of any of the As, N, Sb based III-V compound semiconductors subject to the constraints of having the in-plane lattice parameter greater or equal to that of the second solar subcell and less than or equal to that of the third solar subcellcell, and having a band gap energy greater than that of the third solar cell.

In one embodiment of the present disclosure, an optional second barrier layer 252 may be deposited over the AlGaInAs metamorphic layer 251. The second barrier layer 252 will typically have a different composition than that of barrier layer 250, and performs essentially the same function of preventing threading dislocations from propagating. In one embodiment, barrier layer 252 is n+ type GaInP.

A window layer 253 composed of n+ type GaInP is then deposited over the barrier layer 253. This window layer operates to reduce the recombination loss in the third subcell "C". It should be apparent to one skilled in the art that additional layers may be added or deleted in the cell structure without departing from the scope of the present invention.

On top of the window layer 253, the layers of cell C are deposited: the n+ emitter layer 254, and the p-type base layer 255. These layers are preferably composed of n+ type GaInAs and p type GaInAs respectively, although other suitable materials consistent with lattice constant and band gap requirements may be used as well. The doping profile of layers 254 and 255 will be discussed in connection with FIG. 20B.

A BSF layer 256, preferably composed of p+ type AlGaInAs, is then deposited on top of the cell C, the BSF layer performing the same function as the BSF layers 208, and 213.

The p++/n++ tunnel diode layers 257a and 257b respectively are deposited over the BSF layer 256, similar to the layers 209a/209b and 214a/214b, forming an ohmic circuit element to connect subcell C to subcell D. The layer 257a is preferably composed of p++ AlGaInAs, and layer 257b is preferably composed of n++ AlGaInAs.

In some embodiments a barrier layer 258, may be composed of n-type GaInP, is deposited over the tunnel diode 257a/257b, to a thickness of about 0.5 micron. Such barrier layer is intended to prevent threading dislocations from propagating, either opposite to the direction of growth into the middle subcells B and C, or in the direction of growth into the subcell D, and is more particularly described in copending U.S. patent application Ser. No. 11/860,183, filed Sep. 24, 2007.

A second metamorphic layer (or graded interlayer) 259 is deposited over the barrier layer 258. Layer 259 may be a compositionally step-graded series of AlGaInAs layers, preferably with monotonically changing lattice constant, so as to achieve a gradual transition in lattice constant in the semiconductor structure from subcell C to subcell D while minimizing threading dislocations from occurring. In some embodiments the band gap of layer 259 is constant throughout its thickness, preferably approximately equal to 1.1 eV, or otherwise consistent with a value slightly greater than the band gap of the middle subcell C. One embodiment of the graded interlayer may also be expressed as being composed of $(In_xGa_{1-x})_y Al_{1-y}As$, with x and y selected such that the band gap of the interlayer remains constant at approximately 1.1 eV or other appropriate band gap.

In one embodiment of the present disclosure, an optional second barrier layer 260 may be deposited over the AlGaInAs metamorphic layer 259. The second barrier layer will typically have a different composition than that of barrier layer 258, and performs essentially the same function of preventing threading dislocations from propagating.

A window layer 261 composed of n+ type GaInP is then deposited over the barrier layer 260. This window layer operates to reduce the recombination loss in the subcell "D". It should be apparent to one skilled in the art that additional layers may be added or deleted in the cell structure without departing from the scope of the present invention.

On top of the window layer 260, the layers of cell D are deposited: the n+ emitter layer 262, and the p-type base layer 263. These layers are illustrated as being composed of n+ type GaInAs and p type GaInAs respectively, although other suitable materials consistent with lattice constant and band gap requirements may be used as well. The doping profile of layers 260 and 261 will be discussed in connection with FIG. 20B.

A BSF layer 264, may be composed of p+ type AlGaInAs, is then deposited on top of the cell D, the BSF layer performing the same function as the BSF layers 208, 213, and 256.

The p++/n++ tunnel diode layers 265a and 265b respectively are deposited over the BSF layer 264, similar to the layers 209a/209b, 214a/214b, and 257a/257b, forming an ohmic circuit element to connect subcell D to subcell E. The layer 265a may be composed of p++ AlGaInAs, and layer 265b may be composed of n++ AlGaInAs.

In some embodiments a barrier layer 266, may be composed of n-type GaInP, is deposited over the tunnel diode 265a/265b, to a thickness of about 0.5 micron. Such barrier layer is intended to prevent threading dislocations from propagating, either opposite to the direction of growth into the middle subcells B, C and D, or in the direction of growth into the subcell E, and is more particularly described in copending U.S. patent application Ser. No. 11/860,183, filed Sep. 24, 2007.

A third metamorphic layer (or graded interlayer) 267 is deposited over the barrier layer 266. Layer 267 may be a compositionally step-graded series of AlGaInAs layers, preferably with monotonically changing lattice constant, so as to achieve a gradual transition in lattice constant in the semiconductor structure from subcell D to subcell E while minimizing threading dislocations from occurring. In some embodiments the band gap of layer 267 is constant throughout its thickness, preferably approximately equal to 1.1 eV, or otherwise consistent with a value slightly greater than the band gap of the middle subcell D. One embodiment of the graded interlayer may also be expressed as being composed of $(In_xGa_{1-x})_y Al_{1-y}As$, with x and y selected such that the band gap of the interlayer remains constant at approximately 1.1 eV or other appropriate band gap.

In one embodiment of the present disclosure, an optional second barrier layer 268 may be deposited over the AlGaInAs metamorphic layer 267. The second barrier layer is a different alloy than that of barrier layer 266, and performs essentially the same function of preventing threading dislocations from propagating.

A window layer 269 preferably composed of n+ type AlGaInAs is then deposited over the second barrier layer 268, if there is one disposed over layer 267, or directly over third metamorphic layer 267. This window layer operates to reduce the recombination loss in the fifth subcell "E". It should be apparent to one skilled in the art that additional layers may be added or deleted in the cell structure without departing from the scope of the present invention.

On top of the window layer 269, the layers of cell E are deposited: the n+ emitter layer 270, and the p-type base layer 271. These layers are preferably composed of n+ type GaInAs and p type GaInAs respectively, although other suitable materials consistent with lattice constant and band gap requirements may be used as well. The doping profile of layers 270 and 271 will be discussed in connection with FIG. 20B.

A BSF layer 272, preferably composed of p+ type AlGaInAs, is then deposited on top of the cell E, the BSF layer performing the same function as the BSF layers 208, 213, 256, and 264.

Finally a high band gap contact layer 273, preferably composed of p++ type AlGaInAs, is deposited on the BSF layer 272.

The composition of this contact layer 273 located at the bottom (non-illuminated) side of the lowest band gap photovoltaic cell (i.e., subcell "E" in the depicted embodiment) in a multijunction photovoltaic cell, can be formulated to reduce absorption of the light that passes through the cell, so that (i) the backside ohmic metal contact layer below it (on the non-illuminated side) will also act as a mirror layer, and (ii) the contact layer doesn't have to be selectively etched off to prevent absorption.

It should be apparent to one skilled in the art, that additional layer(s) may be added or deleted in the cell structure without departing from the scope of the present invention.

The subsequent remaining steps in the fabrication of the multijunction solar cell according to the illustrated embodiment, including the deposition of metallization over the contact layer, and the attachment of a surrogate substrate, will be discussed and depicted at a later point in connection with FIG. 7 and subsequent Figures.

Six Junction Solar Cell with Three Metamorphic Layers

FIG. 4 depicts a multijunction solar cell in an embodiment according to the present disclosure in which a six junction solar cell with three metamorphic buffer layers is fabricated.

In particular, FIG. 4 depicts the sequential formation of the six subcells A, B, C, D, E and F on a GaAs growth substrate. The sequence of layers 302 through 314b that are grown on the growth substrate are similar to layers 102 to 122b discussed in connection with FIG. 3A, but the description of such layers with new reference numbers will be repeated here for clarity of the presentation.

More particularly, there is shown a substrate 301, which is preferably gallium arsenide (GaAs), but may also be germanium (Ge) or other suitable material. For GaAs, the substrate is preferably a 15° off-cut substrate, that is to say, its surface is orientated 15° off the (100) plane towards the (111) A plane, as more fully described in U.S. patent application Ser. No. 12/047,944, filed Mar. 13, 2008.

In the case of a Ge substrate, a nucleation layer (not shown) is deposited directly on the substrate 301. On the substrate, or over the nucleation layer (in the case of a Ge substrate), a buffer layer 302 and an etch stop layer 303 are further deposited. In the case of GaAs substrate, the buffer layer 302 is preferably GaAs. In the case of Ge substrate, the buffer layer 302 is preferably GaInAs. A contact layer 304 of GaAs is then deposited on layer 303, and a window layer 305 of AlInP is deposited on the contact layer. The subcell A, which will be the upper first solar subcell of the structure, consisting of an n+ emitter layer 306a and 306b and a p-type base layer 307, is then epitaxially deposited on the window layer 305. The subcell A is generally lattice matched to the growth substrate 301.

It should be noted that the multijunction solar cell structure could be formed by any suitable combination of group III to V elements listed in the periodic table subject to lattice constant and band gap requirements, wherein the group III includes boron (B), aluminum (Al), gallium (Ga), indium (In), and thallium (T). The group IV includes carbon (C), silicon (Si), germanium (Ge), and tin (Sn). The group V includes nitrogen (N), phosphorus (P), arsenic (As), antimony (Sb), and bismuth (Bi).

In one embodiment, the emitter layer is composed of AlGaInP and the base layer 307 is composed of AlGaInP, and thus the p/n junction of this subcell is a homojunction. More particularly, the emitter layer is composed of two regions: an n+ type emitter region 306a directly grown on the window layer 305, and an n type emitter region 306b directly grown on the emitter region 306a. The doping profile of the different emitter regions 306a and 306b, and base layer 307 according to the present disclosure will be discussed in conjunction with FIG. 20A.

In some embodiments, a spacer layer 306c composed of unintentionally doped AlGaInP is then grown directly on top of the n type emitter region 306b.

The base layer 307 is composed of AlGaInP is grown over the spacer layer 306c.

In some embodiments, the band gap of the base layer 307 is 1.92 eV or greater.

In some embodiments, the band gap of the base of the upper first solar subcell is equal to or greater than 2.05 eV.

In some embodiments, the emitter of the upper first solar subcell is composed of a first region in which the doping is graded from $3\times10^{18}$ to $1\times10^{18}$ free carriers per cubic centimeter, and a second region directly disposed over the first region in which the doping is constant at $1\times10^{17}$ free carriers per cubic centimeter.

In some embodiments, the first region of the emitter of the upper first solar subcell is directly adjacent to a window layer.

In some embodiments, the emitter of the upper first solar subcell has a thickness of 80 nm.

In some embodiments, the base of the upper first solar subcell has a thickness of less than 400 nm.

In some embodiments, the base of the upper first solar subcell has a thickness of 260 nm.

In some embodiments, the emitter section of the upper first solar subcell has a first region in which the doping is graded, and a second region directly disposed over the first region in which the doping is constant.

Subcell A will ultimately become the "top" subcell of the inverted metamorphic structure after completion of the process steps according to the present invention to be described hereinafter.

On top of the base layer 307 a back surface field ("BSF") layer 308 preferably p+ AlInP is deposited and used to reduce recombination loss.

The BSF layer 308 drives minority carriers from the region near the base/BSF interface surface to minimize the effect of recombination loss. In other words, the BSF layer 308 reduces recombination loss at the backside of the solar subcell A and thereby reduces the recombination in the base.

On top of the BSF layer 308 a sequence of heavily doped p-type and n-type layers 309a and 309b is deposited that forms a tunnel diode, i.e. an ohmic circuit element that forms an electrical connection between subcell A to subcell B. Layer 309a may be composed of p++ AlGaAs, and layer 309b may be composed of n++ GaInP.

On top of the tunnel diode layers 309 a window layer 310 is deposited, which may be n+ AlInP. The window layer 310 used in the subcell B also operates to reduce the interface recombination loss. It should be apparent to one skilled in the art, that additional layer(s) may be added or deleted in the cell structure without departing from the scope of the present disclosure.

On top of the window layer 310 the layers of subcell B are deposited: the n+ type emitter layer 311 and the p-type base layer 312. These layers are preferably composed of AlGaAs and AlGaAs respectively, although any other suitable materials consistent with lattice constant and band gap requirements may be used as well. Thus, subcell B may be composed of a GaAs, GaInP, GaInAs, GaAsSb, or GaInAsN emitter region and a GaAs, GaInAs, GaAsSb, or GaInAsN base region. The doping profile of layers 311 and 312 according to the present disclosure will be discussed in conjunction with FIG. 20B.

On top of the cell B is deposited a BSF layer 313 which performs the same function as the BSF layer 308. The p++/n++ tunnel diode layers 314a and 314b respectively are deposited over the BSF layer 308, similar to the layers 309a and 309b, forming an ohmic circuit element to connect subcell B to subcell C. The layer 314a may be composed of p++ AlGaAs, and layer 314b may be composed of n++ GaInP.

A window layer 315 preferably composed of n+ type GaInP is then deposited over the tunnel diode layers 314a/314b. This window layer operates to reduce the recombination loss in subcell "C". It should be apparent to one skilled in the art that additional layers may be added or deleted in the cell structure without departing from the scope of the present disclosure.

On top of the window layer 315, the layers of subcell C are deposited: the n+ emitter layer 316, and the p-type base layer 317. These layers are preferably composed of n+ type GaInP and p type GaAs respectively, although other suitable materials consistent with lattice constant and band gap requirements may be used as well. The doping profile of layers 316 and 317 will be discussed in connection with FIG. 20B.

A BSF layer 318, preferably composed of AlGaAs, is then deposited on top of the cell C, the BSF layer performing the same function as the BSF layers 308 and 313.

The p++/n++ tunnel diode layers 319a and 319b respectively are deposited over the BSF layer 318, similar to the layers 314a and 314b, forming an ohmic circuit element to connect subcell C to subcell D. The layer 319a is preferably composed of p++ AlGaAs, and layer 319b may be composed of n++ GaAs.

In some embodiments a barrier layer 320, preferably composed of n-type GaInP, is deposited over the tunnel diode 319a/319b, to a thickness of about 0.5 micron. Such barrier layer is intended to prevent threading dislocations from propagating, either opposite to the direction of growth into the top and middle subcells A, B and C, or in the direction of growth into the subcell D, and is more particularly described in copending U.S. patent application Ser. No. 11/860,183, filed Sep. 24, 2007.

A first metamorphic layer (or graded interlayer) 321 is deposited over the barrier layer 320. Layer 321 is preferably a compositionally step-graded series of AlGaInAs layers, preferably with monotonically changing lattice constant, so as to achieve a gradual transition in lattice constant in the semiconductor structure from subcell C to subcell D while minimizing threading dislocations from occurring. In some embodiments the band gap of layer 321 is constant throughout its thickness, preferably approximately equal to 1.5 eV, or otherwise consistent with a value slightly greater than the band gap of the middle subcell C. One embodiment of the graded interlayer may also be expressed as being composed of $(In_xGa_{1-x})_y Al_{1-y}As$, with x and y selected such that the band gap of the interlayer remains constant at approximately 1.5 eV or other appropriate band gap.

In one embodiment of the present disclosure, an optional second barrier layer 322 may be deposited over the AlGaInAs metamorphic layer 321. The second barrier layer 322 will typically have a different composition than that of barrier layer 320, and performs essentially the same function of preventing threading dislocations from propagating. In one embodiment, barrier layer 322 is n+ type GaInP.

A window layer 323 preferably composed of n+ type GaInP is then deposited over the second barrier layer, if there is one, disposed over layer 322. This window layer operates to reduce the recombination loss in the fourth subcell "D". It should be apparent to one skilled in the art that additional layers may be added or deleted in the cell structure without departing from the scope of the present invention.

On top of the window layer 323, the layers of cell D are deposited: the n+ emitter layer 324, and the p-type base layer 325. These layers are preferably composed of n+ type GaInAs and p type GaInAs respectively, although other suitable materials consistent with lattice constant and band gap requirements may be used as well. The doping profile of layers 324 and 325 will be discussed in connection with FIG. 20B.

A BSF layer 326, preferably composed of p+ type AlGaInAs, is then deposited on top of the cell D, the BSF layer performing the same function as the BSF layers 308, 313, and 318.

The p++/n++ tunnel diode layers 327a and 327b respectively are deposited over the BSF layer 326, similar to the layers 309a/309b, and 319a/319b, forming an ohmic circuit element to connect subcell D to subcell E. The layer 327a is preferably composed of p++ AlGaInAs, and layer 327b is preferably composed of n++ GaInP.

In some embodiments a barrier layer 328, preferably composed of n-type GaInP, is deposited over the tunnel diode 327a/327b, to a thickness of about 0.5 micron. Such barrier layer is intended to prevent threading dislocations from propagating, either opposite to the direction of growth into the middle subcells B, C and D, or in the direction of growth into the subcell E, and is more particularly described in copending U.S. patent application Ser. No. 11/860,183, filed Sep. 24, 2007.

A second metamorphic layer (or graded interlayer) 329 is deposited over the barrier layer 328. Layer 329 is preferably a compositionally step-graded series of AlGaInAs layers, preferably with monotonically changing lattice constant, so as to achieve a gradual transition in lattice constant in the semiconductor structure from subcell D to subcell E while minimizing threading dislocations from occurring. In some embodiments the band gap of layer 329 is constant throughout its thickness, preferably approximately equal to 1.5 eV, or otherwise consistent with a value slightly greater than the band gap of the middle subcell D. One embodiment of the graded interlayer may also be expressed as being composed of $(In_xGa_{1-x})_y Al_{1-y}As$, with x and y selected such that the band gap of the interlayer remains constant at approximately 1.5 eV or other appropriate band gap.

In one embodiment of the present disclosure, an optional second barrier layer 330 may be deposited over the AlGaInAs metamorphic layer 329. The second barrier layer will typically have a different composition than that of barrier layer 328, and performs essentially the same function of preventing threading dislocations from propagating.

A window layer 331 preferably composed of n+ type GaInP is then deposited over the second barrier layer 330, if there is one disposed over layer 329, or directly over second metamorphic layer 329. This window layer operates to reduce the recombination loss in the fifth subcell "E". It should be apparent to one skilled in the art that additional layers may be added or deleted in the cell structure without departing from the scope of the present invention.

On top of the window layer 331, the layers of cell E are deposited: the n+ emitter layer 332, and the p-type base layer 333. These layers are preferably composed of n+ type GaInAs and p type GaInAs respectively, although other suitable materials consistent with lattice constant and band gap requirements may be used as well. The doping profile of layers 332 and 333 will be discussed in connection with FIG. 20B.

A BSF layer 334, preferably composed of p+ type AlGaInAs, is then deposited on top of the cell D, the BSF layer performing the same function as the BSF layers 308, 313, 318, and 326.

The p++/n++ tunnel diode layers 335a and 335b respectively are deposited over the BSF layer 334, similar to the layers 309a/309b, and 319a/319b, forming an ohmic circuit element to connect subcell E to subcell F. The layer 335a is preferably composed of p++ AlGaInAs, and layer 335b is preferably composed of n++ GaInP.

In some embodiments a barrier layer 336, preferably composed of n-type GaInP, is deposited over the tunnel diode 335a/335b, to a thickness of about 0.5 micron. Such barrier layer is intended to prevent threading dislocations from propagating, either opposite to the direction of growth into the middle subcells D and E, or in the direction of growth into the subcell F, and is more particularly described in copending U.S. patent application Ser. No. 11/860,183, filed Sep. 24, 2007.

A third metamorphic layer (or graded interlayer) 337 is deposited over the barrier layer 336. Layer 337 is preferably a compositionally step-graded series of AlGaInAs layers, preferably with monotonically changing lattice constant, so as to achieve a gradual transition in lattice constant in the semiconductor structure from subcell D to subcell E while minimizing threading dislocations from occurring. In some embodiments the band gap of layer 258 is constant throughout its thickness, preferably approximately equal to 1.1 eV, or otherwise consistent with a value slightly greater than the band gap of the middle subcell D. One embodiment of the graded interlayer may also be expressed as being composed of $(In_xGa_{1-x})_yAl_{1-y}As$, with x and y selected such that the band gap of the interlayer remains constant at approximately 1.1 eV or other appropriate band gap.

In one embodiment of the present disclosure, an optional second barrier layer (not shown) may be deposited over the AlGaInAs metamorphic layer 337. The second barrier layer will typically be a different alloy than that of barrier layer 336, and performs essentially the same function of preventing threading dislocations from propagating.

A window layer 338 preferably composed of n+ type AlGaInAs is then deposited over the second barrier layer, if there is one disposed over layer 337, or directly over second metamorphic layer 337. This window layer operates to reduce the recombination loss in the sixth subcell "F". It should be apparent to one skilled in the art that additional layers may be added or deleted in the cell structure without departing from the scope of the present invention.

On top of the window layer 338, the layers of cell F are deposited: the n+ emitter layer 339, and the p-type base layer 340. These layers are preferably composed of n+ type GaInAs and p type GaInAs respectively, although other suitable materials consistent with lattice constant and band gap requirements may be used as well. The doping profile of layers 339 and 340 will be discussed in connection with FIG. 20B.

A BSF layer 341, preferably composed of p+ type AlGaInAs, is then deposited on top of the cell F, the BSF layer performing the same function as the BSF layers 308, 313, 326, and 334.

Finally a high band gap contact layer 342, preferably composed of p++ type AlGaInAs, is deposited on the BSF layer 341.

The composition of this contact layer 342 located at the bottom (non-illuminated) side of the lowest band gap photovoltaic cell (i.e., subcell "F" in the depicted embodiment) in a multijunction photovoltaic cell, can be formulated to reduce absorption of the light that passes through the cell, so that (i) the backside ohmic metal contact layer below it (on the non-illuminated side) will also act as a mirror layer, and (ii) the contact layer doesn't have to be selectively etched off, to prevent absorption.

It should be apparent to one skilled in the art, that additional layer(s) may be added or deleted in the cell structure without departing from the scope of the present invention.

The subsequent remaining steps in the fabrication of the multijunction solar cell according to the illustrated embodiment, including the deposition of metallization over the contact layer, and the attachment of a surrogate substrate, will be discussed and depicted at a later point in connection with FIG. 7 and subsequent Figures.

Five Junction Solar Cell with One Metamorphic Layer

Figure 5:
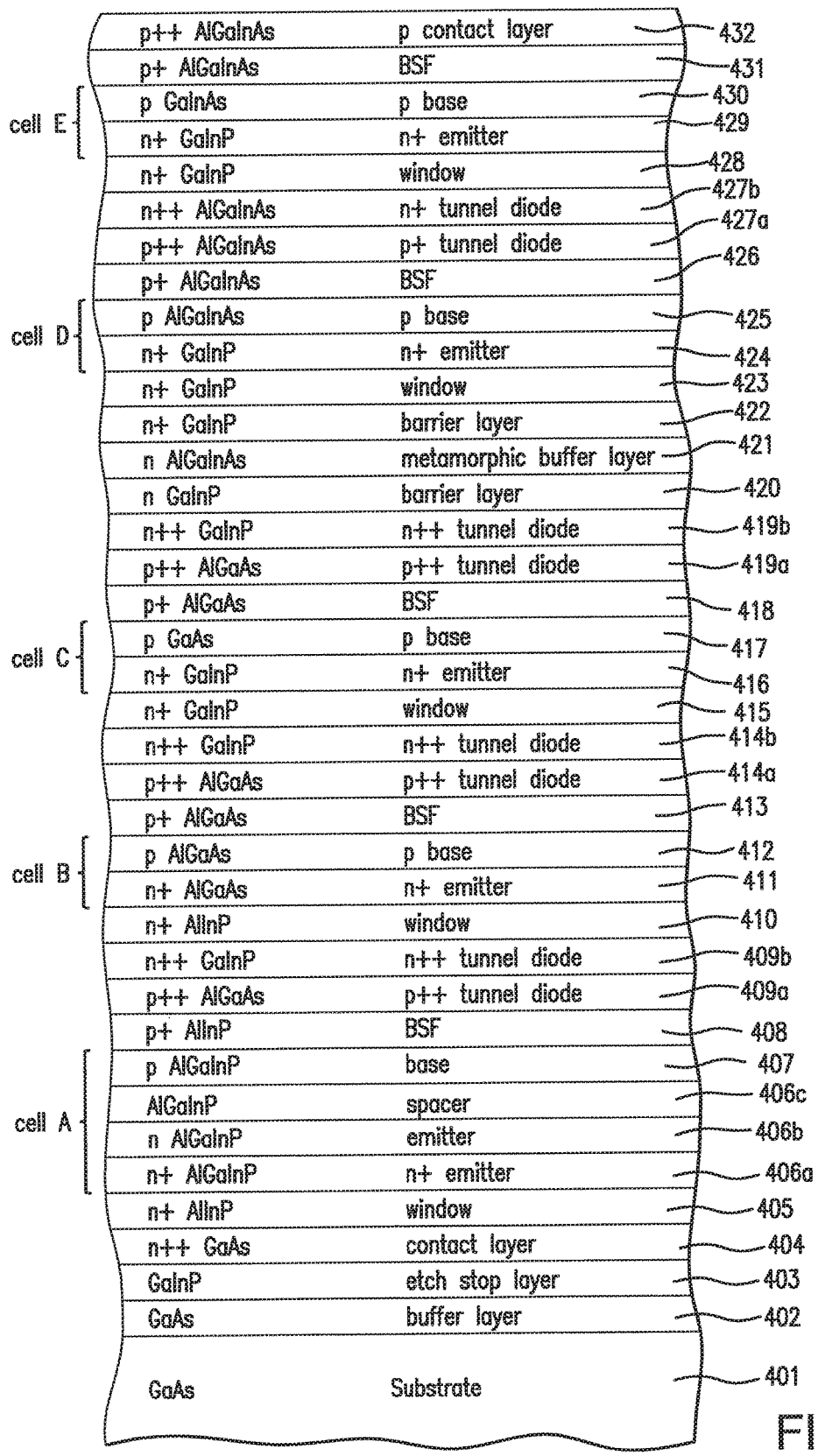
FIG. 5 is a cross-sectional view of a solar cell of another embodiment of the present disclosure representing a five junction solar cell utilizing one metamorphic layer after an initial stage of fabrication including the deposition of certain semiconductor layers on the growth substrate.

FIG. 5 depicts a multijunction solar cell in an embodiment according to the present disclosure in which a five junction solar cell with one metamorphic buffer layer is fabricated.

FIG. 5 depicts the sequential formation of the five subcells A, B, C, D, and E on a GaAs growth substrate. The layers 401 through 423 of this embodiment are substantially identical to layers 201 through 223 discussed in connection with the embodiment of FIG. 3B, and therefore in the interest of brevity of this disclosure, the description of such layers will not be repeated here.

On top of the window layer 423, the layers of cell D are deposited: the n+ emitter layer 424, and the p-type base layer 425. These layers are preferably composed of n+ type GaInP and p type AlGaInAs respectively, although other suitable materials consistent with lattice constant and band gap requirements may be used as well. The doping profile of layers 424 and 425 will be discussed in connection with FIG. 20B.

A BSF layer 426, preferably composed of p+ type AlGaInAs, is then deposited on top of the cell D, the BSF layer performing the same function as the BSF layers 408, 413 and 418.

The p++/n++ tunnel diode layers 427a and 427b respectively are deposited over the BSF layer 426, similar to the layers 414a/414b and 419a/419b, forming an ohmic circuit element to connect subcell D to subcell E. The layer 427a is composed of p++ AlGaInAs, and layer 427b is composed of n++ AlGaInAs.

A window layer 428 preferably composed of n+ type GaInP is then deposited over the tunnel diode layers 427a and 427b. This window layer operates to reduce the recombination loss in the fifth subcell "E". It should be apparent to one skilled in the art that additional layers may be added or deleted in the cell structure without departing from the scope of the present invention.

On top of the window layer 428, the layers of cell E are deposited: the n+ emitter layer 429, and the p-type base layer 430. These layers are preferably composed of n+ type GaInP and p type GaInAs respectively, although other suitable materials consistent with lattice constant and band gap requirements may be used as well. The doping profile of layers 429 and 430 will be discussed in connection with FIG. 20B.

A BSF layer 431, preferably composed of p+ type AlGaInAs, is then deposited on top of the cell E, the BSF layer performing the same function as the BSF layers 408, 413, 418, and 426.

Finally a high band gap contact layer 432, preferably composed of p++ type AlGaInAs, is deposited on the BSF layer 431.

The composition of this contact layer 432 located at the bottom (non-illuminated) side of the lowest band gap photovoltaic cell (i.e., subcell "E" in the depicted embodiment) in a multijunction photovoltaic cell, can be formulated to reduce absorption of the light that passes through the cell, so that (i) the backside ohmic metal contact layer below it (on the non-illuminated side) will also act as a mirror layer, and (ii) the contact layer doesn't have to be selectively etched off, to prevent absorption.

It should be apparent to one skilled in the art, that additional layer(s) may be added or deleted in the cell structure without departing from the scope of the present invention.

The subsequent remaining steps in the fabrication of the multijunction solar cell according to the illustrated embodiment, including the deposition of metallization over the contact layer, and the attachment of a surrogate substrate, will be discussed and depicted at a later point in connection with FIG. 7 and subsequent Figures.

Six Junction Solar Cell with Two Metamorphic Layers

FIG. 6 depicts the sequence of steps in forming a multijunction solar cell in an embodiment according to the present disclosure in which a six junction solar cell with two metamorphic buffer layers is fabricated.

FIG. 6 depicts the sequential formation of the six subcells A, B, C, D, E and F on a GaAs growth substrate. The layers 501 through 527b of this embodiment are substantially identical to layers 301 through 327b discussed in connection with the embodiment of FIG. 4, and layers 528 through 539 of this embodiment are substantially identical to layers 331 through 342 discussed in connection with the embodiment of FIG. 4, and therefore in the interest of brevity of this disclosure, the description of such layers will not be repeated here.

It should be apparent to one skilled in the art, that additional layer(s) may be added or deleted in the cell structure without departing from the scope of the present invention.

The subsequent remaining steps in the fabrication of the multijunction solar cell according to the illustrated embodiment, including the deposition of metallization over the contact layer, and the attachment of a surrogate substrate, will be discussed and depicted at a later point in connection with FIG. 7 and subsequent Figures.

Figure 7:
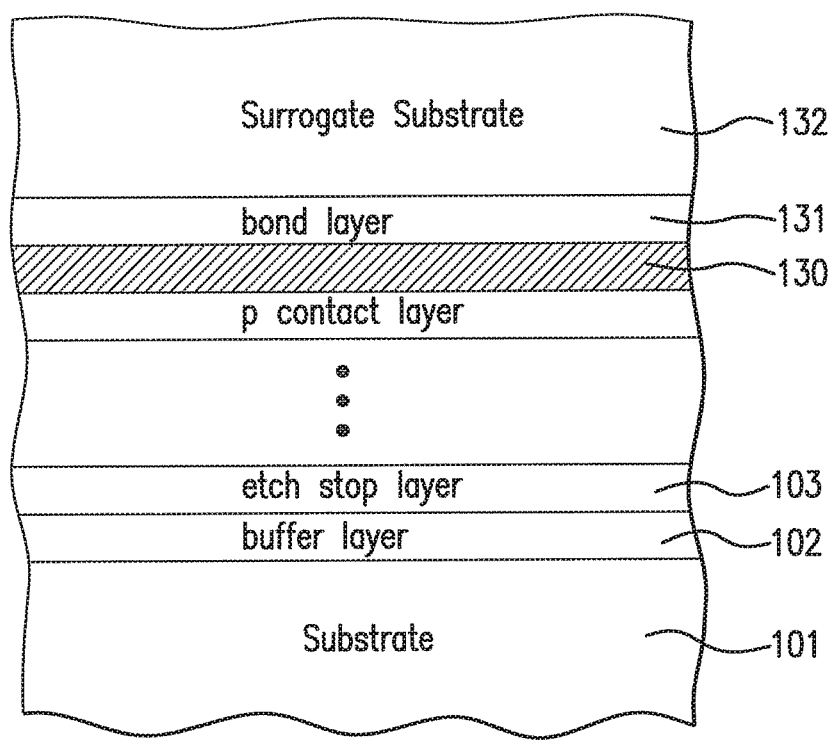
FIG. 7 is a simplified cross-sectional view of the solar cell of either FIG. 2H, 3B, 3C, 4, 5, or 6 after the next sequence of process steps in which a metallization layer is deposited over the contact layer, and a surrogate substrate attached.

FIG. 7 is a simplified cross-sectional view of the solar cell of either FIG. 2H, 3B, 3C, 4, 5, or 6 depicting just a few of the top layers and lower layers after the next sequence of process steps in which a metallization layer 130 is deposited over the p type contact layer and a surrogate substrate 132 attached using an adhesive or other type of bonding material or layer 131.

Figure 8:
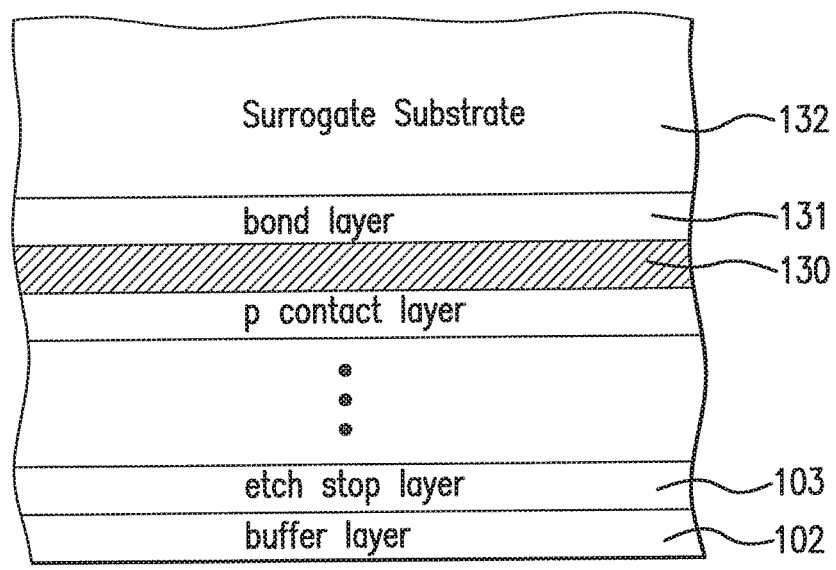
FIG. 8 is a cross-sectional view of the solar cell of FIG. 7 after the next sequence of process steps in which the growth substrate is removed.

FIG. 8 is a cross-sectional view of the solar cell of FIG. 7 after the next sequence of process steps in which the growth substrate 101 is removed.

Figure 9:
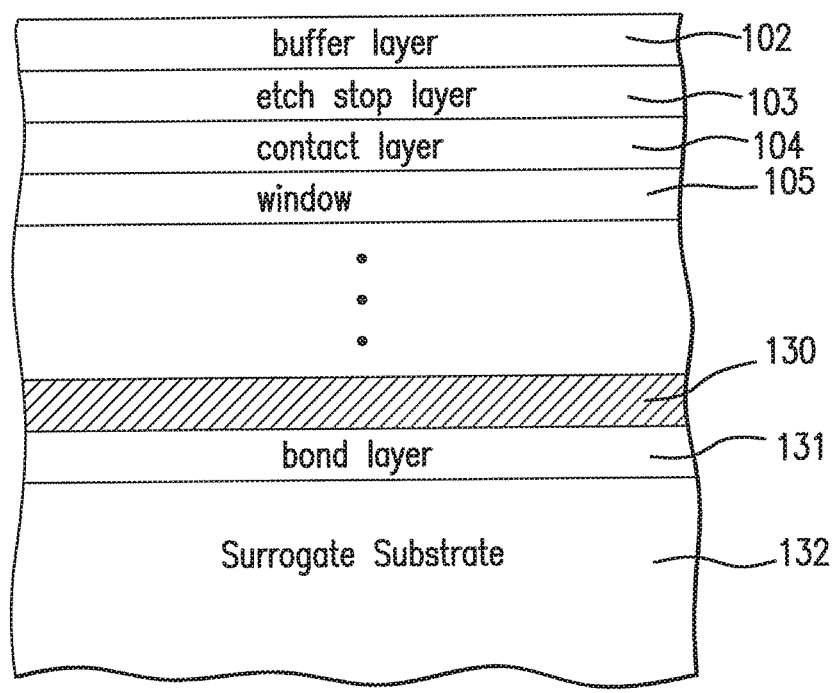
FIG. 9 is a another cross-sectional view of the solar cell of FIG. 7, similar to that of FIG. 8, but here oriented and depicted with the surrogate substrate at the bottom of the figure.

FIG. 9 is a another cross-sectional view of the solar cell of FIG. 8, but here oriented and depicted with the surrogate substrate 132 at the bottom of the figure.

Figure 10:
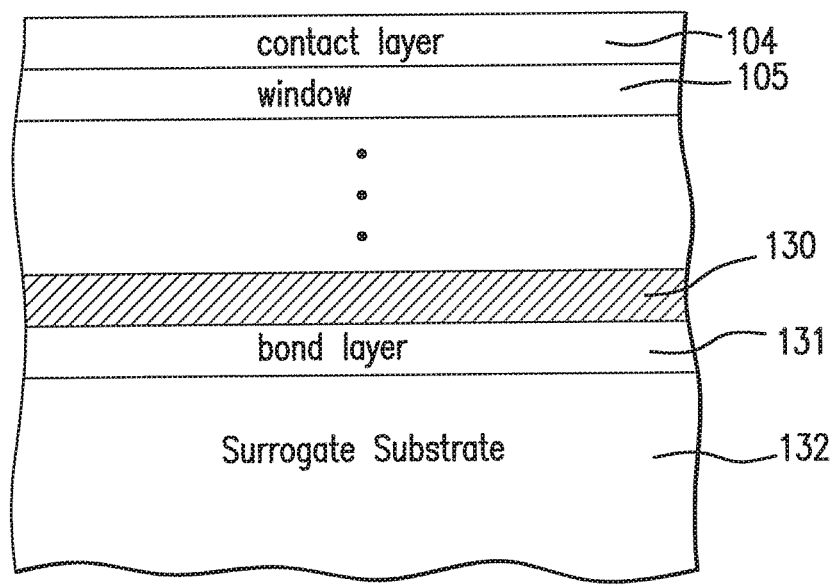
FIG. 10 is a cross-sectional view of the solar cell of FIG. 9 after the next sequence of process steps.

FIG. 10 is a cross-sectional view of the solar cell of FIG. 9 after the next process step in which the buffer layer 102, and the etch stop layer 103 is removed by a HCl/H$_2$O solution.

Figure 11:
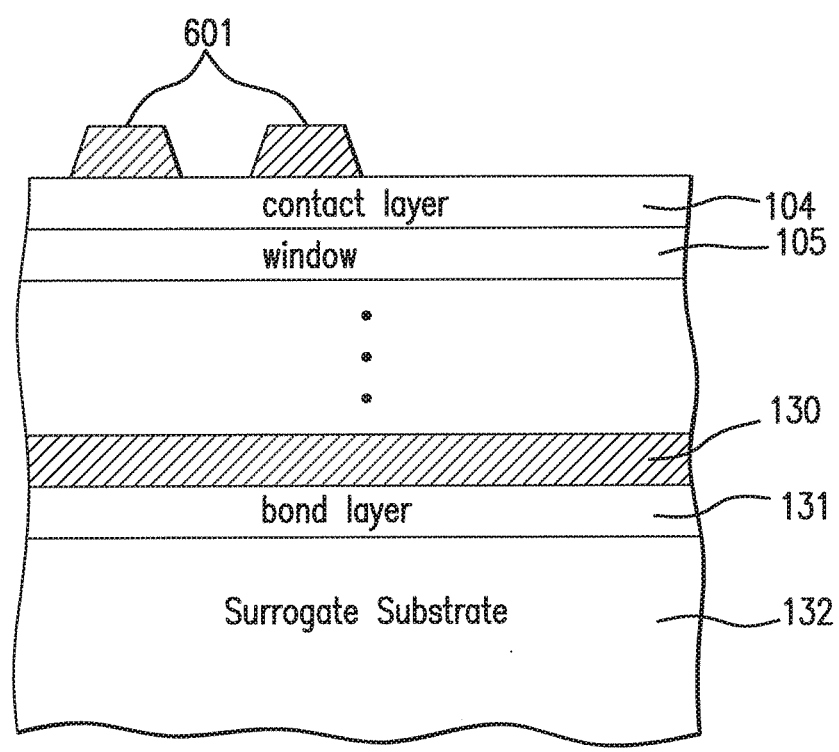
FIG. 11 is a cross-sectional view of the solar cell of FIG. 10 after the next sequence of process steps.

FIG. 11 is a cross-sectional view of the solar cell of FIG. 10 after the next sequence of process steps in which a photoresist mask (not shown) is placed over the contact layer 104 to form the grid lines 601. As will be described in greater detail below, a photoresist layer is deposited over the contact layer 104, and lithographically patterned with the desired grid pattern. A metal layer is then deposited over the patterned photoresist by evaporation. The photoresist mask is then subsequently lifted off leaving the finished metal grid lines 601 as depicted in the Figures.

As more fully described in U.S. patent application Ser. No. 12/218,582 filed Jul. 18, 2008, hereby incorporated by reference, the grid lines 601 are preferably composed of a sequence of layers Pd/Ge/Ti/Pd/Au, although other suitable materials and layered sequences may be used as well.

Figure 12:
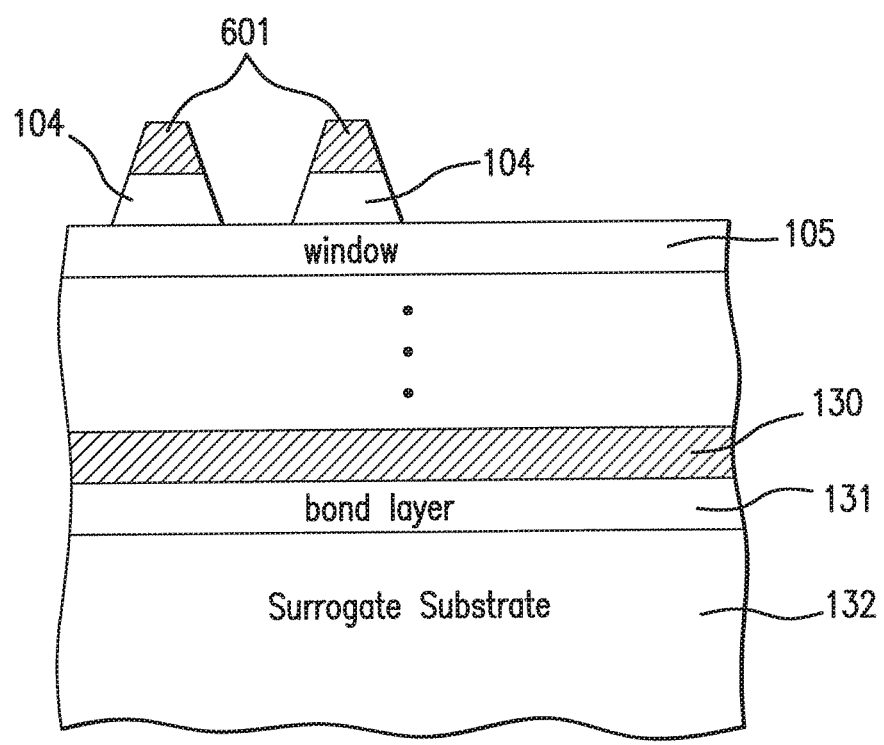
FIG. 12 is a cross-sectional view of the solar cell of FIG. 11 after the next sequence of process steps.

FIG. 12 is a cross-sectional view of the solar cell of FIG. 11 after the next process step in which the grid lines are used as a mask to etch down the surface to the window layer 105 using a citric acid/peroxide etching mixture.

Figure 13A:
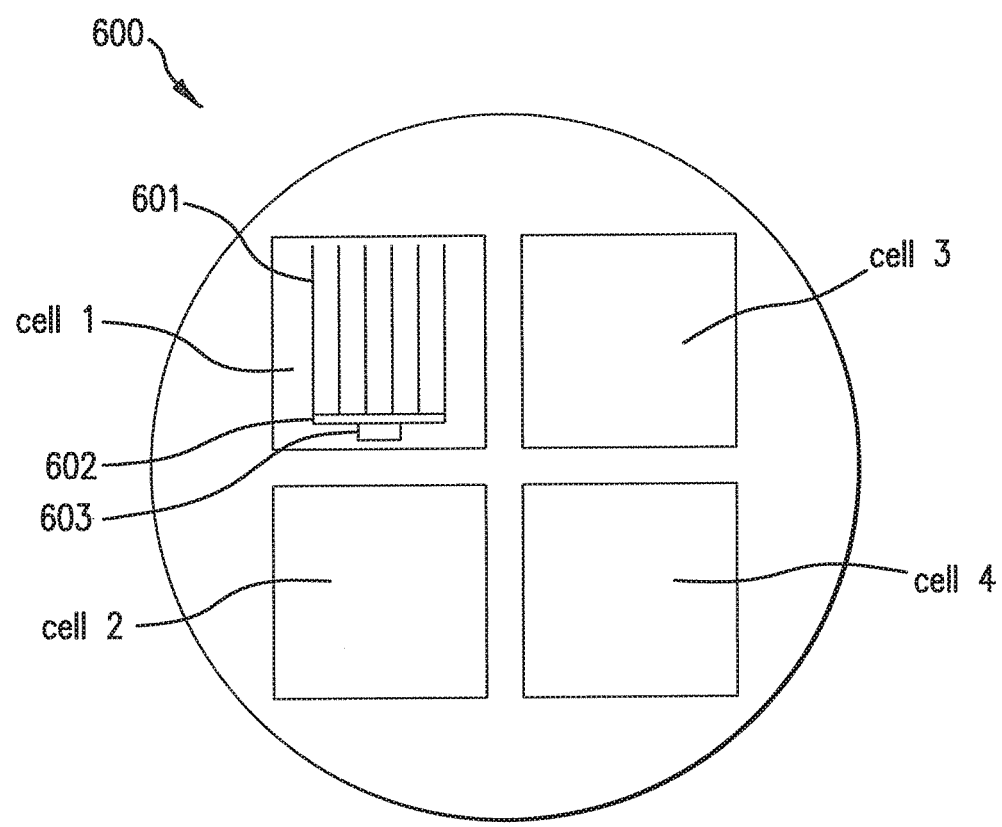
FIG. 13A is a top plan view of a wafer in one embodiment of the present disclosure in which the solar cells are fabricated.

FIG. 13A is a top plan view of a wafer 600 according to the present disclosure in which four solar cells are implemented. The depiction of four cells is for illustration purposes only, and the present disclosure is not limited to any specific number of cells per wafer.

In each cell there are grid lines 601 (more particularly shown in cross-section in FIG. 12), an interconnecting bus line 602, and a contact pad 603. The geometry and number of grid and bus lines and the contact pad are illustrative and the present disclosure is not limited to the illustrated embodiment.

Figure 13B:
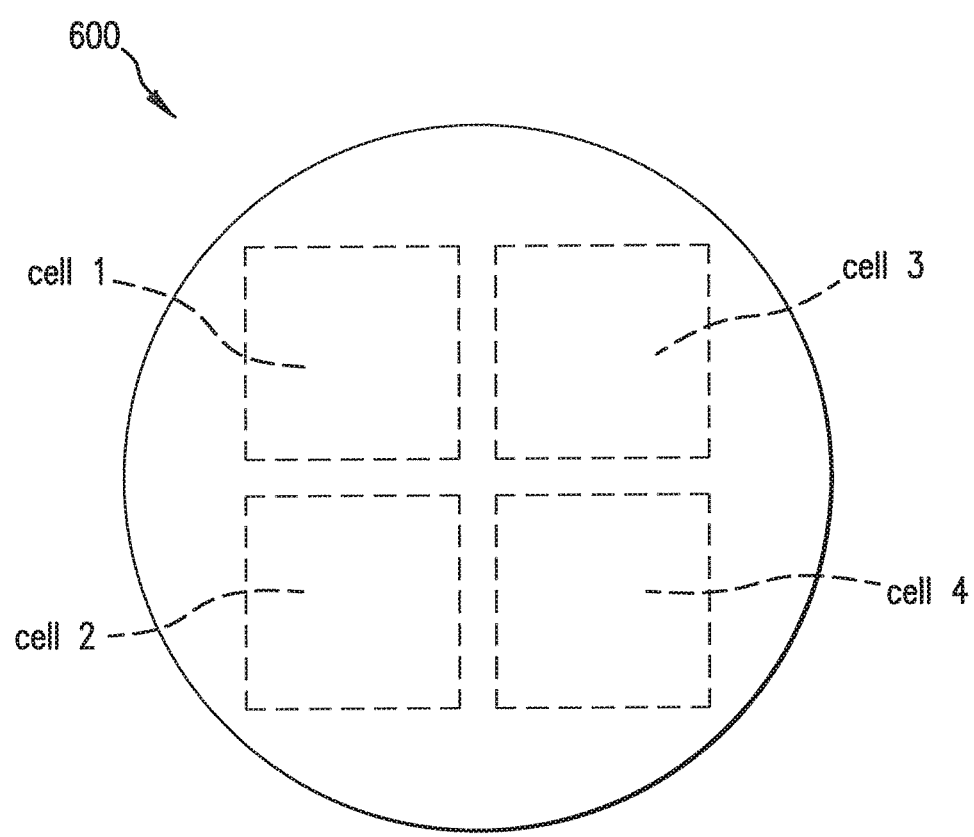
FIG. 13B is a bottom plan view of a wafer in the embodiment of FIG. 13A.

FIG. 13B is a bottom plan view of the wafer according to the present disclosure with four solar cells shown in FIG. 13A.

Figure 14:
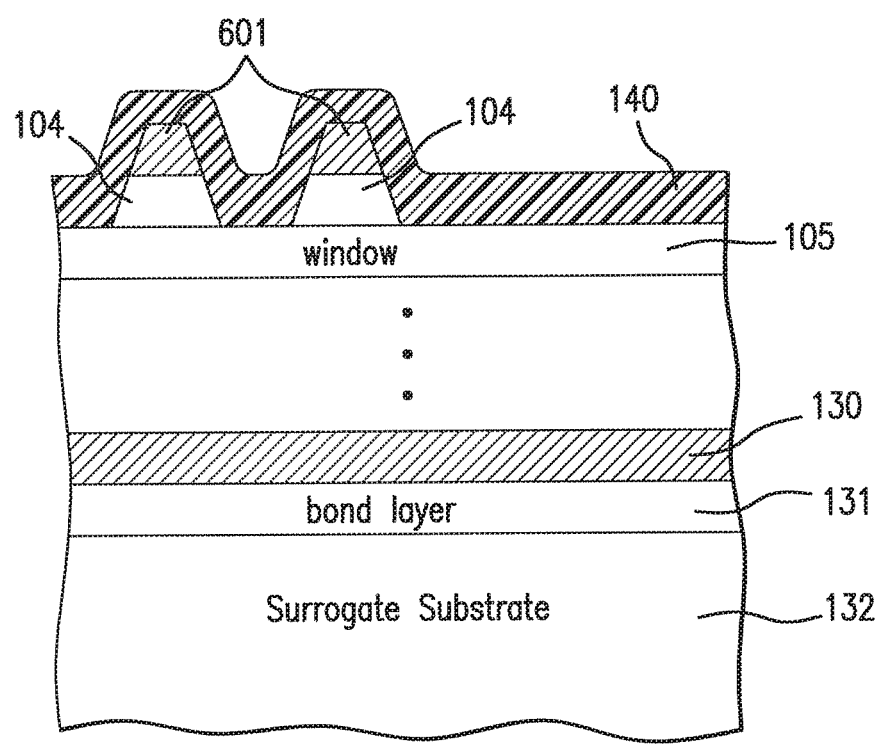
FIG. 14 is a cross-sectional view of the solar cell of FIG. 12 after the next sequence of process steps.

FIG. 14 is a cross-sectional view of the solar cell of FIG. 12 after the next process step in which an antireflective (ARC) dielectric coating layer 140 is applied over the entire surface of the "top" side of the wafer over the grid lines 601.

Figure 15:
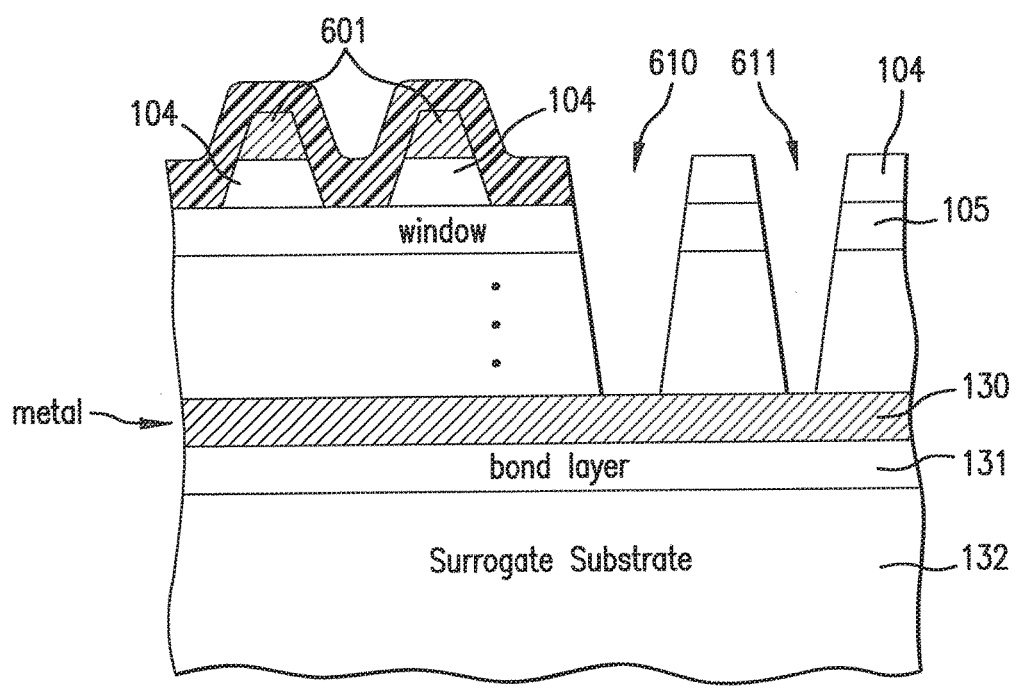
FIG. 15 is a cross-sectional view of the solar cell of FIG. 14 after the nod sequence of process steps.
Figure 16:
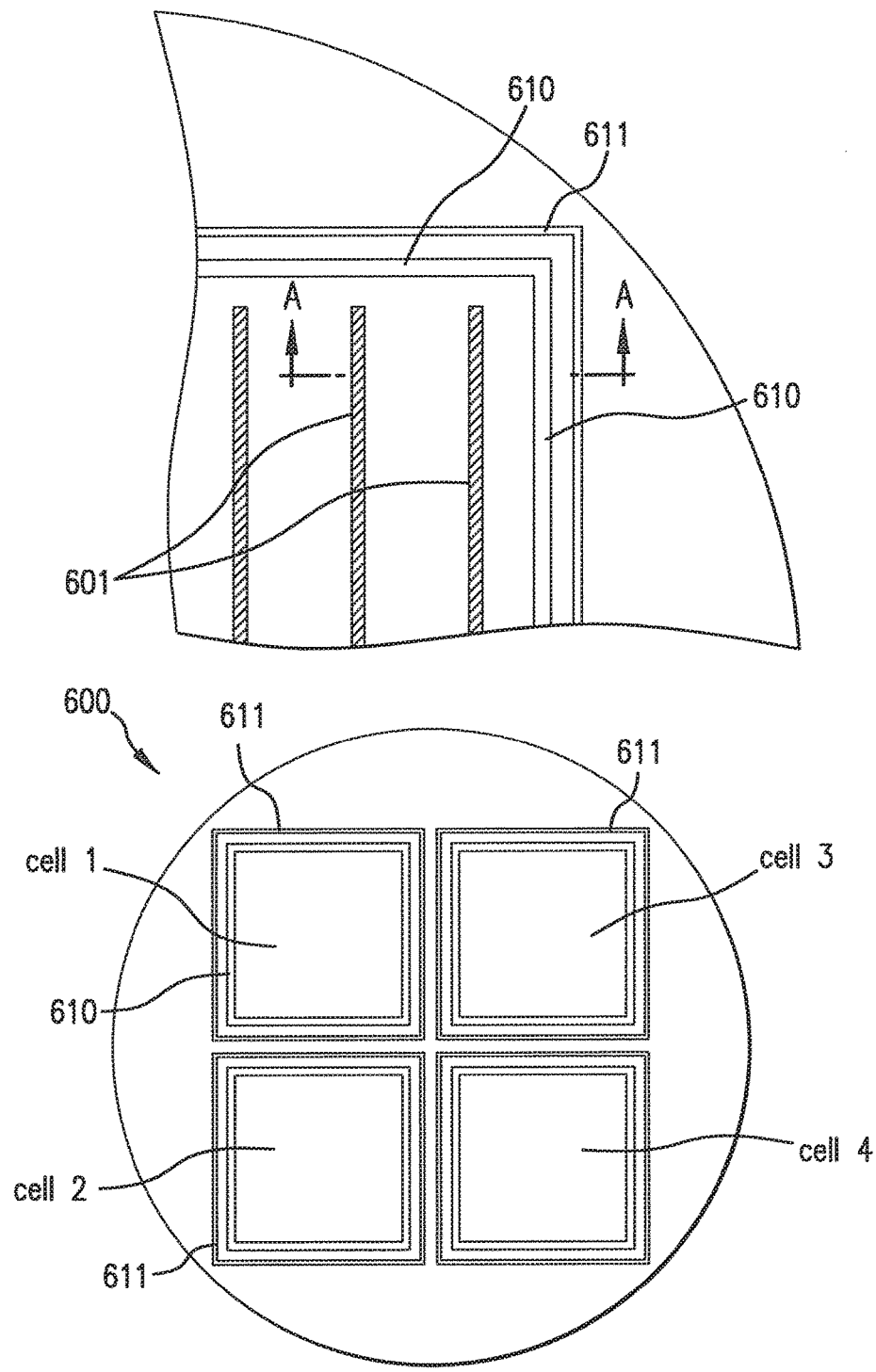
FIG. 16 is a top plan view of the wafer of FIG. 15 depicting the surface view of the trench etched around the cell in one embodiment of the present disclosure.

FIG. 15 is a cross-sectional view of the solar cell of FIG. 14 after the next process step in one embodiment according to the present disclosure in which first and second annular channels 610 and 611, or portion of the semiconductor structure are etched down to the metal layer 130 using phosphide and arsenide etchants. These channels define a peripheral boundary between the cell and the rest of the wafer, and leave a mesa structure which constitutes the solar cell. The cross-section depicted in FIG. 15 is that as seen from the A-A plane shown in FIG. 16.

In one embodiment, channel 610 is substantially wider than that of channel 611.

Figure 17:
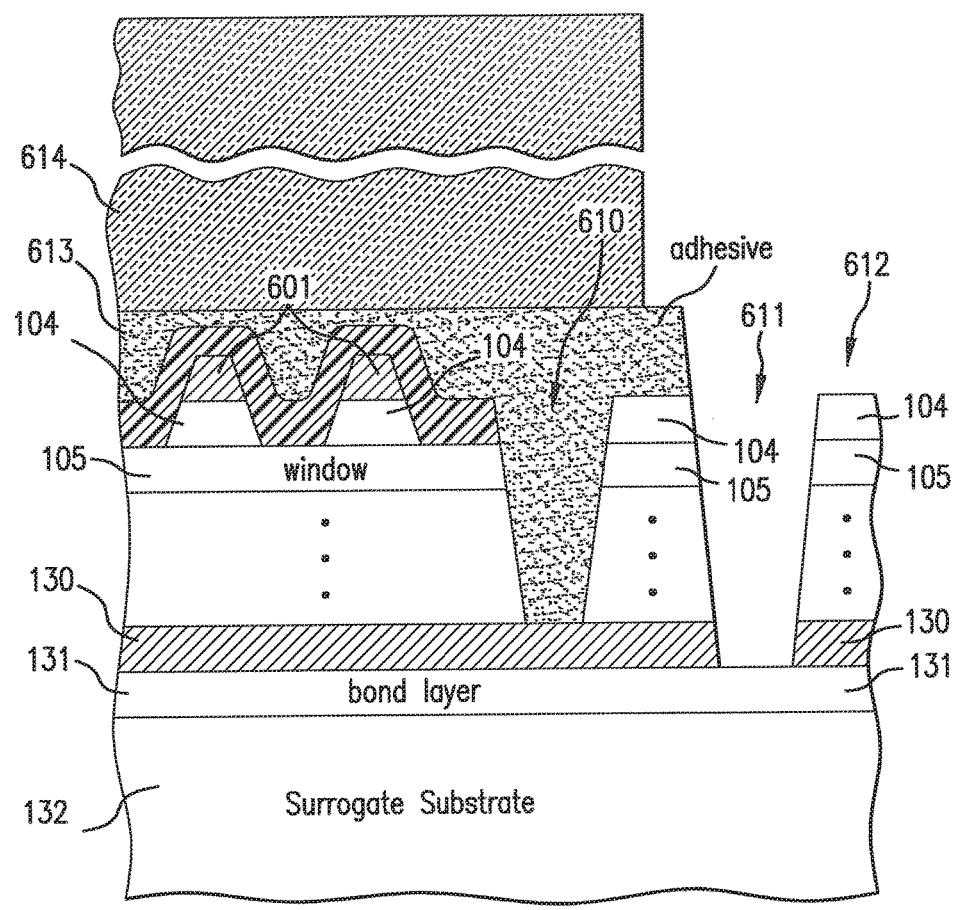
FIG. 17 is a cross-sectional view of the solar cell of FIG. 15 after the next sequence of process steps in one embodiment of the present disclosure.

FIG. 17 is a cross-sectional view of the solar cell of FIG. 15 after the next process step in another embodiment of the present disclosure in which a cover glass 614 is secured to the top of the cell by an adhesive 613. The cover glass 614 preferably covers the entire channel 610, but does not extend to the periphery of the cell near the channel 611. Although the use of a cover glass is one embodiment, it is not necessary for all implementations, and additional layers or structures may also be utilized for providing additional support or environmental protection to the solar cell.

Figure 18:
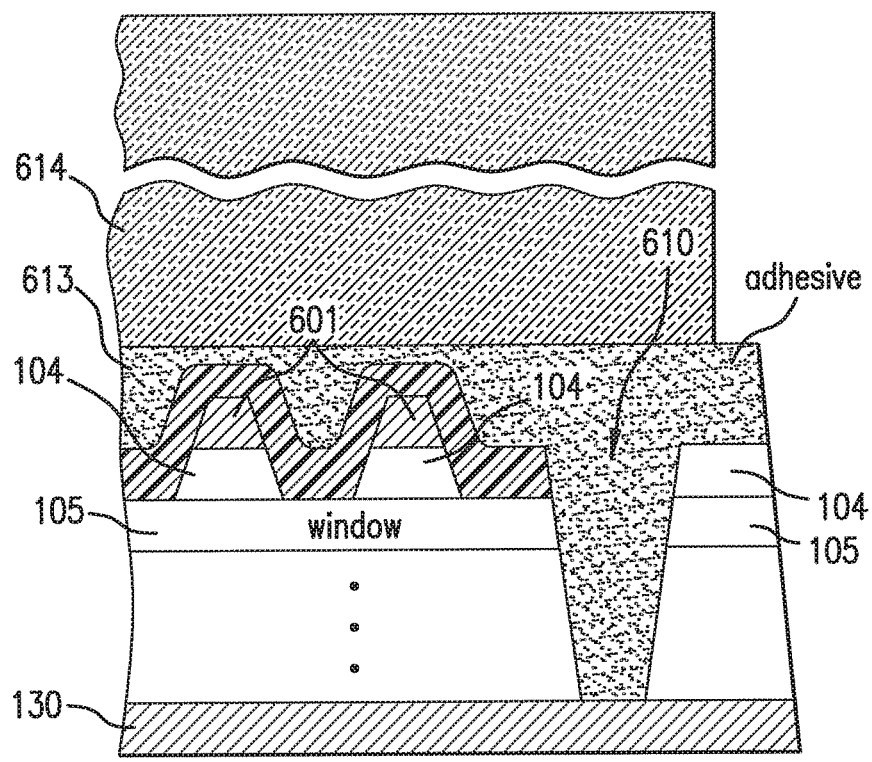
FIG. 18 is a cross-sectional view of the solar cell of FIG. 7 after the next sequence of process steps in one embodiment of the present disclosure.

FIG. 18 is a cross-sectional view of the solar cell of FIG. 17 after the next process step of the present disclosure in an embodiment in which the bond layer 131, the surrogate substrate 132 and the peripheral portion 612 of the wafer is entirely removed, breaking off in the region of the channel 611, leaving only the solar cell with the cover glass 614 (or other supporting layers or structures) on the top, and the metal contact layer 130 on the bottom. The metal contact layer 130 forms the backside contact of the solar cell. The surrogate substrate is removed by the use of the Wafer Bond solvent, or other techniques. As noted above, the surrogate substrate includes perforations over its surface that allow the flow of solvent through the surrogate substrate 132 to permit its lift off. The surrogate substrate may be reused in subsequent wafer processing operations.

Figure 19:
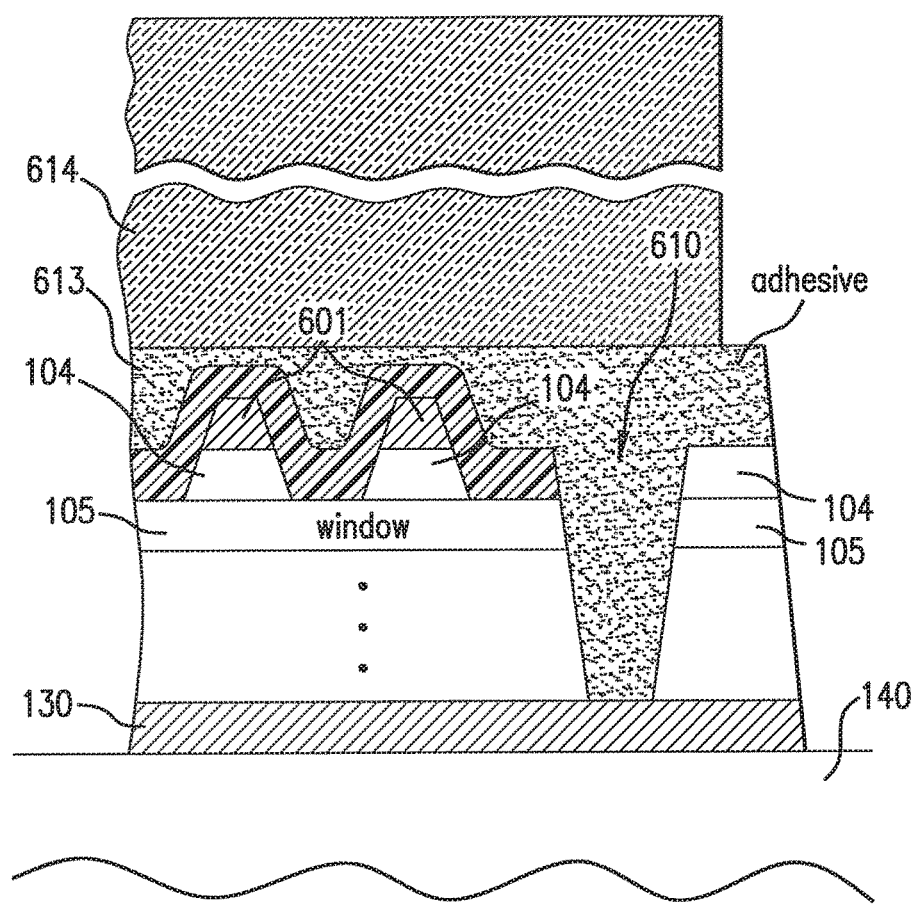
FIG. 19 is a cross-sectional view of the solar cell of FIG. 17 after the next sequence of process steps in another embodiment of the present disclosure.

FIG. 19 is a cross-sectional view of the solar cell of FIG. 18 after the next sequence of process steps in an embodiment in which the solar cell is attached to a support. In some embodiments, the support may be a thin metallic flexible film 140. More particularly, in such embodiments, the metal contact layer 130 may be attached to the flexible film 140 by an adhesive (either metallic or non-metallic), or by metal sputtering evaporation, or soldering. In one embodiment, the thin film 140 may be Kapton™ or another suitable polyimide material which has a metallic layer on the surface adjoining the metal contact layer 130. Reference may be made to U.S. patent application Ser. No. 11/860,142 filed Sep. 24, 2007, depicting utilization of a portion of the metal contact layer 130 as a contact pad for making electrical contact to an adjacent solar cell.

One aspect of some implementations of the present disclosure, such as described in U.S. patent application Ser. No. 12/637,241, filed Dec. 14, 2009, is that the metallic flexible film 140 has a predetermined coefficient of thermal expansion, and the coefficient of thermal expansion of the semiconductor body closely matches the predetermined coefficient of thermal expansion of the metallic film 140. More particularly, in some embodiments the coefficient of thermal expansion of the metallic film that has a value within 50% of the coefficient of thermal expansion of the adjacent semiconductor material.

In some implementations, the metallic film 141 is a solid metallic foil. In other implementations, the metallic film 141 comprises a metallic layer deposited on a surface of a Kapton or polyimide material. In some implementations, the metallic layer is composed of copper.

In some implementations, the semiconductor solar cell has a thickness of less than 50 microns, and the metallic flexible film 141 has a thickness of approximately 75 microns.

In some implementations, the metal electrode layer may have a coefficient of thermal expansion within a range of 0 to 10 ppm per degree Kelvin different from that of the adjacent semiconductor material of the semiconductor solar cell. The coefficient of thermal expansion of the metal electrode layer may be in the range of 5 to 7 ppm per degree Kelvin.

In some implementations, the metallic flexible film comprises molybdenum, and in some implementations, the metal electrode layer includes molybdenum.

In some implementations, the metal electrode layer includes a Mo/Ti/Ag/Au, Ti/Mo/Ti/Ag, or Ti/Au/Mo sequence of layers.

Figure 20A:
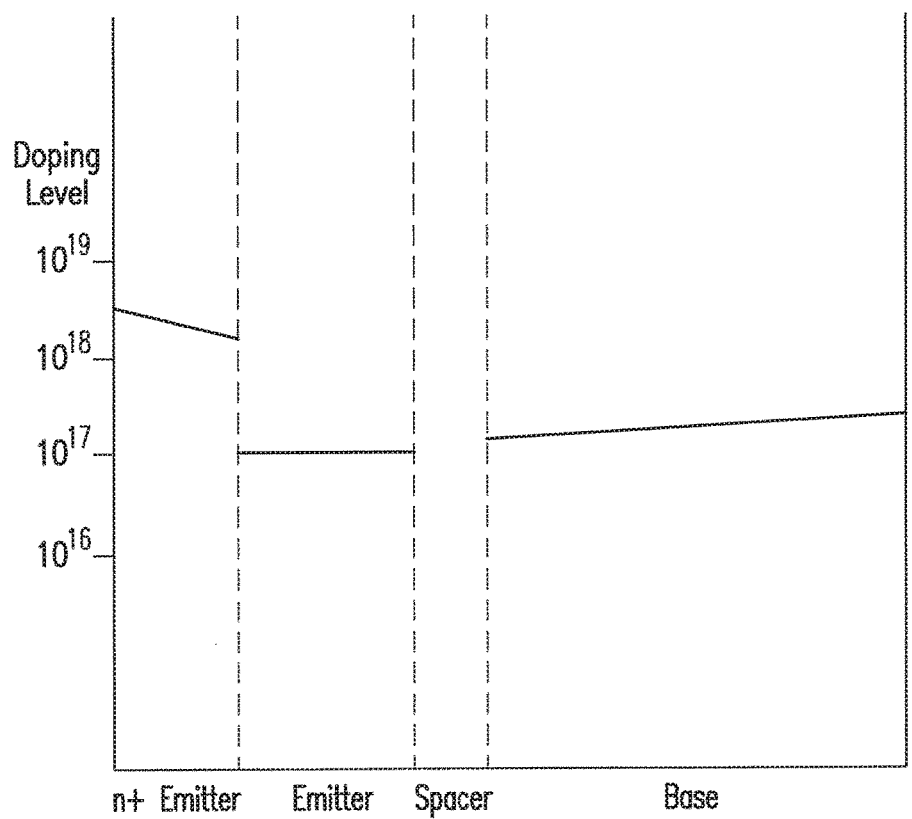
FIG. 20A is a graph of the doping profile of the emitter and base layers of the top subcell in the solar cell according to the present disclosure.

FIG. 20A is a graph of a doping profile in the emitter and base layers in the top subcell "A" of the inverted metamorphic multijunction solar cell of the present disclosure. As noted in the description of FIG. 3A, the emitter of the upper first solar subcell is composed of a first region 206a in which the doping is graded from $3\times10^{18}$ to $1\times10^{18}$ free carriers per cubic centimeter, and a second region 206b directly disposed over the first region in which the doping is constant at $1\times10^{17}$ free carriers per cubic centimeter. Adjacent to the second region 206b is a the first surface of a spacer region 206c, and adjacent to the second surface of the spacer region is the base layer 108a.

The specific doping profiles depicted herein (e.g., a linear profile) are merely illustrative, and other more complex profiles may be utilized as would be apparent to those skilled in the art without departing from the scope of the present disclosure.

Figure 20B:
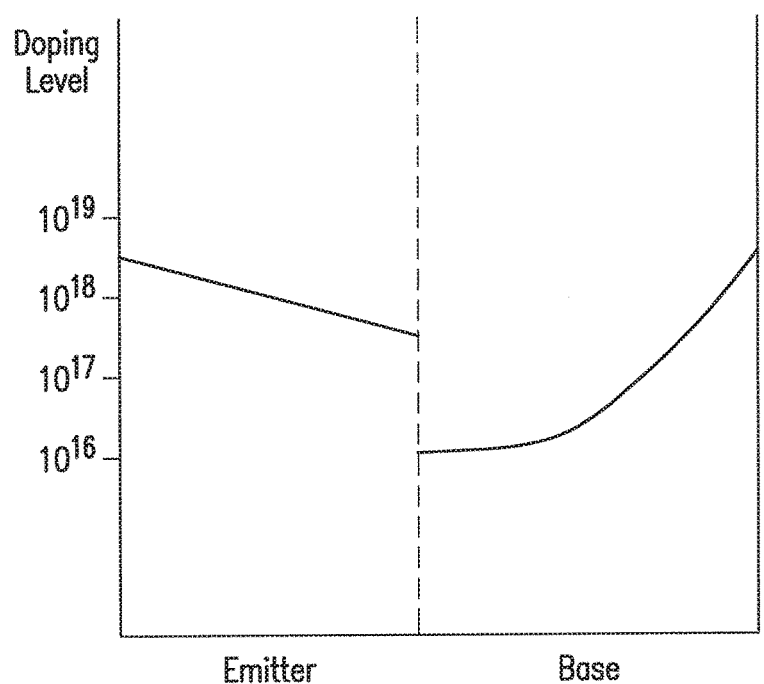
FIG. 20B is a graph of the doping profile of the emitter and base layers of one or more of the middle subcells in the solar cell according to the present disclosure.

FIG. 20B is a graph of a doping profile in the emitter and base layers in one or more of the other subcells (i.e., other than the top subcell) of the inverted metamorphic multijunction solar cell of the present disclosure. The various doping profiles within the scope of the present disclosure, and the advantages of such doping profiles are more particularly described in copending U.S. patent application Ser. No. 11/956,069 filed Dec. 13, 2007, herein incorporated by reference. The doping profiles depicted herein are merely illustrative, and other more complex profiles may be utilized as would be apparent to those skilled in the art without departing from the scope of the present disclosure.

FIG. 21 is a graph representing the Al, Ga and In mole fractions versus the Al to In mole fraction in a AlGaInAs material system that is necessary to achieve a constant 1.5 eV band gap.

FIG. 22 is a diagram representing the relative concentration of Al, In, and Ga in an AlGaInAs material system needed to have a constant band gap with various designated values (ranging from 0.4 eV to 2.1 eV) as represented by curves on the diagram. The range of band gaps of various GaInAlAs materials is represented as a function of the relative concentration of Al, In, and Ga. This diagram illustrates how the selection of a constant band gap sequence of layers of GaInAlAs used in the metamorphic layer may be designed through the appropriate selection of the relative concentration of Al, In, and Ga to meet the different lattice constant requirements for each successive layer. Thus, whether 1.5 eV or 1.1 eV or other band gap value is the desired constant band gap, the diagram illustrates a continuous curve for each band gap, representing the incremental changes in constituent proportions as the lattice constant changes, in order for the layer to have the required band gap and lattice constant.

Figure 23:
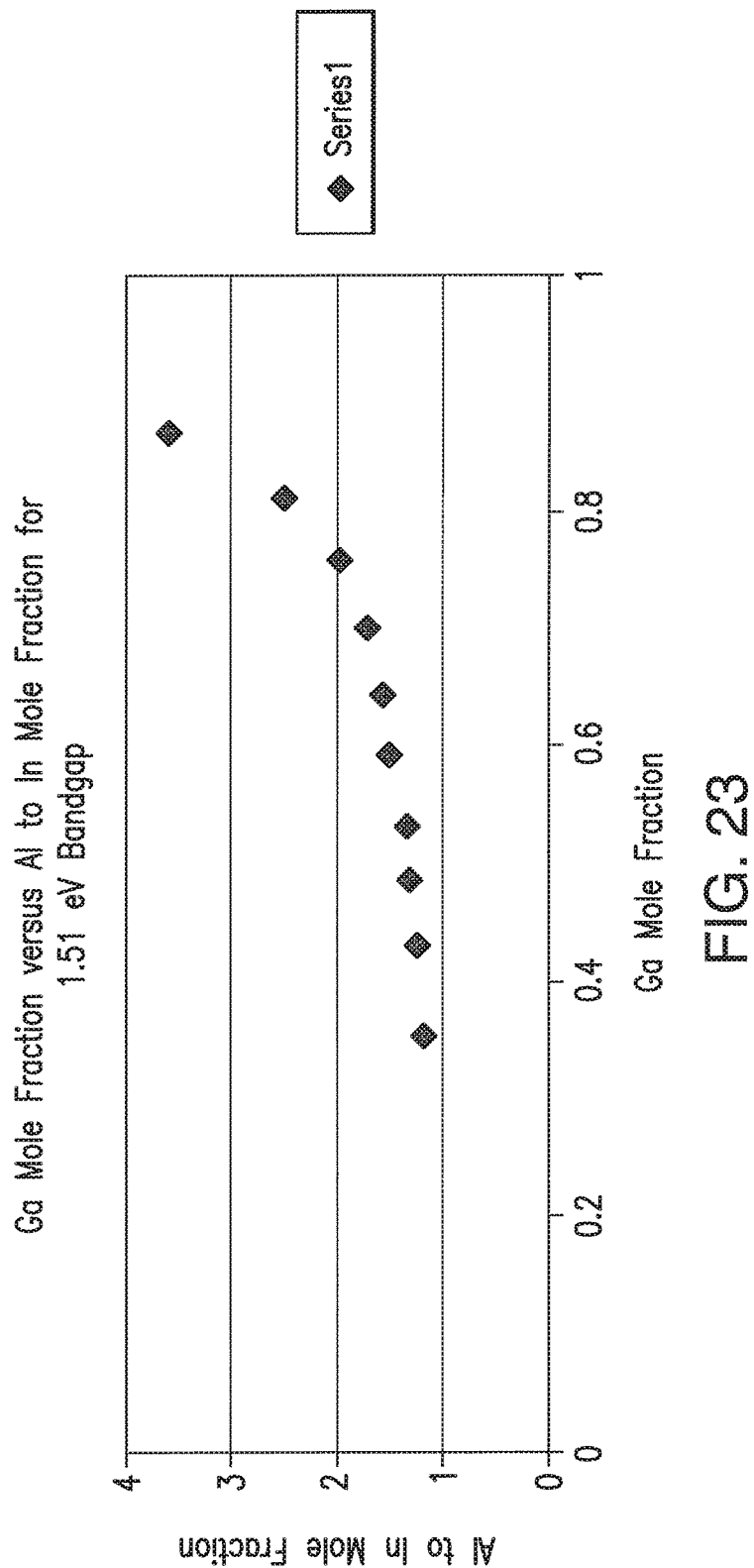
FIG. 23 is a graph representing the Ga mole fraction to the Al to In mole fraction in a AlGaInAs material system that is necessary to achieve a constant 1.51 eV band gap.

FIG. 23 is a graph that further illustrates the selection of a constant band gap sequence of layers of GaInAlAs used in the metamorphic layer by representing the Ga mole fraction versus the Al to In mole fraction in GaInAlAs materials that is necessary to achieve a constant 1.51 eV band gap.

Figure 24:
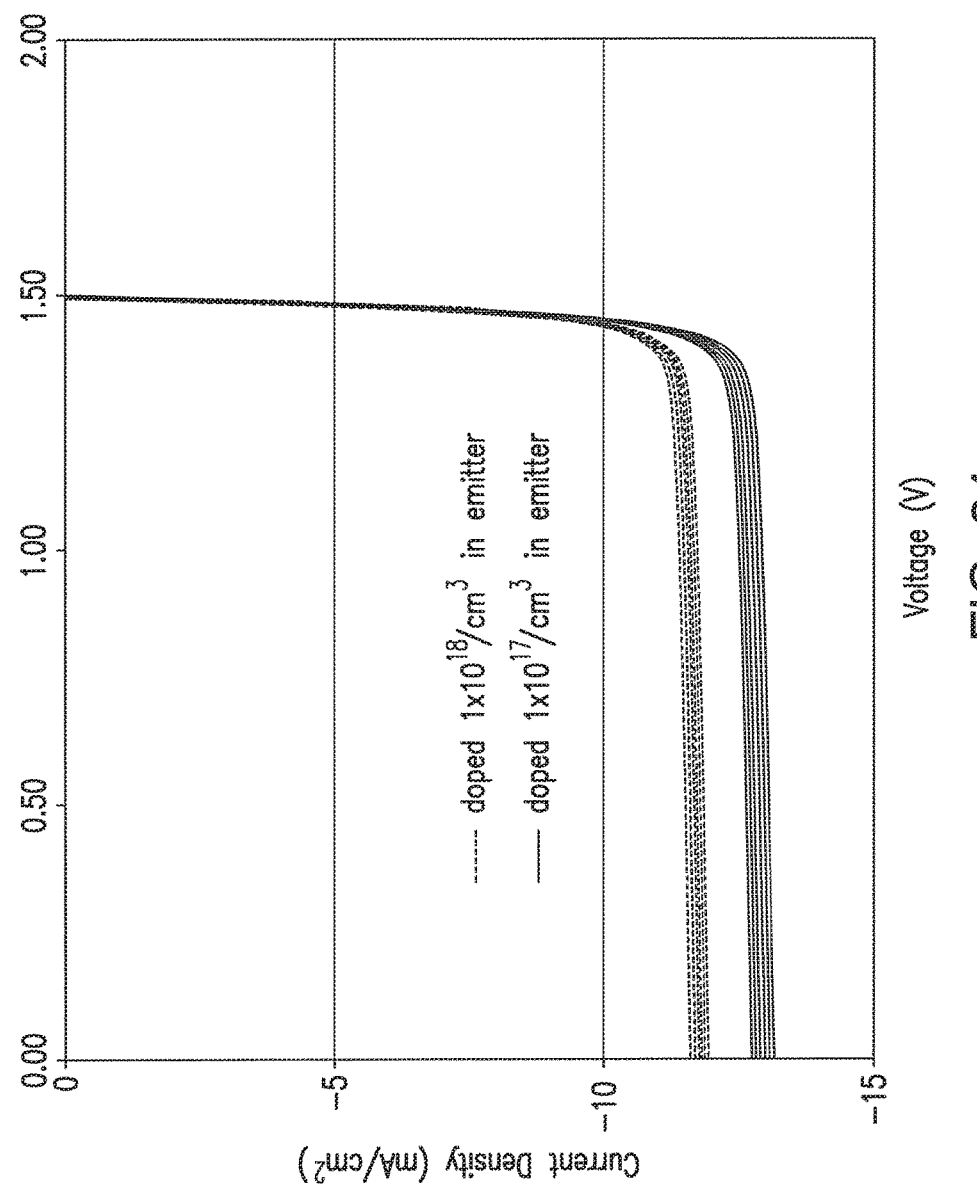
FIG. 24 is a graph that depicts the current and voltage characteristics of a test solar cell with the doped emitter structure of FIG. 20A according to the present disclosure, compared to a solar cell with a normally doped emitter structure.

FIG. 24 is a graph that depicts the current and voltage characteristics of two test multijunction solar cells fabricated according to the present disclosure. The current and voltage characteristics of the first test solar cell, is shown in solid lines. In the first test cell, the emitter of the top solar subcell is composed of a first region in which the doping is graded from $3\times10^{18}$ to $1\times10^{18}$ free carriers per cubic centimeter, and a second region directly disposed over the first region in which the doping is constant at $1\times10^{17}$ free carriers per cubic centimeter, as depicted in the solar cell of FIG. 3A. The current and voltage characteristics of the second test solar cell, is shown in dashed lines (------). In the second test solar cell, the emitter of the top solar subcell is composed of a first region in which the doping is graded from 3 to $1\times10^{18}/cm^3$ and a second region directly disposed over the first region in which the doping is constant at $1\times10^{18}/cm^3$, as is representative of the solar cell depicted in FIG. 2A and others described in the parent U.S. patent application Ser. No. 12/271,192 filed Nov. 14, 2008.

Figure 25:
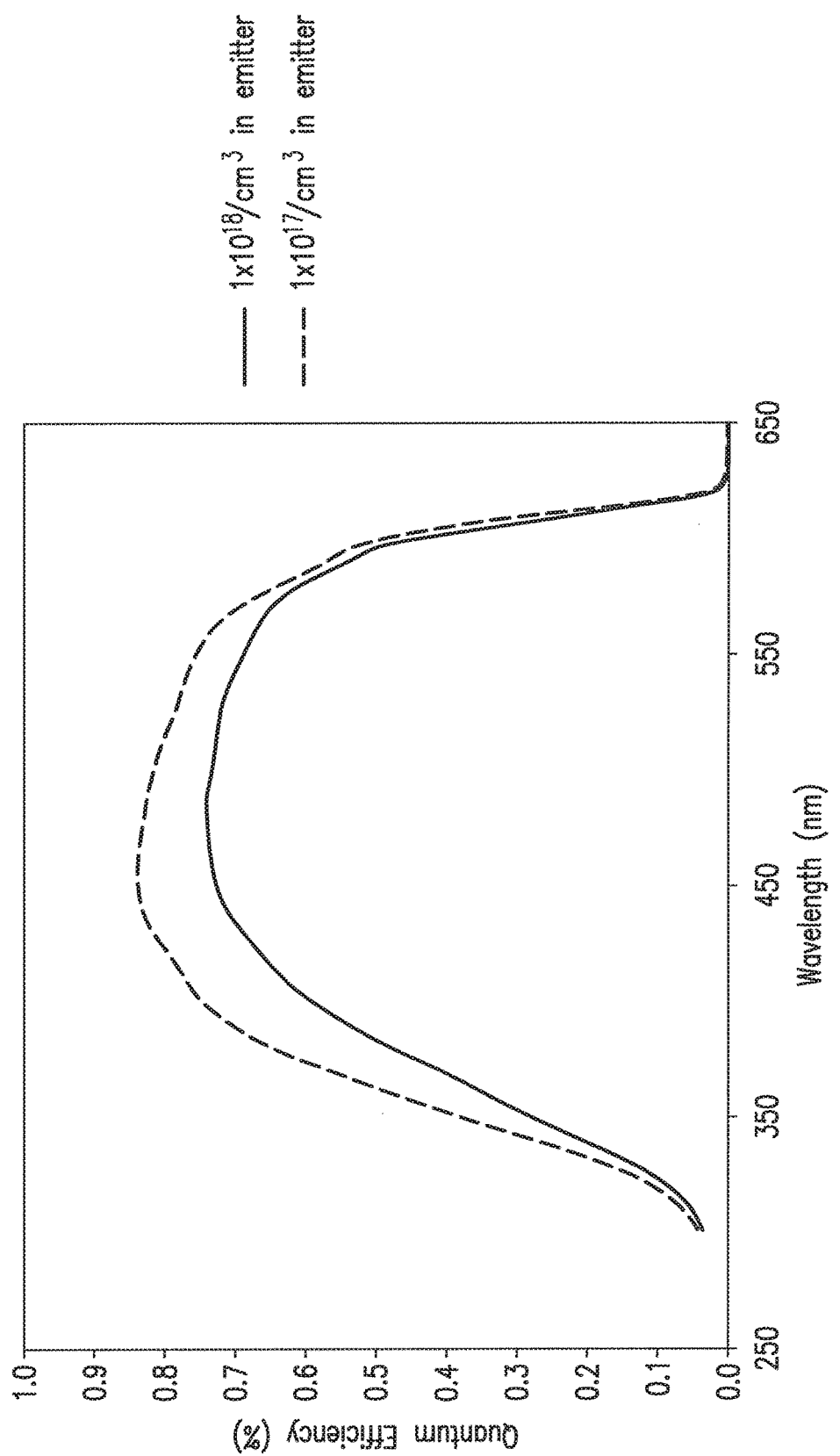
FIG. 25 is a graph that depicts the external quantum efficiency (EQE) as a function of wavelength of a multijunction solar cell with the doped emitter structure of FIG.

FIG. 25 is a graph that depicts the measured external quantum efficiency (EQE) as a function of wavelength of the two test multijunction solar cells noted in FIG. 24 above. The external quantum efficiency of the first test solar cell, is shown in a dashed line. The external quantum efficiency of the second test solar cell, is shown in a solid line (-----). A comparison of the external quantum efficiency (EQE) measurements shown in FIG. 25 indicate that the EQE was substantially higher in the wavelength range from 350 nm to 600 nm for the first test solar cell compared with that of the second test solar cell.

It will be understood that each of the elements described above, or two or more together, also may find a useful application in other types of structures or constructions differing from the types of structures or constructions described above.

Although described embodiments of the present disclosure utilizes a vertical stack of four, five, or six subcells, various aspects and features of the present disclosure can apply to stacks with fewer or greater number of subcells, i.e. two junction cells, three junction cells, seven junction cells, etc. In the case of seven or more junction cells, the use of more than two metamorphic grading interlayer may also be utilized.

In addition, although the disclosed embodiments are configured with top and bottom electrical contacts, the subcells may alternatively be contacted by means of metal contacts to laterally conductive semiconductor layers between the subcells. Such arrangements may be used to form 3-terminal, 4-terminal, and in general, n-terminal devices. The subcells can be interconnected in circuits using these additional terminals such that most of the available photogenerated current density in each subcell can be used effectively, leading to high efficiency for the multijunction cell, notwithstanding that the photogenerated current densities are typically different in the various subcells.

As noted above, the solar cell described in the present disclosure may utilize an arrangement of one or more, or all, homojunction cells or subcells, i.e., a cell or subcell in which the p-n junction is formed between a p-type semiconductor and an n-type semiconductor both of which have the same chemical composition and the same band gap, differing only in the dopant species and types, and one or more heterojunction cells or subcells. Subcell A, with p-type and n-type GaInP is one example of a homojunction subcell. Alternatively, as more particularly described in U.S. patent application Ser. No. 12/023,772 filed Jan. 31, 2008, the solar cell of the present disclosure may utilize one or more, or all, heterojunction cells or subcells, i.e., a cell or subcell in which the p-n junction is formed between a p-type semiconductor and an n-type semiconductor having different chemical compositions of the semiconductor material in the n-type regions, and/or different band gap energies in the p-type regions, in addition to utilizing different dopant species and type in the p-type and n-type regions that form the p-n junction.

In some cells, a thin so-called "intrinsic layer" may be placed between the emitter layer and base layer, with the same or different composition from either the emitter or the base layer. The intrinsic layer may function to suppress minority-carrier recombination in the space-charge region. Similarly, either the base layer or the emitter layer may also be intrinsic or not-intentionally-doped ("NID") over part or all of its thickness.

The composition of the window or BSF layers may utilize other semiconductor compounds, subject to lattice constant and band gap requirements, and may include AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAsSb, AlInSb, GaInSb, AlGaInSb, AlN, GaN, InN, GaInN, AlGaInN, GaInNAs, AlGaInNAs, ZnSSe, CdSSe, and similar materials, and still fall within the spirit of the present invention.

While the solar cell described in the present disclosure has been illustrated and described as embodied in an inverted metamorphic multijunction solar cell, it is not intended to be limited to the details shown, since various modifications and structural changes may be made without departing in any way from the spirit of the present invention.

Thus, while the description of the semiconductor device described in the present disclosure has focused primarily on solar cells or photovoltaic devices, persons skilled in the art know that other optoelectronic devices, such as thermophotovoltaic (TPV) cells, photodetectors and light-emitting diodes (LEDS), are very similar in structure, physics, and materials to photovoltaic devices with some minor variations in doping and the minority carrier lifetime. For example, photodetectors can be the same materials and structures as the photovoltaic devices described above, but perhaps more lightly-doped for sensitivity rather than power production. On the other hand LEDs can also be made with similar structures and materials, but perhaps more heavily-doped to shorten recombination time, thus radiative lifetime to produce light instead of power. Therefore, this invention also applies to photodetectors and LEDs with structures, compositions of matter, articles of manufacture, and improvements as described above for photovoltaic cells.

Without further analysis, from the foregoing others can, by applying current knowledge, readily adapt the present invention for various applications. Such adaptations should and are intended to be comprehended within the meaning and range of equivalence of the following claims.

The invention claimed is:

1. A multijunction solar cell comprising:
an upper first solar subcell having a first band gap;
a second solar subcell adjacent to the first solar subcell and having a second band gap smaller than the first band gap of the first solar subcell;
a third solar subcell adjacent to the second solar subcell and having a third band gap smaller than the second band gap of the second solar subcell;
a graded interlayer adjacent to the third solar subcell, the graded interlayer having a fourth band gap that is greater than the third band gap of the third solar subcell, wherein the graded interlayer is composed of a compositionally step-graded series of $(In_xGa_{1-x})_yAl_{1-y}As$ layers with monotonically changing lattice constant, with x and y having respective values such that the band gap of the graded interlayer remains constant throughout its thickness, and wherein $0<x<1$ and $0<y<1$;
a fourth solar subcell adjacent to the graded interlayer, the fourth solar subcell having a fifth band gap smaller than the third band gap of the third solar subcell wherein the fourth solar subcell is lattice mismatched with respect to the third solar subcell, and wherein the graded interlayer provides a transition in lattice constant from the third solar subcell to the fourth solar subcell; and
a lower fifth solar subcell adjacent to the fourth solar subcell and having a sixth band gap smaller than the fifth band gap of the fourth solar subcell.

2. The multijunction solar cell of claim 1 further comprising a barrier layer adjacent the graded interlayer.

3. The multijunction solar cell of claim 2 wherein the barrier layer is composed of (Al)GaInP.

4. The multijunction solar cell of claim 2 wherein the barrier layer has a thickness of about 0.5 micron.

5. The multijunction solar cell of claim 1 wherein the graded interlayer is disposed between first and second barrier layers.

6. The multijunction solar cell of claim 5 wherein the first barrier layer has a composition different from a composition of the second barrier layer.

7. The multijunction solar cell of claim 1 wherein the fourth band gap of the graded interlayer is constant at 1.5 eV throughout the thickness of the graded interlayer.

8. The multijunction solar cell of claim 7 wherein:
the third band gap of the third solar subcell is in a range of 1.3 eV-1.5 eV; and
the fifth band gap of the fourth solar subcell is in a range of 1.0 eV-1.2 eV.

9. The multijunction solar cell of claim 1 wherein the upper first solar subcell comprises an AlGaInP emitter region and an AlGaInP base region.

10. The multijunction solar cell of claim 1 wherein the second solar subcell comprises:
an emitter region composed of AlGaAs, GaAs, GaInP, GaInAs, GaAsSb or GaInAsN; and
a base region composed of AlGaAs, GaAs, GaInAs, GaAsSb or GaInAsN.

11. The multijunction solar cell of claim 1 wherein the third solar subcell comprises a GaInP emitter region and a GaAs base region.

12. The multijunction solar cell of claim 1 wherein the fourth solar subcell comprises a GaInP emitter region and a AlGaInAs base region.

13. The multijunction solar cell of claim 1 wherein the fifth solar subcell comprises a GaInP emitter region and a GaInAs base region.

14. The multijunction solar cell of claim 1 wherein each of the first, second, third, fourth and fifth solar subcells comprises an emitter region and a base region each of which is composed of GaAs and at least one of In, P or As.

15. A method of manufacturing a solar cell, the method comprising:
providing a first substrate;
forming, on the first substrate, a first solar subcell having a first band gap;
forming a second solar subcell adjacent to the first solar subcell and having a second band gap smaller than the first band gap of the first solar subcell;
forming a third solar subcell adjacent to the second solar subcell and having a third band gap smaller than the second band gap of the second solar subcell;
forming a graded interlayer adjacent to the third solar subcell, the graded interlayer having a fourth band gap that is greater than the third band gap of the third solar subcell, wherein the graded interlayer is composed of a compositionally step-graded series of $(In_xGa_{1-x})_yAl_{1-y}As$ layers with monotonically changing lattice constant, with x and y having respective values such that the band gap of the graded interlayer remains constant throughout its thickness, and wherein $0<x<1$ and $0<y<1$;
forming a fourth solar subcell adjacent to the graded interlayer, the fourth solar subcell having a fifth band gap smaller than the third band gap of the third solar subcell wherein the fourth solar subcell is lattice mismatched with respect to the third solar subcell, and wherein the graded interlayer provides a transition in lattice constant from the third solar subcell to the fourth solar subcell;
forming a fifth solar subcell adjacent to the fourth solar subcell and having a sixth band gap smaller than the fifth band gap of the fourth solar subcell;
mounting a surrogate substrate over the fifth solar subcell; and
subsequently removing the first substrate.

16. The method of claim 15 including providing a metal contact layer over the fifth solar subcell before mounting the surrogate substrate.

17. The method of claim 15 wherein the fourth band gap of the graded interlayer is constant at 1.5 eV throughout the thickness of the graded interlayer.

18. The method of claim 15 including:
forming a first barrier layer over the third solar subcell, wherein the first barrier layer has a composition different from a composition of an adjoining layer of the third solar subcell;
forming the graded interlayer over the first barrier layer; and
forming a second barrier layer over the graded interlayer before forming the fourth solar subcell, wherein the second barrier layer has a composition different from a composition of the graded interlayer, and
wherein the first and second barrier layers are designed to prevent threading dislocations from propagating in a direction of growth of the solar cell or opposite the direction of growth.

19. The method of claim 18 including forming the second barrier layer to have a composition different from the composition of the first barrier layer.

20. The method of claim 19 including:
depositing the graded interlayer on the first barrier layer; and
depositing the second barrier on the graded interlayer.

* * * * *